(12) United States Patent
Yamazaki et al.

(10) Patent No.: US 12,159,573 B2
(45) Date of Patent: Dec. 3, 2024

(54) DISPLAY SYSTEM AND ELECTRONIC DEVICE

(71) Applicant: Semiconductor Energy Laboratory Co., Ltd., Atsugi (JP)

(72) Inventors: Shunpei Yamazaki, Setagaya (JP); Tatsuya Onuki, Atsugi (JP); Hajime Kimura, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/036,931

(22) PCT Filed: Nov. 26, 2021

(86) PCT No.: PCT/IB2021/060993
§ 371 (c)(1),
(2) Date: May 15, 2023

(87) PCT Pub. No.: WO2022/118151
PCT Pub. Date: Jun. 9, 2022

(65) Prior Publication Data
US 2023/0419891 A1    Dec. 28, 2023

(30) Foreign Application Priority Data

Dec. 6, 2020   (JP) .................................. 2020-202341
Dec. 11, 2020  (JP) .................................. 2020-205918

(51) Int. Cl.
G09G 3/3208       (2016.01)
(52) U.S. Cl.
CPC .................................. *G09G 3/3208* (2013.01)
(58) Field of Classification Search
None
See application file for complete search history.

(56) References Cited

U.S. PATENT DOCUMENTS

| | | | |
|---|---|---|---|
| 7,068,253 B2 | 6/2006 | Kudo et al. |
| 7,453,433 B2 | 11/2008 | Kudo et al. |

(Continued)

FOREIGN PATENT DOCUMENTS

| | | |
|---|---|---|
| CN | 103729160 A | 4/2014 |
| CN | 109389940 A | 2/2019 |

(Continued)

OTHER PUBLICATIONS

International Search Report (Application No. PCT/IB2021/060993) Dated Mar. 22, 2022.

(Continued)

*Primary Examiner* — Ryan A Lubit
(74) *Attorney, Agent, or Firm* — Eric J. Robinson; Robinson Intellectual Property Law Office, P.C.

(57) ABSTRACT

Provided is a display system with high display quality and high resolution. The display system includes a first layer and a display portion. The display portion is positioned in a region overlapping with the first layer. The first layer includes a semiconductor substrate containing silicon as a material, and a plurality of first transistors and a plurality of second transistors whose channel formation regions contain silicon are formed over the semiconductor substrate. The first layer includes a first circuit and a second circuit; the first circuit includes a driver circuit for driving the display portion; and the second circuit includes a memory device, a GPU, and an EL correction circuit. The display portion includes a pixel, and the pixel includes a light-emitting device containing organic EL and is electrically connected to the driver circuit. The memory device has a function of retaining image data; the GPU has a function of decoding the image data read from the memory device; and the EL correction circuit has a function of correcting light emitted from the light-emitting device.

12 Claims, 26 Drawing Sheets

(56) References Cited

U.S. PATENT DOCUMENTS

| | | | |
|---|---|---|---|
| 8,130,190 | B2 | 3/2012 | Kudo. et al. |
| 8,421,829 | B2 | 4/2013 | Kudo et al. |
| 8,823,627 | B2 | 9/2014 | Kudo et al. |
| 9,496,408 | B2 | 11/2016 | Yamazaki et al. |
| 9,696,899 | B2 | 7/2017 | Kim et al. |
| 10,394,069 | B2 | 8/2019 | Yamazaki et al. |
| 10,891,899 | B2 | 1/2021 | Jun |
| 11,360,728 | B2 | 6/2022 | Kim et al. |
| 11,423,844 | B2 | 8/2022 | Ikeda et al. |
| 2002/0015016 | A1 | 2/2002 | Kudo et al. |
| 2007/0001982 | A1 | 1/2007 | Ito et al. |
| 2010/0176395 | A1 | 7/2010 | Choi et al. |
| 2014/0101579 | A1 | 4/2014 | Kim et al. |
| 2014/0181700 | A1 | 6/2014 | Kim et al. |
| 2015/0212647 | A1 | 7/2015 | Kim et al. |
| 2015/0364070 | A1 | 12/2015 | Lv et al. |
| 2017/0061857 | A1 | 3/2017 | Lee et al. |
| 2017/0178586 | A1 | 6/2017 | Kim et al. |
| 2017/0285906 | A1 | 10/2017 | Kim et al. |
| 2018/0096666 | A1* | 4/2018 | Chung ................. G09G 3/3696 |
| 2018/0188867 | A1 | 7/2018 | Yeh |
| 2018/0211596 | A1* | 7/2018 | Gu ..................... H10K 59/1201 |
| 2018/0268780 | A1* | 9/2018 | Bae ......................... G09G 5/026 |
| 2018/0308871 | A1 | 10/2018 | Wu et al. |
| 2019/0025660 | A1 | 1/2019 | Shimoshikiryoh et al. |
| 2019/0051245 | A1* | 2/2019 | Jun ....................... G09G 3/3233 |
| 2019/0236765 | A1* | 8/2019 | Yeo ............................ G06T 5/92 |
| 2019/0317374 | A1 | 10/2019 | Yamazaki et al. |
| 2019/0335553 | A1* | 10/2019 | Ahmed .................... G09G 3/32 |
| 2020/0014904 | A1 | 1/2020 | Wetzstein et al. |
| 2020/0126244 | A1* | 4/2020 | Lee .......................... G06T 7/73 |
| 2020/0135825 | A1* | 4/2020 | Cha ...................... G09G 3/3266 |
| 2023/0022181 | A1 | 1/2023 | Ikeda et al. |

FOREIGN PATENT DOCUMENTS

| | | |
|---|---|---|
| CN | 109964172 A | 7/2019 |
| CN | 112585669 A | 3/2021 |
| EP | 2720110 A | 4/2014 |
| EP | 3441964 A | 2/2019 |
| JP | 2002-108308 A | 4/2002 |
| JP | 2013-225620 A | 10/2013 |
| JP | 2014-078234 A | 5/2014 |
| JP | 2019-035957 A | 3/2019 |
| KR | 2002-0013715 A | 2/2002 |
| KR | 2014-0046319 A | 4/2014 |
| KR | 2019-0016857 A | 2/2019 |
| KR | 2019-0082289 A | 7/2019 |
| KR | 2021-0028240 A | 3/2021 |
| WO | WO-2018/096425 | 5/2018 |
| WO | WO-2019/220278 | 11/2019 |
| WO | WO-2020/010183 | 1/2020 |

OTHER PUBLICATIONS

Written Opinion (Application No. PCT/IB2021/060993) Dated Mar. 22, 2022.

* cited by examiner

MC1

MC2

MC2A

MC3

MC4

MC5

MC6

FIG. 21A
| | Intermediate state<br>New crystalline phase | |
|---|---|---|
| Amorphous | Crystalline | Crystal |
| • completely amorphous | • CAAC<br>• nc<br>• CAC<br>excluding single crystal and poly crystal | • single crystal<br>• poly crystal |
FIG. 21B
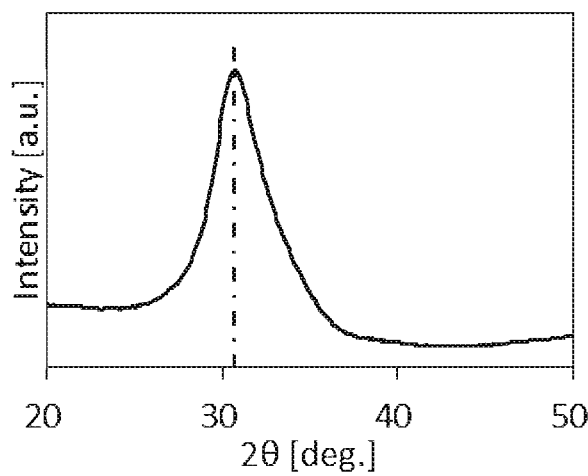
FIG. 21C
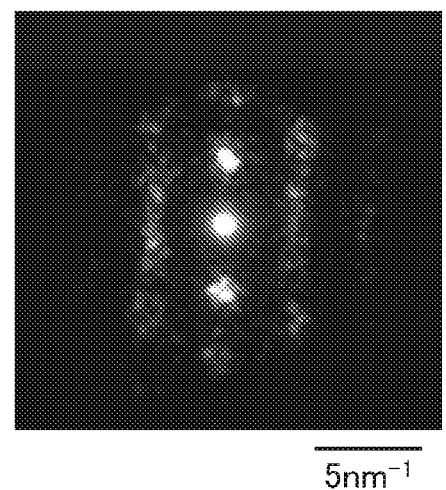

DISPLAY SYSTEM AND ELECTRONIC DEVICE

TECHNICAL FIELD

One embodiment of the present invention relates to a display system and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting device, a power storage device, an imaging device, a memory device, a signal processing device, a processor, an electronic device, a system, a driving method thereof, a manufacturing method thereof, and a testing method thereof.

BACKGROUND ART

Display apparatuses that can be used for XR (a generic term for VR, AR, and the like) such as VR (virtual reality) and AR (augmented reality) have been required. Specifically, such display apparatuses have been desired to have high resolution, high color reproducibility, and the like so as to offer enhanced realistic feeling and an enhanced sense of immersion, for example.

Examples of apparatuses applicable to such display apparatuses include a liquid crystal display apparatus and a light-emitting apparatus including a light-emitting device such as organic EL (Electro Luminescence) or a light-emitting diode (LED). Patent Document 1 discloses a display apparatus with a large number of pixels and high resolution, which includes a light-emitting device containing organic EL.

REFERENCE

Patent Document

[Patent Document 1] PCT International Publication No. 2019/220278

SUMMARY OF THE INVENTION

Problems to be Solved by the Invention

As described above, a display apparatus having high display quality is required for a device for XR. Since a display apparatus for XR needs to be provided in a glasses-type housing, a goggle-type housing, or the like, the diagonal size of the display apparatus needs to be reduced to approximately 2 inches or smaller or 1 inch or smaller, for example.

The display apparatus needs to include peripheral circuits such as a driver circuit, a memory device in which an image to be displayed is stored in advance, a digital-analog converter circuit (DAC), and a decoder for decoding an encoded image. In addition, in the case of improving the display quality, a circuit for correcting image data is preferably included. When the peripheral circuits are provided, the housing size increases, which might result in a heavy load on a wearer of the housing. Furthermore, an increase in the number of peripheral circuits increases the number of signal accesses between pixels and the peripheral circuits in the display apparatus, which might result in an increase in access time and an increase in power consumption.

An object of one embodiment of the present invention is to provide a display apparatus with a reduced circuit area. Another object of one embodiment of the present invention is to provide a display apparatus with reduced power consumption. Another object of one embodiment of the present invention is to provide a display apparatus having high display quality. Another object of one embodiment of the present invention is to provide a novel semiconductor device. Another object of one embodiment of the present invention is to provide a system including any of the above semiconductor devices.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a display system including a first layer and a display portion. The display portion is positioned in a region overlapping with the first layer. The first layer includes a semiconductor substrate containing silicon as a material, and the first layer includes a plurality of first transistors and a plurality of second transistors whose channel formation regions contain silicon. The first layer includes a first circuit and a second circuit; the first circuit includes a source driver circuit and a gate driver circuit each including the first transistor; and the second circuit includes a memory device, a CPU, a GPU, an EL correction circuit, a timing controller, and a high frequency circuit each including the second transistor. The display portion includes a pixel, and the pixel includes a light-emitting device containing organic EL. The pixel is electrically connected to the source driver circuit and the gate driver circuit. The memory device has a function of retaining image data; the CPU has a function of transmitting a control signal to one or two or more selected from the memory device, the GPU, the EL correction circuit, the timing controller, and the high frequency circuit; the GPU has a function of decoding the image data read from the memory device; the source driver circuit has a function of transmitting the decoded image data to the pixel; the EL correction circuit has a function of correcting luminance of light emitted from the light-emitting device; and the timing controller has a function of increasing or decreasing a frame rate at which an image is displayed on the display portion. The high frequency circuit has a function of converting an electrical signal generated in any one of the CPU, the GPU, and the memory device into an RF signal and transmitting the RF signal to the outside, and a function of converting an RF signal obtained from the outside into an electrical signal and transmitting the electrical signal to any one of the CPU, the GPU, and the memory device.

(2)

Another embodiment of the present invention is a display system including a first layer and a display portion. The display portion is positioned in a region overlapping with the first layer. The first layer includes a semiconductor substrate containing silicon as a material, and the first layer includes a plurality of first transistors and a plurality of second transistors whose channel formation regions contain silicon. The first layer includes a first circuit and a second circuit; the first circuit includes a source driver circuit and a gate driver circuit each including the first transistor; and the second circuit includes a memory device, a GPU, an EL correction circuit, and a timing controller each including the second transistor. The display portion includes a pixel, and the pixel includes a light-emitting device containing organic EL. The pixel is electrically connected to the source driver circuit and the gate driver circuit. The memory device has a function of retaining image data; the GPU has a function of decoding the image data read from the memory device; the source driver circuit has a function of transmitting the decoded image data to the pixel; the EL correction circuit has a function of correcting luminance of light emitted from the light-emitting device; and the timing controller has a function of increasing or decreasing a frame rate at which an image is displayed on the display portion.

(3)

Another embodiment of the present invention is a display system including a first layer, a second layer, and a display portion. The display portion is positioned in a region overlapping with the first layer, and the second layer is positioned in a region overlapping with the first layer. The first layer includes a semiconductor substrate containing silicon as a material, and the first layer includes a plurality of first transistors and a plurality of second transistors whose channel formation regions contain silicon. The second layer includes a plurality of third transistors whose channel formation regions contain a metal oxide. The first layer includes a first circuit and a second circuit; the first circuit includes a source driver circuit and a gate driver circuit each including the first transistor; and the second circuit includes a memory device, a GPU, an EL correction circuit, and a timing controller each including the second transistor. The third transistors function as transistors included in the memory device in the first layer. The display portion includes a pixel, and the pixel includes a light-emitting device containing organic EL. The pixel is electrically connected to the source driver circuit and the gate driver circuit. The memory device has a function of retaining image data; the GPU has a function of decoding the image data read from the memory device; the source driver circuit has a function of transmitting the decoded image data to the pixel; the EL correction circuit has a function of correcting luminance of light emitted from the light-emitting device; and the timing controller has a function of increasing or decreasing a frame rate at which an image is displayed on the display portion.

(4)

One embodiment of the present invention of (3) may have a structure in which the second layer includes a memory cell.

(5)

One embodiment of the present invention of any one of (2) to (4) may have a structure in which the second circuit includes a CPU including the second transistor. The CPU preferably has a function of transmitting a control signal to one or two or more selected from the memory device, the GPU, the EL correction circuit, and the timing controller.

(6)

One embodiment of the present invention of any one of (1) to (5) may have a structure in which the GPU has a function of performing an arithmetic operation of an artificial neural network and correcting an image displayed on the display portion on the basis of a result of the arithmetic operation.

(7)

Another embodiment of the present invention is an electronic device including the display system of any one of (1) to (6) and a housing.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display apparatus, a light-emitting device, a lighting device, an electronic device, and the like themselves are semiconductor devices or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether current flows or not.

For example, in the case where X and Y are functionally connected, one or more circuits that allow functional connection between X and Y (e.g., a logic circuit (an inverter, a NAND circuit, or a NOR circuit); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element having a resistance value higher than 0Ω or a wiring having a resistance value higher than 0Ω. Therefore, in this specification and the like, a "resistor" sometimes includes a wiring having a resistance value, a transistor in which current flows between its source and drain, a diode, and a coil. Thus, the term "resistor" can be sometimes replaced with the terms "resistance", "load", "region having a resistance value", and the like; conversely, the terms "resistance", "load", and "region having a resistance value" can be sometimes replaced with the term "resistor" and the like. The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1\times10^9$Ω.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. The terms "capacitor", "parasitic capacitance", "gate capacitance", and the like can be replaced with the term "capacitance" and the like in some cases. Conversely, the term "capacitance" can be replaced with the terms "capacitor", "parasitic capacitance", "gate capacitance", and the like in some cases. The term "pair of electrodes" of "capacitor" can be replaced with "pair of conductors", "pair of conductive regions", "pair of regions", and the like in some cases. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be sometimes replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of off-state current can be reduced, and the withstand voltage of the transistor can be increased (the reliability can be improved). Alternatively, with the multi-gate structure, drain-source current does not change very much even if drain-source voltage changes at the time of operation in a saturation region, so that a flat slope of voltage-current characteristics can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. As another example, the case where a single capacitor is illustrated in a circuit diagram may indicate a case where two or more capacitors are electrically connected to each other in parallel. As another example, the case where a single transistor is illustrated in a circuit diagram may indicate a case where two or more transistors are electrically connected to each other in series and their gates are electrically connected to each other. Similarly, as another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit structure or the device structure. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or the scope of claims. As another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) the top surface of a conductor" can be replaced with the expression "an insulator positioned under (on) a bottom surface of a conductor" when the direction of a drawing showing these components is rotated by 180°.

Furthermore, the term "over" or "under" does not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. As another example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" can also mean, for example, the case where a plurality of "electrodes" or "wirings" are formed in an integrated manner. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" or the like depending on the case.

In this specification and the like, the terms "wiring", "signal line", "power supply line", and the like can be interchanged with each other depending on the case or the situation. For example, the term "wiring" can be changed into the term "signal line" in some cases. As another example, the term "wiring" can be changed into the term "power supply line" or the like in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conduction state (on state) or a non-conduction state (off state) to determine whether current flows or not. Alternatively, a switch has a function of selecting and changing a current path. Thus, a switch may have two or more terminals through which current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited or a state where current can be made to flow between the source electrode and the drain electrode. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification and the like, a device formed using a metal mask or an FMM (fine metal mask) may be referred to as a device having an MM (metal mask) structure. In this specification and the like, a device formed without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-emitting devices can be classified roughly into a single structure and a tandem structure. A device with a single structure includes one light-emitting unit between a pair of electrodes, and the light-emitting unit preferably includes one or more light-emitting layers. To obtain white light emission, two or more light-emitting layers are selected such that the light-emitting layers emit light of complementary colors. For example, when the emission color of a first light-emitting layer and the emission color of a second light-emitting layer are complementary colors, the light-emitting device can be configured to emit white light as a whole. The same applies to a light-emitting device including three or more light-emitting layers.

A device with a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that a structure for obtaining white light emission is similar to that in the case of a single structure. In the device with a tandem structure, an intermediate layer such as a charge-generation layer is suitably provided between the plurality of light-emitting units.

When the above white-light-emitting device (having a single structure or a tandem structure) and the above light-emitting device having an SBS structure are compared to each other, the light-emitting device having an SBS structure can have lower power consumption than the white-light-emitting device. The light-emitting device having an SBS structure is suitable for the case where the power consumption is required to be low. Meanwhile, the white-light-emitting device is suitable in terms of lower manufacturing cost or higher manufacturing yield because the manufacturing process of the white-light-emitting device is simpler than that of the light-emitting device having an SBS structure.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 800 and less than or equal to 100°. Thus, the case where the angle is greater than or equal to 850 and less than or equal to 950 is also included. Furthermore, "approximately perpendicular" or "substantially perpendicular" indicates a state where two straight lines are placed at an angle greater than or equal to 600 and less than or equal to 120°.

Effect of the Invention

According to one embodiment of the present invention, a display apparatus with a reduced circuit area can be provided. According to one embodiment of the present invention, a display apparatus with reduced power consumption can be provided. According to one embodiment of the present invention, a display apparatus having high display quality can be provided. According to one embodiment of the present invention, a novel semiconductor device can be provided. According to one embodiment of the present invention, a system including any of the above semiconductor devices can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted as appropriate from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 21A is a diagram showing classification of crystal structures of IGZO, FIG. 21B is a diagram showing an XRD spectrum of crystalline IGZO, and FIG. 21C is a diagram showing a nanobeam electron diffraction pattern of crystalline IGZO.

MODE FOR CARRYING OUT THE INVENTION

Figure 1A:
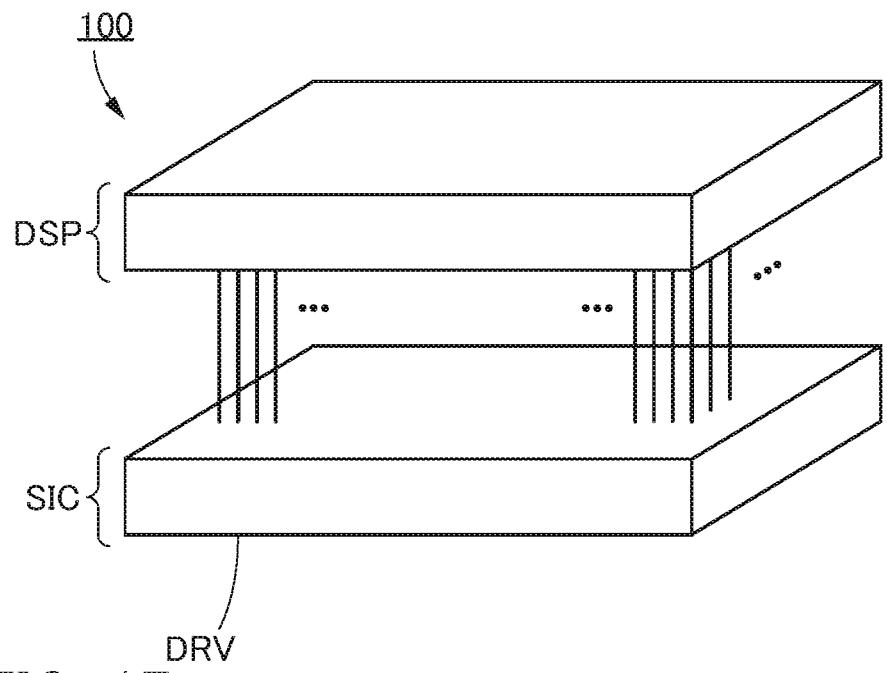
FIG. 1A is a diagram illustrating a structure example of a display apparatus.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described using a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a display apparatus and a display system of one embodiment of the present invention will be described.

Structure Example of Display Apparatus

FIG. 1A is a diagram schematically illustrating the display apparatus of one embodiment of the present invention. A display apparatus 100 illustrated in FIG. 1A includes a display portion DSP and a circuit portion SIC. The display apparatus 100 has a structure in which the circuit portion SIC is formed over a substrate and the display portion DSP is formed over the circuit portion SIC.

The display portion DSP has a region where an image is displayed in the display apparatus 100 and has a function of displaying an image on the basis of a data signal transmitted from the circuit portion SIC. The display portion DSP can have a structure in which pixels are regularly arranged. For example, the pixels in the display portion DSP may be arranged in a matrix. The arrangement of the plurality of pixels in the display portion DSP may be stripe arrangement, mosaic arrangement, or delta arrangement. Thus, the display portion DSP is sometimes referred to as a pixel array in this embodiment. Note that there is no particular limitation on the screen ratio (aspect ratio) of the display portion DSP. The display portion DSP is compatible with a variety of screen ratios such as 1:1 (square), 4:3, 16:9, and 16:10, for example.

The circuit portion SIC includes a peripheral circuit DRV including a source driver circuit, a gate driver circuit, a digital-analog converter circuit, and a level shifter in the display apparatus 100. In other words, the peripheral circuit DRV functions as a driver circuit for displaying an image on the display portion DSP.

The circuit portion SIC can be formed by providing a transistor, a capacitor, and the like over a substrate, for example. As the substrate, a semiconductor substrate (e.g., a single crystal substrate) containing silicon, germanium, or the like as a material can be used. Besides the semiconductor substrate, for example, an SOI (Silicon On Insulator) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper containing a fibrous material, or a base material film can be used. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper. Note that in the case where the fabrication process of the display apparatus 100 involves heat treatment, a highly heat-resistant material is preferably selected for the substrate.

Note that the substrate included in the circuit portion SIC is described as a semiconductor substrate containing silicon or the like as a material in this embodiment.

When a semiconductor substrate containing silicon as a material is used as the substrate included in the circuit portion SIC, for example, a transistor included in the peripheral circuit DRV can be formed on the semiconductor substrate. In that case, the transistor is a transistor containing silicon in its channel formation region (hereinafter referred to as a Si transistor). The Si transistor has high field-effect mobility and thus can make a large amount of on-state current to flow. Accordingly, the operation speed of the peripheral circuit DRV can be increased, and the range of a signal can be expanded, for example.

In the case of using a material containing single crystal silicon for the circuit portion SIC, the diagonal size of the circuit portion SIC can be greater than or equal to 0.1 inches and less than or equal to 5 inches, preferably greater than or equal to 0.5 inches and less than or equal to 3 inches, further preferably greater than or equal to 1 inch and less than or equal to 2 inches. Since the display portion DSP is provided above the circuit portion SIC, the size of the display portion DSP can be determined depending on the size of the circuit portion SIC. The amount of light emitted from the display portion DSP depends on the size of the display portion DSP. For example, it is suitable for the circuit portion SIC to have a diagonal size of 1 inch because the amount of light extracted from the display portion DSP can be approximately 4 times as large as that in the case of a diagonal size of 0.5 inches.

Structure Example of Display System

Next, the display system of one embodiment of the present invention will be described.

Figure 1B:
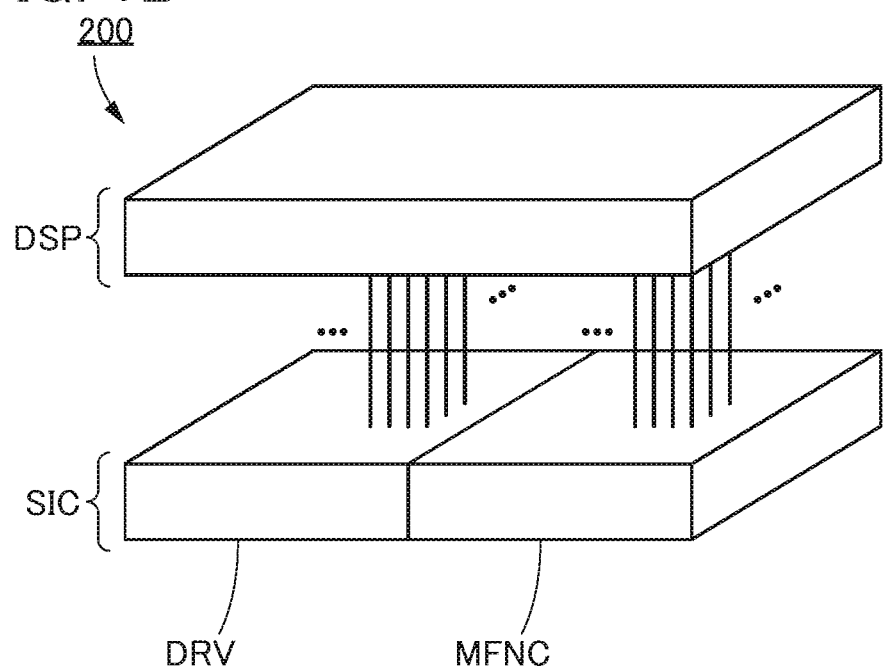
FIG. 1B is a diagram illustrating a structure example of a display system.

FIG. 1B is a diagram schematically illustrating the display system of one embodiment of the present invention. A display system 200 illustrated in FIG. 1B is different from the display apparatus 100 in FIG. 1A in that a functional circuit MFNC is provided in the circuit portion SIC of the display apparatus 100. Thus, for the description of the display portion DSP and the peripheral circuit DRV in the display system 200 in FIG. 1B, refer to the description for the display apparatus 100 in FIG. 1A.

Note that in this specification and the like, a display system means a structure in which a functional circuit is provided in a display apparatus. Since the display system displays an image, the display system can be rephrased as a display apparatus.

The functional circuit MFNC can be provided with, for example, a memory device storing image data to be displayed on the display portion DSP, a decoder for decoding encoded image data, a GPU (Graphics Processing Unit) for processing image data, a power supply circuit, a correction circuit, and a CPU (Central Processing Unit).

Figure 2:
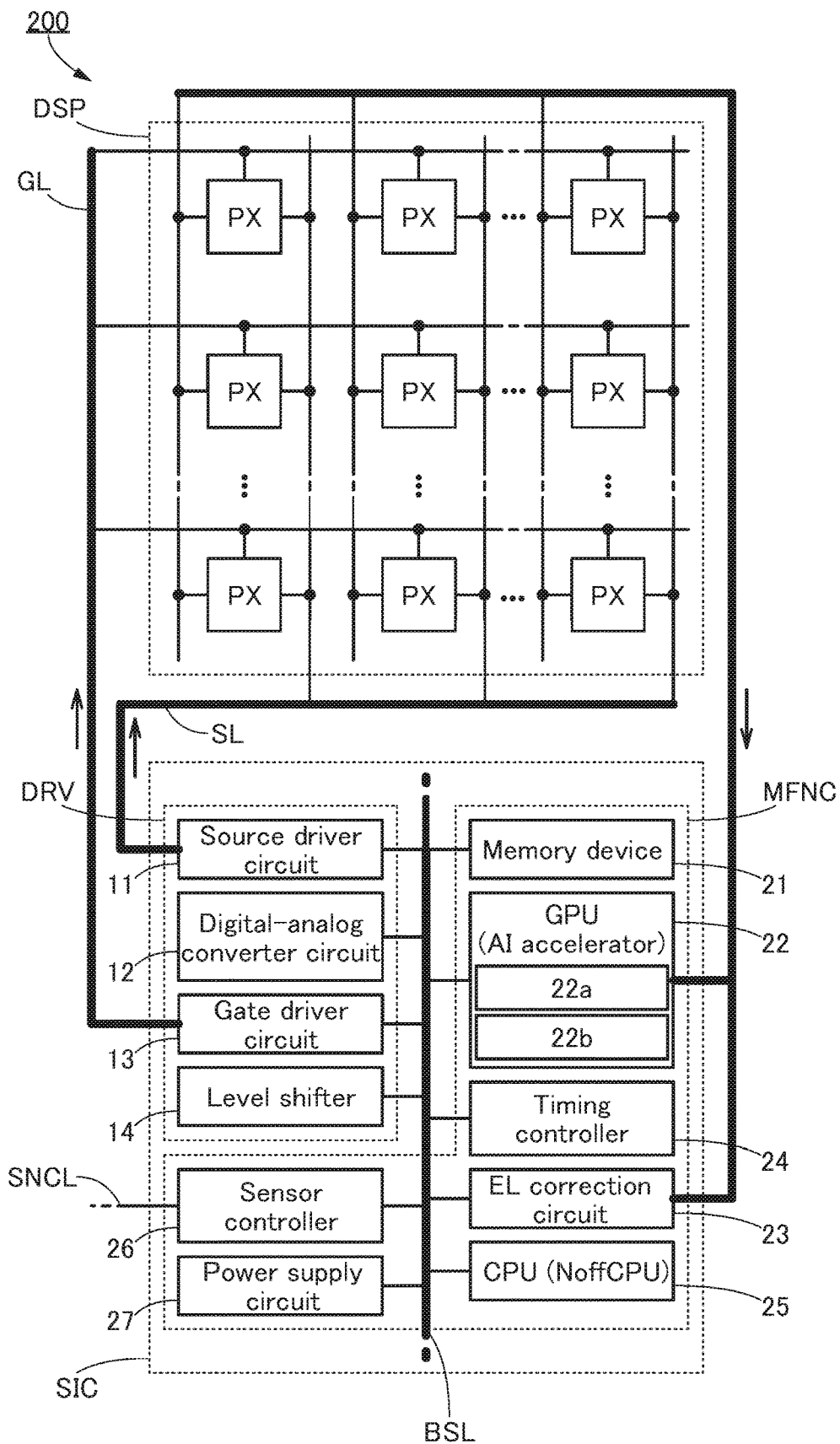
FIG. 2 is a block diagram illustrating a configuration example of a display system.

As a specific configuration example, FIG. 2 illustrates a block diagram of the display system 200.

Note that in FIG. 2, each of thick wirings (e.g., a wiring GL, a wiring SL, and a wiring BSL) is a plurality of wirings or a bus wiring.

In the display system 200 in FIG. 2, a plurality of pixels PX are arranged in a matrix in the display portion DSP, for example. Each of the pixels PX can be, for example, a pixel that includes at least one of a liquid crystal display device, a light-emitting device containing organic EL, and a light-emitting device including a light-emitting diode such as a micro LED. Note that the description in this embodiment is made on the assumption that a light-emitting device containing organic EL is used in each of the pixels PX in the display portion DSP. The plurality of pixels PX may be pixels emitting light of different colors, not pixels emitting light of the same color. For example, the plurality of pixels PX may be pixels that emit light of three colors: red, green, and blue. Thus, a pixel in this specification and the like can be described as a subpixel in some cases.

In the display system 200 in FIG. 2, the peripheral circuit DRV included in the circuit portion SIC includes, for example, a source driver circuit 11, a digital-analog converter circuit 12, a gate driver circuit 13, and a level shifter 14.

In the display system 200 in FIG. 2, the functional circuit MFNC included in the circuit portion SIC includes, for example, a memory device 21, a GPU (AI accelerator) 22, an EL correction circuit 23, a timing controller 24, a CPU (NoffCPU (registered trademark)) 25, a sensor controller 26, and a power supply circuit 27.

In the display system 200 in FIG. 2, for example, the bus wiring BSL is electrically connected to each of the circuits included in the peripheral circuit DRV and each of the circuits included in the functional circuit MFNC.

The source driver circuit 11 has a function of transmitting image data to a pixel PX included in the display portion DSP, for example. Thus, the source driver circuit 11 is electrically connected to the pixels PX through the wiring SL.

The digital-analog converter circuit 12 has a function of, for example, converting image data that has been digitally processed by a GPU described later, an EL correction circuit described later, or the like, into analog data. The image data converted into analog data is transmitted to the display portion DSP via the source driver circuit 11. Note that the digital-analog converter circuit 12 may be included in the source driver circuit 11, or the image data may be transmitted to the source driver circuit 11, the digital-analog converter circuit 12, and the display portion DSP in this order.

The gate driver circuit 13 has a function of selecting a pixel PX to which image data is to be transmitted in the display portion DSP, for example. Thus, the gate driver circuit 13 is electrically connected to the pixels PX through the wiring GL.

The level shifter 14 has a function of converting signals to be input to the source driver circuit 11, the digital-analog converter circuit 12, the gate driver circuit 13, and the like into signals having appropriate levels, for example.

The memory device 21 has a function of storing image data to be displayed on the display portion DSP, for example. Note that the memory device 21 can be configured to store the image data as digital data or analog data.

In the case where the memory device 21 stores image data, the memory device 21 is preferably a nonvolatile memory. In that case, a NAND memory or the like can be used as the memory device 21, for example.

In the case where the memory device 21 stores temporary data generated in the GPU 22, the EL correction circuit 23, the CPU 25, or the like, the memory device 21 is preferably a volatile memory. In that case, an SRAM (Static Random Access Memory), a DRAM (Dynamic Random Access Memory), or the like can be used as the memory device 21, for example.

The GPU 22 has a function of performing processing for rendering image data read from the memory device 21 on the display portion DSP, for example. Specifically, the GPU 22 is configured to perform pipeline processing in parallel and thus can perform high-speed processing of image data to be displayed on the display portion DSP. The GPU 22 can also function as a decoder for decoding an encoded image.

The functional circuit MFNC may include a plurality of circuits that can improve the display quality of the display portion DSP. As such circuits, for example, correction (dimming and toning) circuits that detect color irregularity of an image displayed on the display portion DSP and correct the color irregularity to obtain an optimal image may be provided. In the case where liquid crystal display devices are used in the pixels in the display portion DSP, the functional circuit MFNC may be provided with a gamma correction circuit. In the case where light-emitting devices utilizing organic EL are used in the pixels in the display portion DSP, the functional circuit MFNC may be provided with an EL correction circuit for correcting a variation in luminance of EL elements. Note that because the description in this embodiment is made on the assumption that light-emitting devices containing organic EL are used in the pixels PX in the display portion DSP, the functional circuit MFNC is provided with the EL correction circuit 23, for example. Note that the organic EL contained in the display portion DSP can have a structure in which red (R), green (G), and blue (B) are separately provided (an SBS structure or a Side By Side structure), or a structure in which a tandem structure (a structure in which a plurality of colors such as R, G, and B are connected in series with an intermediate layer (charge-generation layer) therebetween) is combined with coloring layers (e.g., color filters), for example. The tandem structure enables a light-emitting device capable of high-luminance light emission. Note that the luminance of the light emitted from the display portion DSP can be, for example, higher than or equal to 500 cd/m$^2$, preferably higher than or equal to 1000 cd/m$^2$ and lower than or equal to 10000 cd/m$^2$, further preferably higher than or equal to 2000 cd/m$^2$ and lower than or equal to 5000 cd/m$^2$.

The above-described image correction may be performed using artificial intelligence. For example, a current flowing in a display device included in a pixel (or a voltage applied to the display device) may be monitored and acquired, an image displayed on the display portion DSP may be acquired with an image sensor or the like, the current (or voltage) and the image may be used as input data in an arithmetic operation of the artificial intelligence (e.g., an artificial neural network), and the output result may be used to determine whether the image should be corrected.

Such an arithmetic operation of artificial intelligence can be applied to not only image correction but also upconversion processing of image data. Accordingly, upconversion processing of low-resolution image data can be performed in accordance with the resolution of the display portion DSP, which enables a high-display-quality image to be displayed on the display portion DSP.

Note that the above-described arithmetic operation of artificial intelligence can be performed using the GPU 22 included in the functional circuit MFNC. That is, the GPU 22 can be used to perform arithmetic operations for various kinds of correction. Examples of the various kinds of correction include color irregularity correction and upconversion. The GPU 22 may include a circuit 22a for color irregularity correction and a circuit 22b for upconversion as illustrated in FIG. 2.

Note that in this specification and the like, a GPU performing an arithmetic operation of artificial intelligence is referred to as an AI accelerator. That is, the GPU included in the functional circuit MFNC may be replaced with an AI accelerator in the description in this specification and the like.

The timing controller 24 has a function of increasing or decreasing the frame rate at which an image is displayed on the display portion DSP, for example. For example, the display system 200 can be driven at a frame rate decreased by the timing controller 24 in the case where the display portion DSP displays a still image; for another example, the display system 200 can be driven at a frame rate increased by the timing controller 24 in the case where the display portion DSP displays a moving image. In other words, when the timing controller 24 is provided in the display system 200, a frame rate can be changed depending on which of a still image and a moving image is displayed. Specifically, since the frame rate when the display portion DSP displays a still image can be decreased, the power consumption of the display system 200 can be reduced.

The CPU 25 has a function of performing general-purpose processing such as execution of an operating system, control of data, and execution of various kinds of arithmetic operations and programs, for example. In the display system 200, the CPU 25 has a function of, for example, giving an instruction for a writing operation or a reading operation of image data in the memory device 21, an operation for correcting image data, an operation for a later-described sensor, or the like. Furthermore, the CPU 25 may have a function of, for example, transmitting a control signal to one or two or more selected from the memory device 21, the GPU 22, the EL correction circuit 23, the timing controller 24, a high frequency circuit, circuits included in the functional circuit MFNC, and the like.

The CPU 25 may include a circuit for temporarily backing up data (hereinafter referred to as a backup circuit). The backup circuit is preferably capable of retaining the data even after supply of power supply voltage is stopped. For example, in the case where the display portion DSP displays a still image, the CPU 25 can cease to work until an image different from the currently displayed still image is displayed. Accordingly, the data under processing by the CPU 25 is temporarily backed up in the backup circuit and then supply of power supply voltage to the CPU 25 is stopped to stop the CPU 25, whereby dynamic power consumption by the CPU 25 can be reduced. In this specification and the like, a CPU including a backup circuit is referred to as an NoffCPU.

The sensor controller 26 has a function of controlling a sensor, for example. FIG. 2 illustrates a wiring SNCL as a wiring electrically connected to the sensor.

The sensor can be, for example, a touch sensor that can be provided above or below the display portion DSP, or inside the display portion DSP.

The sensor may be an illuminance sensor, for example. Specifically, the illuminance sensor acquiring the intensity of the external light with which the display portion DSP is irradiated makes it possible to change the brightness (luminance) of an image displayed on the display portion DSP in accordance with the external light. For example, under bright external light, the luminance of an image displayed on the display portion DSP can be increased to enhance the viewability of the image. By contrast, under dark external light, the luminance of an image displayed on the display portion DSP can be lowered to reduce the power consumption.

The power supply circuit 27 has a function of, for example, generating voltages to be supplied to the circuits included in the peripheral circuit DRV, the circuits included in the functional circuit MFNC, the pixels included in the display portion DSP, and the like. Note that the power supply circuit 27 may have a function of selecting a circuit to which voltage is to be supplied. The power supply circuit 27 can stop supply of voltage to the CPU 25, the GPU 22, and the like during a period in which the display portion DSP displays a still image so that the power consumption of the whole display system 200 is reduced, for example.

Modification Example 1 of Display Apparatus and Display System

On a different note, transistors formed on a semiconductor substrate are used as the transistors included in the peripheral circuit DRV and the functional circuit MFNC in FIG. 1B. Although an example where transistors are formed on the semiconductor substrate containing silicon as a material and Si transistors are included in the peripheral circuit DRV and the functional circuit MFNC is described in this embodiment, transistors having characteristics different from those of Si transistors can be applied to the display apparatus or the display system of one embodiment of the present invention in FIG. 1A and FIG. 1B.

Figure 3A:
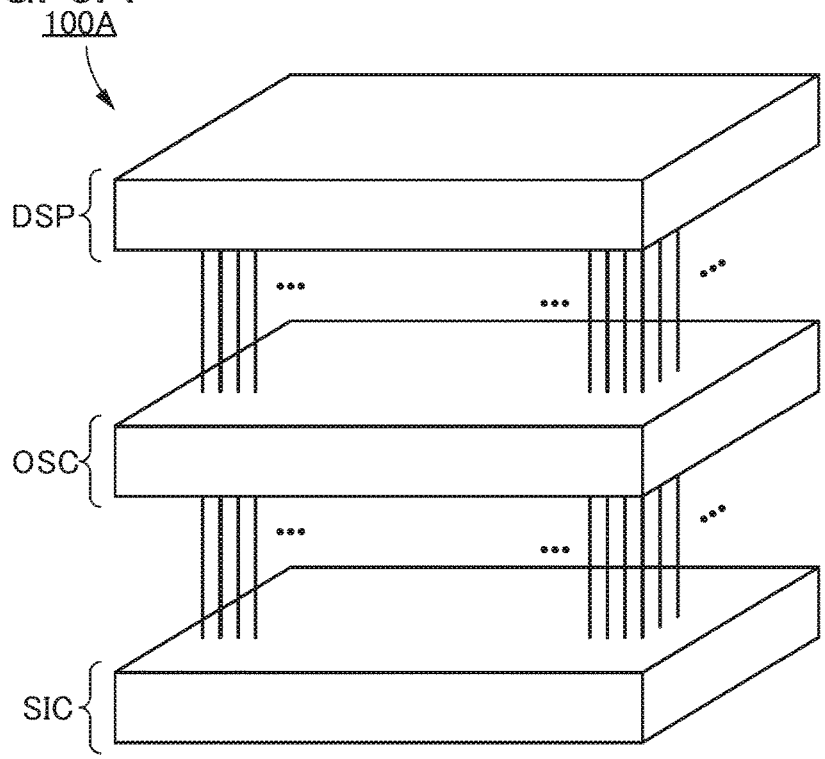
FIG. 3A is a diagram illustrating a structure example of a display apparatus.
Figure 3B:
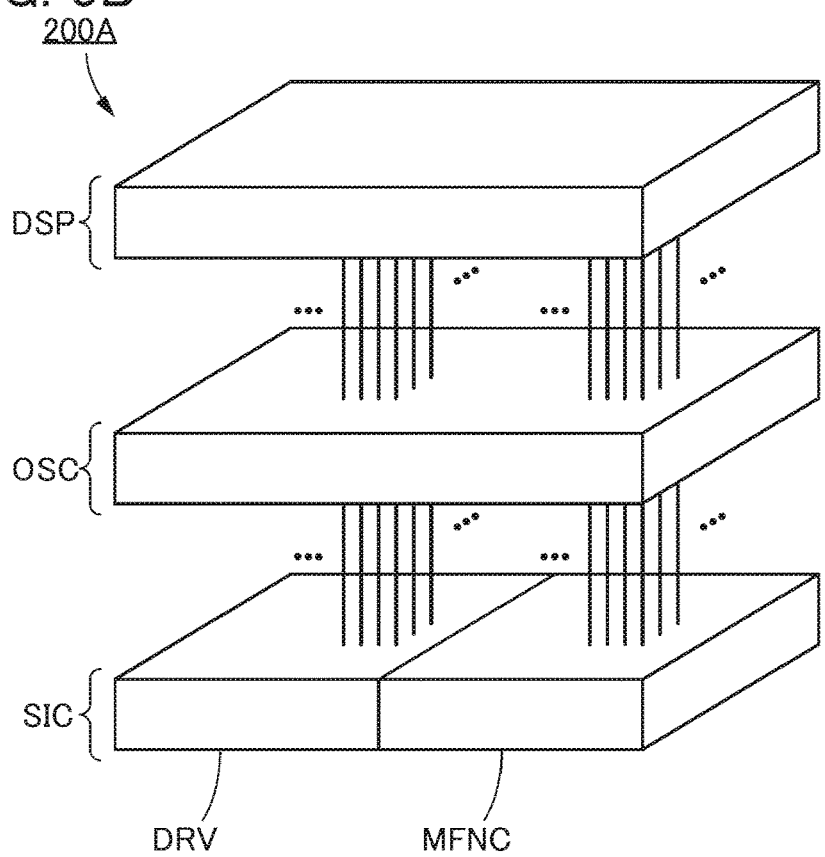
FIG. 3B is a diagram illustrating a structure example of a display system.

For example, the display apparatus of one embodiment of the present invention may have a structure in which a layer OSC is formed between the circuit portion SIC and the display portion DSP (a display apparatus 100A) as illustrated in FIG. 3A. Furthermore, for example, the display system of one embodiment of the present invention may have a structure in which, as in FIG. 3A, the layer OSC is formed between the circuit portion SIC and the display portion DSP (a display system 200A) as illustrated in FIG. 3B.

The layer OSC can include an OS transistor, for example. A channel formation region of the OS transistor contains a metal oxide described in Embodiment 4. The metal oxide can be, for example, one or more materials selected from indium, an element M (one or more kinds of elements selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like), and zinc. In particular, when a semiconductor layer of the OS transistor contains a metal oxide containing indium, gallium, and zinc, the band gap of the semiconductor layer can be increased. Thus, the off-state current of the OS transistor can be reduced.

The OS transistor can be formed not only over a semiconductor substrate but also over an insulator substrate, a conductor substrate, a conductive film, an insulating film, and a semiconductor film and thus can be easily provided over a semiconductor substrate where a Si transistor is formed (over the circuit portion SIC).

The layer OSC may include a circuit element such as a capacitor in addition to the OS transistor. The layer OSC may include a circuit.

When the layer OSC is provided over the circuit portion SIC, the circuits formed in the circuit portion SIC can utilize the OS transistor included in the layer OSC; thus, the feature of a low off-state current of the OS transistor can be utilized in the circuits.

The OS transistor included in the layer OSC can be used as a switch for performing power gating, for example. Specifically, the switch can be provided in a circuit included in the peripheral circuit DRV or the functional circuit MFNC, for example. When the switch is brought into an off state, supply of power supply voltage from the power supply circuit 27 or the like to the circuit can be stopped to stop the circuit temporarily.

The OS transistor included in the layer OSC can be used as a write transistor included in a memory cell of the memory device 21, for example. When the OS transistor is used as the write transistor included in the memory cell, leakage current between a source and a drain of the write transistor (off-state current) can be made low, in which case data written to the memory cell can be retained for a long time. Accordingly, an interval between refresh operations of the data retained in the memory cell can be extended; thus, the power consumption of the display system 200 can be reduced.

A memory device that temporarily stores data used in the circuits included in the peripheral circuit DRV, the circuits included in the functional circuit MFNC, or the like may be provided in the layer OSC. For example, a memory device MDV may be provided in the layer OSC as in a block diagram of the display system 200A in FIG. 4. In the memory device MDV illustrated in FIG. 4, a plurality of memory cells MC are arranged in a matrix, for example. The functional circuit MFNC of the display system 200A in FIG. 4 includes a memory control circuit 31 for performing the writing operation, the reading operation, the erasing operation, or the like of data in the memory cells MC, for example.

The memory control circuit 31 includes, for example, a word line driver circuit, a bit line driver circuit, and the like for the memory cells MC included in the memory device MDV. Thus, the memory control circuit 31 is electrically connected to the memory cells MC included in the layer OSC through a wiring ML.

Configuration Example 1 of Memory Cell

Next, circuit configuration examples of a memory cell that can be used for each of the memory cells MC are described. A memory cell of a memory circuit called a DOSRAM (Dynamic Oxide Semiconductor Random Access Memory) (registered trademark) or a NOSRAM (Dynamic Oxide Semiconductor Random Access Memory) (registered trademark) can be used as each of the memory cells MC, for example.

Figure 5A:
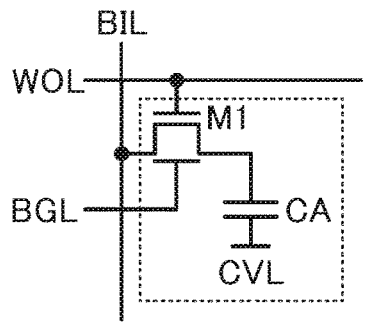
FIG. 5A to FIG. 5G are circuit diagrams illustrating configuration examples of memory cells.

FIG. 5A illustrates a circuit configuration example of a memory cell of a DOSRAM. A memory cell MC1 includes a transistor M1 and a capacitor CA. Note that the transistor M1 includes a front gate (simply referred to as a gate in some cases) and a back gate.

A first terminal of the transistor M1 is electrically connected to a first terminal of the capacitor CA, a second terminal of the transistor M1 is electrically connected to a wiring BIL, the gate of the transistor M1 is electrically connected to a wiring WOL, and the back gate of the transistor M1 is electrically connected to a wiring BGL. A second terminal of the capacitor CA is electrically connected to a wiring CVL.

The transistor M1 functions as a write transistor in the memory cell MC1. As described above, the transistor M1 is an OS transistor, for example.

Figure 4:
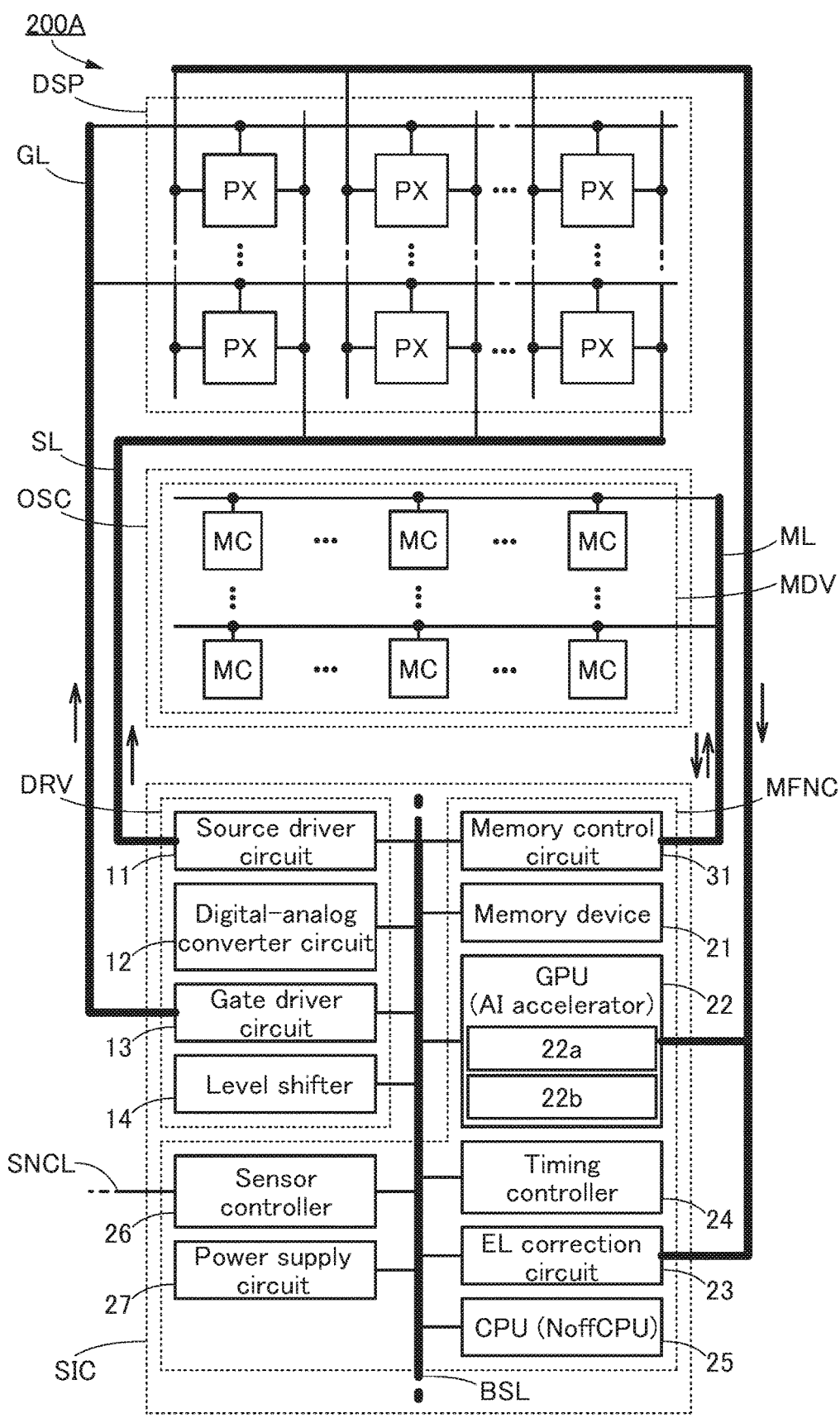
FIG. 4 is a block diagram illustrating a configuration example of a display system.

The wiring BIL, the wiring WOL, a wiring CAL, and the wiring BGL correspond to the wiring ML of the display system 200A in FIG. 4.

The wiring BIL functions as a bit line, for example, and the wiring WOL functions as a word line, for example. The wiring CAL functions as a wiring for applying a predetermined potential to the second terminal of the capacitor CA, for example. Note that in data writing and data reading, a low-level potential (referred to as a reference potential in some cases) is preferably applied to the wiring CVL.

The wiring BGL functions as a wiring for applying a potential to the back gate of the transistor M1. When a given potential is applied to the wiring BGL, the threshold voltage of the transistor M1 can be increased or decreased.

Although the memory cell MC1 in FIG. 5A has a configuration in which the back gate of the transistor M1 is electrically connected to the wiring BGL, the memory cell MC1 may have a configuration in which the gate and the back gate of the transistor M1 are electrically connected to each other for the purpose of increasing the on-state current of the transistor M1. In the memory cell MC1 in FIG. 5A, the transistor M1 does not need to include a back gate.

Data writing and reading are performed by applying a high-level potential to the wiring WOL to turn on the transistor M1 so that electrical continuity is established between the wiring BIL and the first terminal of the capacitor CA.

Specifically, data writing is performed by applying a potential corresponding to data to be written to the wiring BIL to write the potential to the first terminal of the capacitor CA via the transistor M1. After data writing, a low-level potential is applied to the wiring WOL to turn off the transistor M1, whereby the potential can be held in the memory cell MC1.

In data reading, first, the wiring BIL is precharged at an appropriate potential, such as a middle potential between a low-level potential and a high-level potential, and then the wiring BIL is brought into an electrically floating state. After that, a high-level potential is applied to the wiring WOL to turn on the transistor M1, so that the potential of the wiring BIL is changed. Since the potential of the wiring BIL changes depending on the potential written to the first terminal of the capacitor CA, data retained in the memory cell MC1 can be read using the changed potential of the wiring BIL.

The memory cell MC1 described above is not limited to the circuit structure illustrated in FIG. 5A, and the circuit structure of the memory cell MC1 may be changed as appropriate.

Figure 5B:
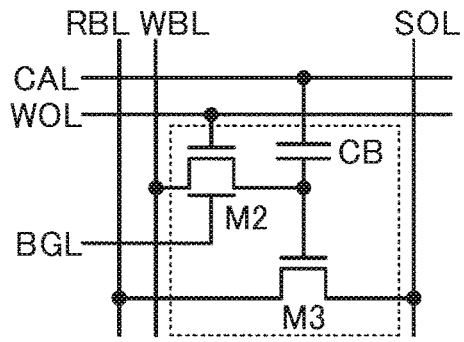

FIG. 5B illustrates a circuit structure example of a memory cell of a NOSRAM. A memory cell MC2 includes a transistor M2, a transistor M3, and a capacitor CB. Note that the transistor M2 includes a front gate (simply referred to as a gate in some cases) and a back gate.

The transistor M2 functions as a write transistor in the memory cell MC2. Note that the write transistor is an OS transistor as described above, for example.

The transistor M3 functions as a read transistor in the memory cell MC2. As described above, the read transistor is an OS transistor. Note that in this operating example, the transistor M3 is assumed to operate in a saturation region unless otherwise specified. In other words, the gate voltage, the source voltage, and the drain voltage of the transistor M3 are assumed to be appropriately biased to voltages in the range where the transistor operates in the saturation region.

On a different note, at least one of the transistor M2 and the transistor M3 may be a Si transistor. That is, a transistor included in the memory cell MC2, which is a Si transistor, can be formed in the circuit portion SIC, and the other transistor included in the memory cell MC2 can be an OS transistor and formed in the layer OSC.

A first terminal of the transistor M2 is electrically connected to a first terminal of the capacitor CB, a second terminal of the transistor M2 is electrically connected to a wiring WBL, the gate of the transistor M2 is electrically connected to the wiring WOL, and the back gate of the transistor M2 is electrically connected to the wiring BGL. A second terminal of the capacitor CB is electrically connected to the wiring CAL. A first terminal of the transistor M3 is electrically connected to a wiring RBL, a second terminal of the transistor M3 is electrically connected to a wiring SOL, and a gate of the transistor M3 is electrically connected to the first terminal of the capacitor CB.

The wiring RBL, the wiring WBL, the wiring WOL, the wiring CAL, the wiring BGL, and the wiring SOL correspond to the wiring ML of the display system 200A in FIG. 4.

The wiring WBL functions as a write bit line, the wiring RBL functions as a read bit line, and the wiring WOL functions as a word line. The wiring CAL functions as a wiring for applying a predetermined potential to the second terminal of the capacitor CB. When data is retained, a low-level potential (referred to as a reference potential in some cases) is preferably applied to the wiring CAL and when data is written and when data is read out, a high-level potential is preferably applied to the wiring CAL.

The wiring BGL functions as a wiring for applying a potential to the back gate of the transistor M2. When a given potential is applied to the wiring BGL, the threshold voltage of the transistor M2 can be increased or decreased. Like the transistor M1 in FIG. 5A, the transistor M2 may have a configuration in which the gate and the back gate of the transistor M2 are electrically connected to each other, or may have a configuration in which a back gate is not provided.

Data writing is performed by applying a high-level potential to the wiring WOL to turn on the transistor M2 so that electrical continuity is established between the wiring WBL and the first terminal of the capacitor CB. Specifically, when the transistor M2 is in an on state, a potential corresponding to information stored in the wiring WBL is applied, whereby the potential is written to the first terminal of the capacitor CB and the gate of the transistor M3. After that, a low-level potential is applied to the wiring WOL to turn off the transistor M2, whereby the potential of the first terminal of the capacitor CB and the potential of the gate of the transistor M3 are retained.

Data reading is performed by applying a predetermined potential to the wiring SOL. The current flowing between a source and a drain of the transistor M3 and the potential of the first terminal of the transistor M3 are determined by the potential of the gate of the transistor M3 and the potential of the second terminal of the transistor M3; therefore, the potential of the wiring RBL electrically connected to the first terminal of the transistor M3 is read out, so that the potential retained in the first terminal of the capacitor CB (or the gate of the transistor M3) can be read out. In other words, data written into this memory cell can be read out from the potential retained in the first terminal of the capacitor CB (or the gate of the transistor M3).

Figure 5C:
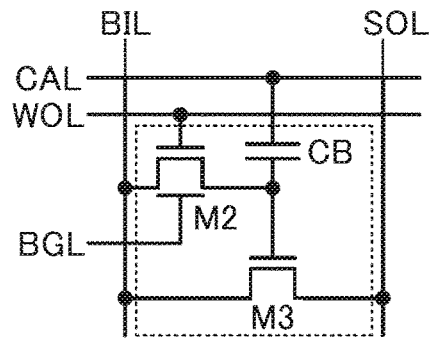

The memory cell MC2 described above is not limited to the circuit structure illustrated in FIG. 5B and the circuit structure of the memory cell MC2 may be changed as appropriate. For example, the wiring WBL and the wiring RBL may be combined into one wiring BIL. FIG. 5C illustrates a circuit structure example of the memory cell. In a memory cell MC2A, one wiring BIL corresponds to the wiring WBL and the wiring RBL in the memory cell MC2, and the second terminal of the transistor M2 and the first terminal of the transistor M3 are connected to the wiring BIL. In other words, the memory cell MC2A operates with one wiring BIL functioning as a write bit line and a read bit line.

Configuration Example 2 of Memory Cell

Examples of a memory cell of a memory circuit that can be used as each of the memory cells MC in the layer OSC, other than a DOSRAM and a NOSRAM, include an MRAM (Magnetoresistive Random Access Memory), a ReRAM (Resistive Random Access Memory), a phase-change memory (referred to as a PCM, a PRAM, or the like in some cases), and a ferroelectric memory. Their circuit configuration will be described below.

Figure 5D:
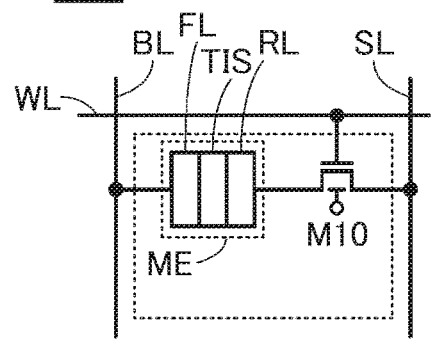

A memory cell MC3 illustrated in FIG. 5D is an example of an STT-MRAM (Spin Transfer Torque-Magnetoresistive Random Access Memory).

The memory cell MC3 includes a transistor M10 and an MTJ (magnetic tunnel junction) element ME.

Like the transistor M1 and the transistor M2, the transistor M10 can be an OS transistor, for example.

The MTJ element ME includes a layer FL including a free layer, a layer TIS including a tunnel insulator, and a layer RL including a fixed layer, and the layer FL and the layer RL overlap with each other with the layer TIS therebetween.

A first terminal of the transistor M10 is electrically connected to the layer RL of the MTJ element ME, a second terminal of the transistor M10 is electrically connected to a wiring SL, and a gate of the transistor M10 is electrically connected to a wiring WL. The layer FL of the MTJ element ME is electrically connected to a wiring BL.

The wiring BL, the wiring WL, and the wiring SL correspond to the wiring ML of the display system 200A in FIG. 4.

The wiring BL functions as a write bit line or a read bit line for the memory cell MC3, for example.

The wiring WL functions as a word line for the memory cell MC3, for example.

The wiring SL functions as a wiring that supplies a constant voltage, for example. The constant voltage can be a low-level potential, for example.

Although not illustrated in the drawings, not only an STT-MRAM but also an SOT-MRAM (Spin Orbit Torque- Magnetoresistive Random Access Memory) can be used for each of the memory cells MC in the layer OSC.

Figure 5E:
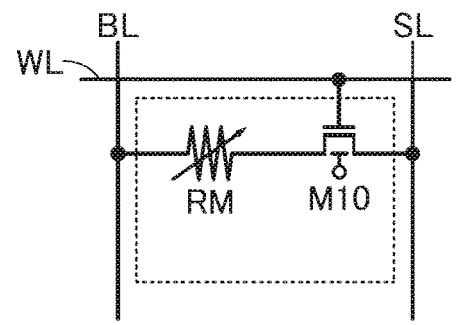

A memory cell MC4 illustrated in FIG. 5E is an example of an ReRAM (Resistive Random Access Memory).

The memory cell MC4 includes the transistor M10 and a variable resistor RM.

Like the transistor M1 and the transistor M2, the transistor M10 can be an OS transistor, for example.

As illustrated in FIG. 5E, the memory cell MC4 has a structure in which the MTJ element ME in the memory cell MC3 in FIG. 5D is replaced with the variable resistor RM. In the memory cell MC in FIG. 5E, a first terminal of the variable resistor RM is electrically connected to the first terminal of the transistor M10, and a second terminal of the variable resistor RM is electrically connected to the wiring BL.

The wiring BL, the wiring WL, and the wiring SL correspond to the wiring ML of the display system 200A in FIG. 4.

The wiring BL functions as a write bit line or a read bit line for the memory cell MC4, for example.

The wiring WL functions as a word line for the memory cell MC4, for example.

The wiring SL functions as a wiring that supplies a constant voltage, for example. The constant voltage can be a reference potential, for example.

Figure 5F:
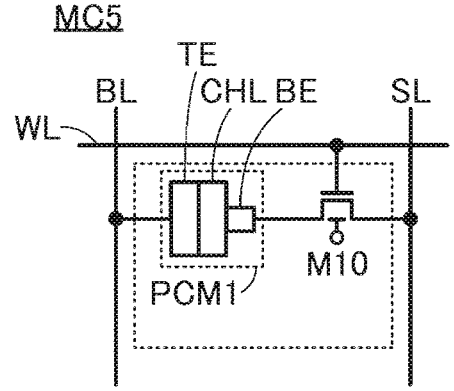

A memory cell MC5 illustrated in FIG. 5F is an example of a memory circuit including a phase-change memory.

The memory cell MC5 includes the transistor M10 and a phase-change memory PCM1.

Like the transistor M1 and the transistor M2, the transistor M10 can be an OS transistor, for example.

The phase-change memory PCM1 includes an electrode TE, a phase-change layer CHL, and an electrode BE, for example, and the electrode TE, the phase-change layer CHL, and the electrode BE are electrically connected in this order.

For the phase-change layer CHL, chalcogenide glass can be used, for example. This embodiment is described assuming that chalcogenide glass is used for the phase-change layer CHL.

It is preferred that the size of area in contact with the phase-change layer CHL be different between the electrode TE and the electrode BE. For example, FIG. 5F illustrates that the area where the electrode TE is in contact with the phase-change layer CHL is larger than the area where the electrode BE is in contact with the phase-change layer CHL. When the area where the electrode BE is in contact with the phase-change layer CHL is made small, heat can be locally given to the phase-change layer CHL. Thus, the phase change is more likely to occur in the phase-change layer CHL near the electrode BE than in the phase-change layer CHL near the electrode TE.

As illustrated in FIG. 5F, the memory cell MC5 has a structure in which the MTJ element ME in the memory cell MC3 in FIG. 5D is replaced with the phase-change memory PCM1. In the memory cell MC in FIG. 5F, the electrode BE of the phase-change memory PCM1 is electrically connected to the first terminal of the transistor M10, and the electrode TE of the phase-change memory PCM1 is electrically connected to the wiring BL.

The wiring BL, the wiring WL, and the wiring SL correspond to the wiring ML of the display system 200A in FIG. 4.

The wiring BL functions as a write bit line or a read bit line for the memory cell MC5, for example.

The wiring WL functions as a word line for the memory cell MC5, for example.

The wiring SL functions as a wiring that supplies a constant voltage, for example. The constant voltage can be a low-level potential, for example.

Figure 5G:
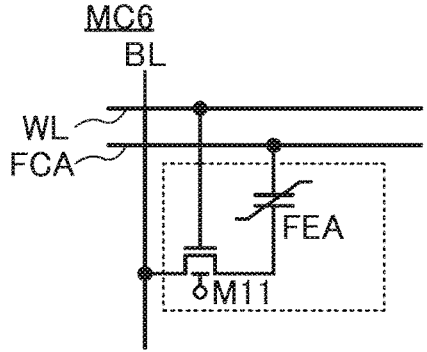

A memory cell MC6 illustrated in FIG. 5G is an example of an FeRAM (Ferroelectric Random Access Memory).

The memory cell MC6 includes a transistor M11 and a ferroelectric capacitor FEA.

Like the transistor M1 and the transistor M2, the transistor M11 can be an OS transistor, for example.

A first terminal of the transistor M11 is electrically connected to the wiring BL, a second terminal of the transistor M11 is electrically connected to a first terminal of the ferroelectric capacitor FEA, and a gate of the transistor M11 is electrically connected to the wiring WL. A second terminal of the ferroelectric capacitor FEA is electrically connected to a wiring FCA.

The wiring BL, the wiring WL, and the wiring FCA correspond to the wiring ML of the display system 200A in FIG. 4.

The wiring BL functions as a wiring that transmits data to be written to the memory cell MC6, for example.

The wiring WL functions as a wiring for selecting the memory cell MC6 to which data is to be written, for example.

The wiring FCA functions as a wiring for applying a variable potential with which polarization occurs in a material that can have ferroelectricity contained in the ferroelectric capacitor FEA when data is written to the circuit MC6, for example.

Here, the material that can have ferroelectricity contained in the ferroelectric capacitor FEA is described.

As the material that can have ferroelectricity, for example, hafnium oxide is preferably used. In the case where hafnium oxide is used for a dielectric included in the ferroelectric capacitor FEA, the thickness of the hafnium oxide is preferably less than or equal to 10 nm, further preferably less than or equal to 5 nm, still further preferably less than or equal to 2 nm.

Examples of a material that can show ferroelectricity include, besides hafnium oxide, metal oxides such as zirconium oxide and hafnium oxide zirconium (HfZrO$_X$ (X is a real number greater than 0)). Examples of the material that can show ferroelectricity also include a material in which an element J1 (the element J1 here is one or more selected from zirconium (Zr), silicon (Si), aluminum (Al), gadolinium (Gd), yttrium (Y), lanthanum (La), strontium (Sr), and the like) is added to hafnium oxide. Here, the atomic ratio of hafnium to the element J1 can be set as appropriate; the atomic ratio of hafnium to the element J1 is, for example, 1:1 or the neighborhood thereof. Examples of the material that can show ferroelectricity also include a material in which an element J2 (the element J2 here is one or more selected from hafnium (Hf), silicon (Si), aluminum (Al), gadolinium (Gd), yttrium (Y), lanthanum (La), strontium (Sr), and the like) is added to zirconium oxide, and the like. The atomic ratio of zirconium to the element J2 can be set as appropriate; the atomic ratio of zirconium to the element J2 is, for example, 1:1 or the neighborhood thereof. As the material that can show ferroelectricity, a piezoelectric ceramic having a perovskite structure, such as lead titanate (PbTiO$_X$), barium strontium titanate (BST), strontium titanate, lead zirconate titanate (PZT), strontium bismuth tantalate (SBT), bismuth ferrite (BFO), or barium titanate, may be used.

Examples of the material that can show ferroelectricity also include scandium aluminum nitride (Al$_{1-a}$Sc$_a$N$_b$ (a is a real number greater than 0 and less than 0.5, and b is 1 or an approximate value thereof)), an Al—Ga—Sc nitride, and a Ga—Sc nitride. Examples of the material that can show ferroelectricity also include a metal nitride containing an element M1, an element M2, and nitrogen. Here, the element M1 is one or more selected from aluminum (Al), gallium (Ga), indium (In), and the like. The element M2 is one or more selected from boron (B), scandium (Sc), yttrium (Y), lanthanum (La), cerium (Ce), neodymium (Nd), europium (Eu), titanium (Ti), zirconium (Zr), hafnium (Hf), vanadium (V), niobium (Nb), tantalum (Ta), chromium (Cr), and the like. Note that the atomic ratio of the element M1 to the element M2 can be set as appropriate. A metal oxide containing the element M1 and nitrogen shows ferroelectricity in some cases even though the metal oxide does not contain the element M2. Examples of the material that can show ferroelectricity also include a material in which an element M3 is added to the above metal nitride. Note that the element M3 is one or more selected from magnesium (Mg), calcium (Ca), strontium (Sr), zinc (Zn), cadmium (Cd), and the like. Here, the atomic ratio of the element M1 to the element M2 and the element M3 can be set as appropriate. Since the above metal nitride contains at least a Group 13 element and nitrogen, which is a Group 15 element, the metal nitride is referred to as a ferroelectric of Group III-V, a ferroelectric of a Group III nitride, or the like in some cases.

Examples of the material that can show ferroelectricity also include a perovskite-type oxynitride such as $SrTaO_2N$ or $BaTaO_2N$, $GaFeO_3$ with a K-alumina-type structure, and the like.

The material that can show ferroelectricity can be, for example, a mixture or a compound formed of a plurality of materials selected from the above-listed materials. Alternatively, the material that can show ferroelectricity can have a stacked-layer structure of a plurality of materials selected from the above-listed materials. Since the above-listed materials and the like may change their crystal structures (characteristics) according to a variety of processes and the like as well as deposition conditions, a material that exhibits ferroelectricity is referred to not only as a ferroelectric but also as a material that can show ferroelectricity or a material that shows ferroelectricity in this specification and the like. Furthermore, the ferroelectric includes not only a material that exhibits ferroelectricity but also a material that can show ferroelectricity.

Among the materials that can show ferroelectricity, a material containing hafnium oxide or hafnium oxide and zirconium oxide is preferable because the material can show ferroelectricity even when being processed into a thin film of several nanometers. Here, the thickness of the material that can show ferroelectricity can be less than or equal to 100 nm, preferably less than or equal to 50 nm, further preferably less than or equal to 20 nm, still further preferably less than or equal to 10 nm (typified by greater than or equal to 2 nm and less than or equal to 9 nm). The thickness is preferably greater than or equal to 8 nm and less than or equal to 12 nm, for example. With the use of the ferroelectric layer that can have a small thickness, the ferroelectric layer can be interposed between a pair of electrodes of a capacitor, and the capacitor can be combined with a miniaturized semiconductor element such as a transistor to fabricate a semiconductor device. Note that in this specification and the like, the material that can show ferroelectricity processed into a layered shape is referred to as a ferroelectric layer, a metal oxide film, or a metal nitride film in some cases. Furthermore, a device including such a ferroelectric layer, metal oxide film, or metal nitride film is referred to as a ferroelectric device in this specification and the like, in some cases.

In the case where HfZrOxis used as the material that can show ferroelectricity, deposition is preferably performed by an atomic layer deposition (ALD) method, particularly a thermal ALD method. In the case where deposition of the material that can show ferroelectricity is performed by a thermal ALD method, it is suitable to use a material that does not contain a hydrocarbon (also referred to as Hydro Carbon or HC) for a precursor. When the material that can show ferroelectricity contains one or both of hydrogen and carbon, crystallization of the material that can show ferroelectricity might be hindered. Thus, the precursor that does not contain a hydrocarbon is preferably used as described above to reduce the concentration(s) of one or both of hydrogen and carbon in the material that can show ferroelectricity. Examples of the precursor that does not contain a hydrocarbon include a chlorine-based material. In the case where a material containing hafnium oxide and zirconium oxide ($HfZrO_x$) is used as the material that can show ferroelectricity, at least one of $HfCl_4$ and $ZrCl_4$ are/is used as the precursor.

In the case of depositing a film of the material that can show ferroelectricity, impurities in the film, at least one or more of hydrogen, a hydrocarbon, and carbon here, are thoroughly removed, whereby a highly purified intrinsic film having ferroelectricity can be formed. Note that the highly purified intrinsic film having ferroelectricity and a highly purified intrinsic oxide semiconductor described in a later embodiment are highly compatible with each other in the manufacturing process. Thus, a method for manufacturing a semiconductor device with high productivity can be provided.

Furthermore, in the case where $HfZrO_X$ is used as the material that can show ferroelectricity, hafnium oxide and zirconium oxide are preferably deposited alternately by a thermal ALD method to have a composition of 1:1.

In the case where deposition of the material that can show ferroelectricity is performed by a thermal ALD method, $H_2O$ or $O_3$ can be used as an oxidizer. However, the oxidizer in the thermal ALD method is not limited thereto. For example, the oxidizer in the thermal ALD method may contain any one or more selected from $O_2$, $O_3$, $N_2O$, $NO_2$, $H_2O$, and $H_2O_2$.

Note that the crystal structure of the material that can show ferroelectricity is not particularly limited. For example, the material that can show ferroelectricity may have any one or more selected from cubic, tetragonal, orthorhombic, and monoclinic crystal structures. The material that can show ferroelectricity especially preferably has an orthorhombic crystal structure to exhibit ferroelectricity. Alternatively, the material that can show ferroelectricity may have a composite structure of an amorphous structure and a crystal structure.

Although the memory cell MC6 in FIG. 5G is described as an example of an FeRAM including the ferroelectric capacitor FEA, the memory cells MC that can be included in the layer OSC may be each a memory cell including an FTJ (Ferroelectric Tunnel Junction or Ferroelectric Transportation Junction) element and/or an FeFET (Ferroelectric FET) (not illustrated).

When the display apparatus has the above-described structure, in other words, when the peripheral circuit DRV is provided below the display portion DSP, the wiring run lengths between the display portion DSP and the peripheral circuit DRV can be shorter than those in the conventional display apparatus; thus, time taken for transmission of image data or the like can be shortened. In addition, since the wiring lengths can be shorter than those in the conventional display apparatus, the power consumption of the display apparatus can be low.

Furthermore, when the layer OSC is provided between the display portion DSP and the circuit portion SIC, an influence of heat generated in the circuit portion SIC on the display portion DSP can be reduced. In particular, when a display element included in the display portion DSP has low resistance to heat, the structure illustrated in FIG. 3A, FIG. 3B, FIG. 4, or the like can extend the lifetime of the display element included in the display portion DSP. When a cooling mechanism is provided below the circuit portion SIC, the influence of heat generated in the circuit portion SIC can be reduced (not illustrated). Examples of the cooling mechanism include a heat sink formed using a material with high thermal conductivity, a water-cooling heat sink using cooling water, and a fan.

Modification Example 2 of Display Apparatus and Display System

Although FIG. 4 illustrates an example in which the memory device MDV is provided in the layer OSC between the circuit portion SIC and the display portion DSP, the layer OSC may include a circuit, an apparatus, or the like other than the memory device. For example, some of the circuits included in the peripheral circuit DRV and/or the functional circuit MFNC may be formed in the layer OSC.

Figure 6:
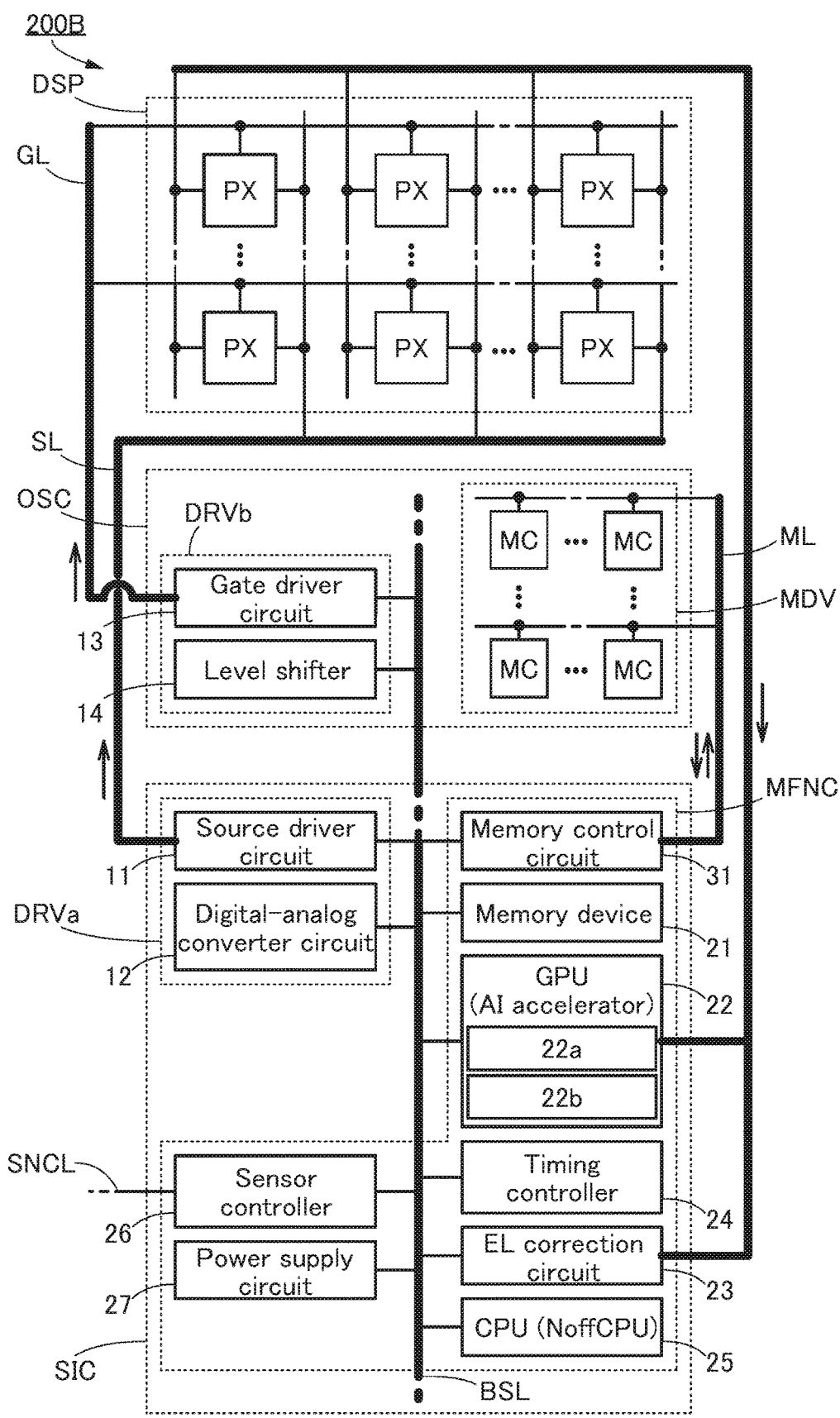
FIG. 6 is a block diagram illustrating a configuration example of a display system.

A display system 200B in FIG. 6 is an example in which some circuits in the peripheral circuit DRV of the display system 200A in FIG. 4 are formed in the layer OSC. Note that although there is a portion where the wiring SL and the wiring GL intersect with each other in FIG. 6, the wirings are not directly connected to each other.

The display system 200B in FIG. 6 is an example in which part of the peripheral circuit DRV of the display system 200A in FIG. 4 is formed as a circuit DRVa in the circuit portion SIC and the rest of the peripheral circuit DRV of the display system 200A in FIG. 4 is formed as a circuit DRVb in the layer OSC. Specifically, the display system 200B has a configuration in which the circuit DRVa includes the source driver circuit 11 and the digital-analog converter circuit 12 and the circuit DRVb includes the gate driver circuit 13 and the level shifter 14.

An OS transistor has higher tolerance to electricity than a Si transistor. Accordingly, when an OS transistor is used as a transistor formed in the layer OSC, a circuit (e.g., the gate driver circuit 13 or the level shifter 14) included in the layer OSC can have high tolerance to voltage. Thus, when the circuit is formed in the layer OSC, an electric load on the circuit can be reduced.

Modification Example 3 of Display Apparatus and Display System

Although the display system 200 illustrated in FIG. 1B has a structure in which the peripheral circuit DRV and the functional circuit MFNC are included in the circuit portion SIC, the display system of one embodiment of the present invention may have a structure in which the functional circuit MFNC is provided in the circuit portion SIC and the display portion DSP is driven by a circuit outside the display system 200.

Figure 7A:
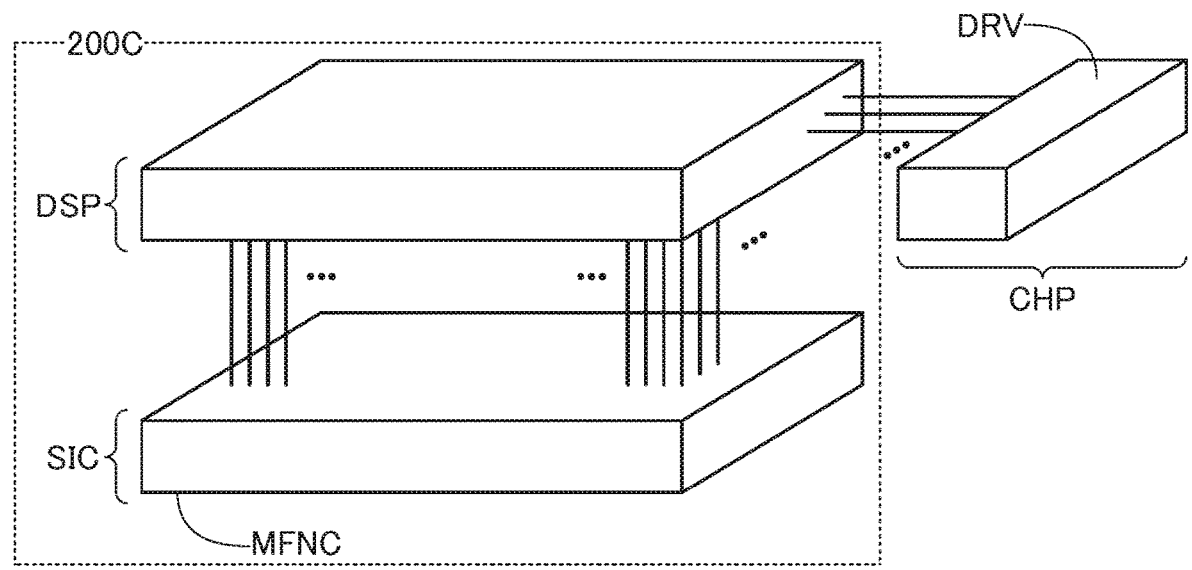
FIG. 7A and FIG. 7B are schematic cross-sectional views illustrating structure examples of a display system.

For example, the display system of one embodiment of the present invention can have a structure illustrated in FIG. 7A. A display system 200C includes the display portion DSP and the circuit portion SIC, and the circuit portion SIC includes the functional circuit MFNC. The display portion DSP is electrically connected to a circuit portion CHP, and the circuit portion CHP includes the peripheral circuit DRV. The circuit portion CHP can be, for example, an external driver IC.

Examples of methods for mounting the circuit portion CHP on the display system 200C include a COG (Chip On Glass) method and a COF (Chip On Film) method.

In the display system 200C, transistors included in the display portion DSP and the circuit portion SIC can be Si transistors, for example. Besides Si transistors, OS transistors may be used.

Figure 7B:
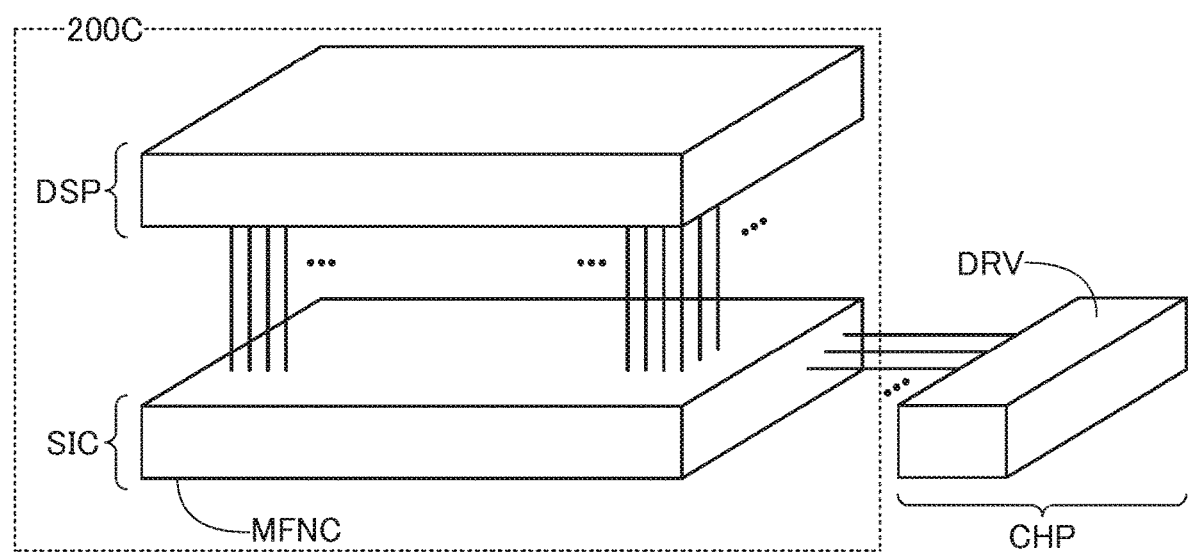

The display system 200C may have a structure in which the circuit portion CHP is electrically connected to the circuit portion SIC as illustrated in FIG. 7B, instead of a structure in which the circuit portion CHP is electrically connected to the display portion DSP.

Figure 8:
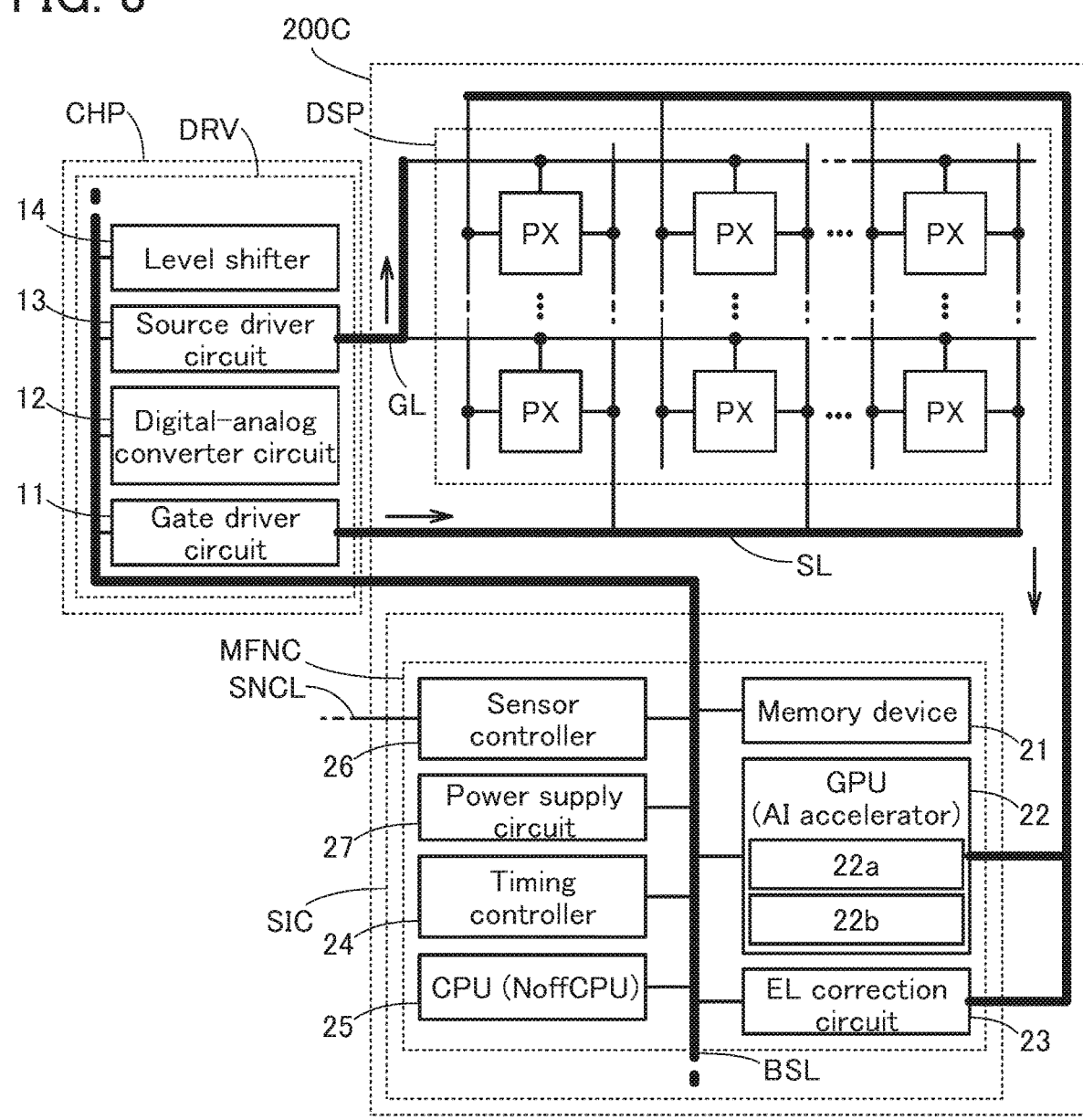
FIG. 8 is a block diagram illustrating a configuration example of a display system.

FIG. 8 illustrates a specific configuration example of the display system 200C illustrated in FIG. 7A or FIG. 7B. Note that in FIG. 8, the bus wiring BSL of the functional circuit MFNC included in the display system 200C and a bus wiring of the circuit portion CHP are electrically connected to each other.

As described above, in the display system 200 in FIG. 1B, the peripheral circuit DRV for driving the display portion DSP may be provided outside the display system 200 as a driver IC or the like instead of providing in the circuit portion SIC.

When the display apparatus or the display system has the structure described in this embodiment, in other words, when the peripheral circuit DRV and the functional circuit MFNC are provided below the display portion DSP, image data transmission time can be reduced, power consumption can be reduced, and the correction circuit, the GPU, and the like can be provided without an increase in circuit area. Accordingly, the display quality of the display portion DSP can be improved. Since the circuit area is not increased, a constraint of the size of a housing of an electronic device described in a later embodiment, for example, is less likely to be imposed.

In a conventional display apparatus (e.g., a display apparatus including a Si transistor), a pixel array and a peripheral circuit are provided on the same plane; however, when an OS transistor is used as a transistor in a display apparatus, a pixel circuit and a peripheral circuit can be miniaturized. Accordingly, the areas of the pixel circuit and a peripheral portion (referred to as a frame in some cases) of the pixel circuit can be reduced. For example, a conventional XR display apparatus (e.g., a display apparatus including a Si transistor) has a resolution of approximately 3000 ppi or lower; however, an XR display apparatus including an OS transistor can have a resolution of 5000 ppi or higher.

Furthermore, the luminance of a light-emitting device containing organic EL used in a pixel of a display apparatus is considered. In the case where a constant current source is formed using a Si transistor, realistically, a display apparatus with 3000 ppi can output a luminance of only 1000 $cd/m^2$ or lower because the Si transistor has a low withstand voltage. Meanwhile, in the case where a constant current source is formed using an OS transistor, a display apparatus with higher than or equal to 5000 ppi and lower than or equal to 7000 ppi, for example, can output a luminance of approximately 10000 $cd/m^2$ because the OS transistor has a high withstand voltage.

In the case where silicon is used for the semiconductor substrate of the circuit portion SIC in the display system 200 in FIG. 1B, for example, a system (an interface, a converter, a driver, a memory, a CPU, or a GPU) can be installed in the display system 200 with a technology node greater than or equal to 6 nm and less than or equal to 7 nm. Accordingly, the area of the circuit included in the display system 200 can be reduced.

The table below summarizes the details of a display system including a Si transistor or an OSLSI as described above. Note that an OSLSI in this specification and the like is an integrated circuit in which an OS transistor is formed over a Si transistor formed over a semiconductor substrate.

TABLE 1

| | Only Si | OSLSI (Si\CAAC-IGZO) | Note |
|---|---|---|---|
| High resolution | <3000 ppi in Si product | >5000 ppi Possible | A resolution of 5000 ppi is possible without subpixel thinning out because OSLSI can be miniaturized. |
| Large display/ Narrow frame | Difficult | Possible | A large display with no frame is possible because the shot size can be entirely used owing to Si\OS stacked-layer structure of OSLSI. |
| High luminance | Difficult | Possible | SiFET has a low withstand voltage for a constant current source (e.g., ≤1000 cd/m$^2$ with 3000 ppi). OSFET can form a constant current source with a high withstand voltage and enables high-luminance OLED emission (e.g., possibly 10000 cd/m$^2$ with 5000-7000 ppi). |
| Integration | Difficult | Possible | A system (interface, converter, driver, memory, CPU, or GPU) can be installed in Si substrate with a technology node of 6-7 nm. |

Note that this embodiment can be combined with any of the other embodiments described in this specification as appropriate.

Embodiment 2

In this embodiment, a structure of a display system including a high frequency (RF) circuit will be described.

Figure 9A:
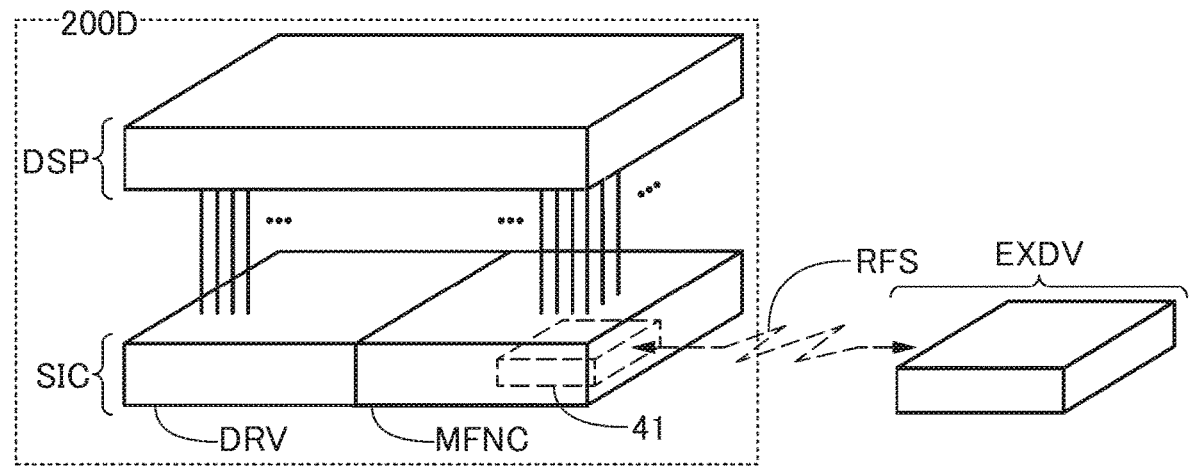
FIG. 9A and FIG. 9B are diagrams illustrating structure examples of a display system.

FIG. 9A is a diagram schematically illustrating the display system of one embodiment of the present invention. A display system 200D illustrated in FIG. 9A has a structure in which a high frequency circuit 41 is provided in the functional circuit MFNC included in the circuit portion SIC of the display system 200 in FIG. 1B. Note that FIG. 9A also illustrates a device EXDV that wirelessly communicates with the high frequency circuit 41.

Although the display system 200D and the device EXDV are separately described in embodiment, the display system of one embodiment of the present invention can include an external device that wirelessly communicates with the display system. In other words, the device EXDV may be included in the display system of one embodiment of the present invention.

The high frequency circuit 41 includes, for example, an antenna, a duplexer, a low noise amplifier, a power amplifier, a local oscillator, a downconversion mixer, an upconversion mixer, a band path filter, an analog-digital converter circuit, and the like.

In particular, when the high frequency circuit 41 includes a duplexer, an RF signal path for transmission and an RF signal path for reception can be electrically isolated from each other. For this reason, the antenna provided in the high frequency circuit 41 can be one antenna serving as both a transmission antenna and a reception antenna. Accordingly, the circuit area of the display system 200D can be further reduced.

Note that the high frequency circuit 41 in this embodiment has a function of converting an electrical signal generated in any one of circuits (e.g., a CPU, a GPU, and a memory device) included in a first layer into an RF signal and transmitting the signal to the outside of the display system 200D. The high frequency circuit 41 also has a function of converting an RF signal obtained from the outside into an electrical signal and transmitting the signal to any one of the circuits (e.g., the CPU, the GPU, and the memory device) included in the first layer.

Note that a variety of electronic devices can be used as the device EXDV, for example. In the case where the device EXDV is positioned outside a housing provided for the display system 200D, for example, the device EXDV can be an electronic device such as a speaker (including an earphone, a headphone, or the like), a portable information terminal such as a smartphone, a wearable information terminal, a tablet information terminal, a desktop information terminal, a server, or a device equipped with IoT (Internet of Things).

Figure 10:
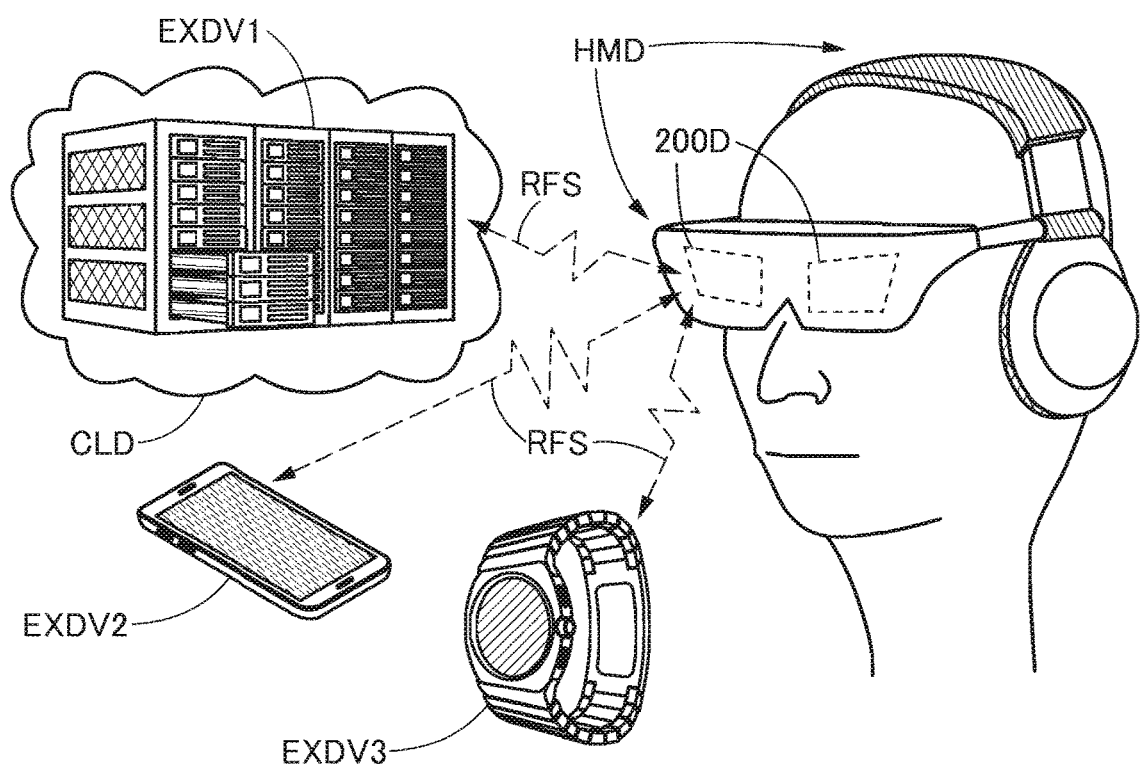
FIG. 10 is a diagram illustrating a structure example of a display system.

For example, as illustrated in FIG. 10, the display system 200D may be used as a display portion of an electronic device HMD, which is a head-mounted display, and the device EXDV may be used as a device EXDV1, which is a server on cloud computing CLD. Alternatively, the device EXDV may be a device EXDV2, which is a portable information terminal (e.g., a smartphone). Further alternatively, the device EXDV may be a device EXDV3, which is a wearable information terminal.

When the functional circuit MFNC of the display system 200D is provided with the high frequency circuit 41, wireless communication with an electronic device such as a server, a portable information terminal, or a wearable information terminal can be performed as illustrated in FIG. 10. Thus, image data transmitted from the device EXDV1, the device EXDV2, or the like can be received by the high frequency circuit 41 of the display system 200D in the electronic device HMD, and the image data can be displayed on the display portion DSP of the display system 200D.

Figure 11A:
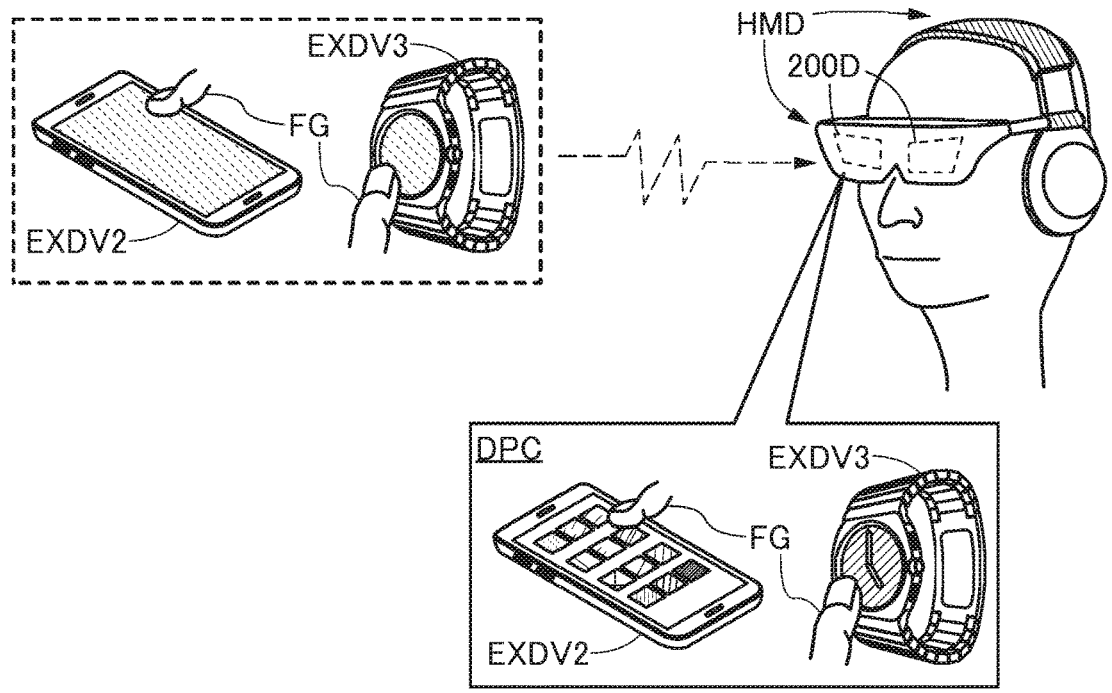
FIG. 11A and FIG. 11B are diagrams illustrating structure examples of a display system.

Information communicated between the display system 200D and the device EXDV is not limited to image data. For example, as illustrated in FIG. 11A, a user wearing the electronic device HMD (or may be a person not wearing the electronic device HMD) may use the device EXDV2 or the device EXDV3 as an input interface to transmit an RF signal for operating the display system 200D from the device EXDV2 or the device EXDV3 to the display system 200D by a finger FG. In that case, a display portion of the device EXDV2 or the device EXDV3 may be brought into a non-display state and an image that is supposed to be displayed on the device EXDV2 or the device EXDV3 may be displayed on the display portion DSP of the display system 200D in the electronic device HMD such that the image is overlaid on the display portion of the device EXDV2 or the device EXDV3 by AR. Specifically, as illustrated in FIG. 11A, the display portion of the device EXDV2 or the device EXDV3 that is actually operated by the finger FG may be in a non-display state and a display image DPC may be displayed on the display portion DSP of the display system 200D in the electronic device HMD such that an operation screen appears to be projected on the device EXDV2 or the device EXDV3, for example.

Figure 11B:
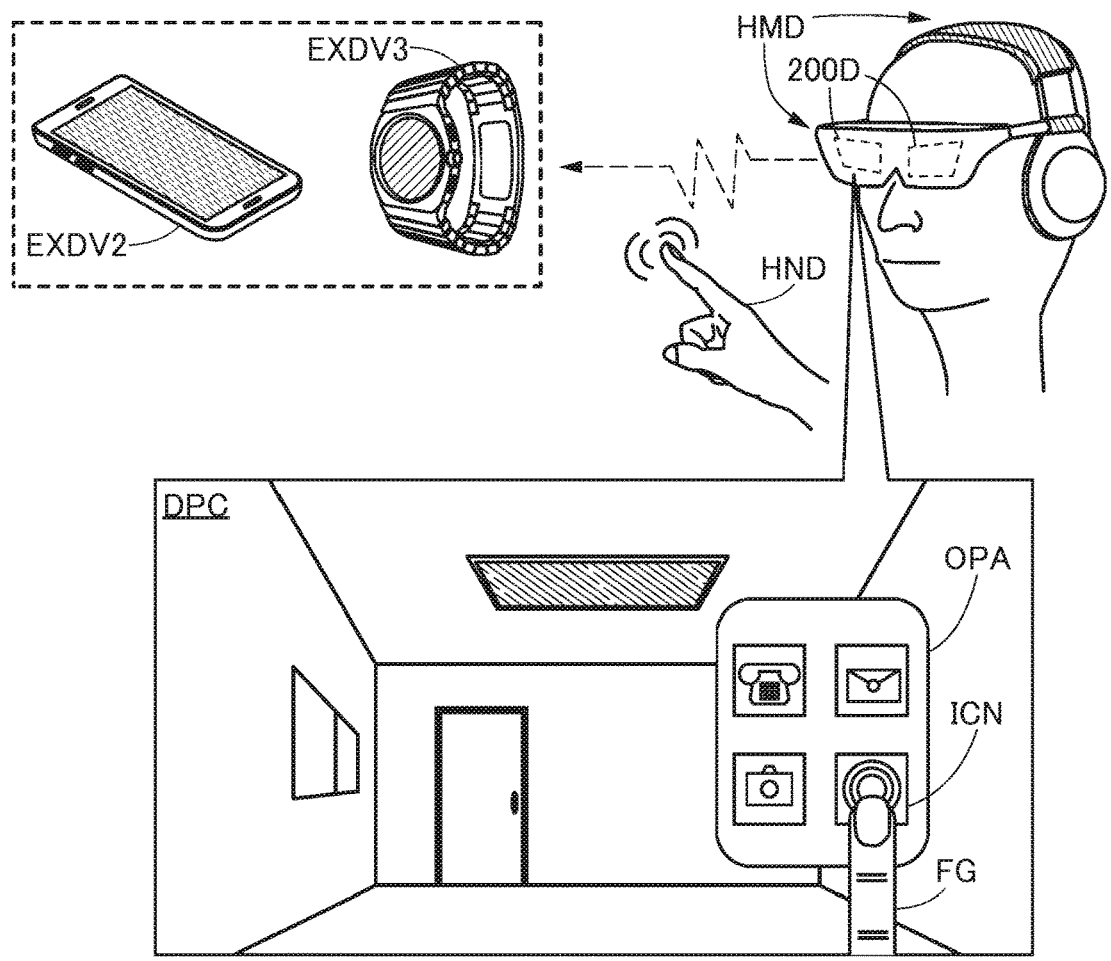

For another example, as illustrated in FIG. 11B, a user wearing the electronic device HMD may move his/her hand HND to transmit an RF signal for operating the device EXDV2 or the device EXDV3 from the electronic device HMD to the device EXDV2 or the device EXDV3. In that case, the electronic device HMD preferably includes an imaging device, an infrared sensor, or the like used for recognition of the motion of the hand HND. A sensor device used for motion recognition may be put on the hand HND (including the finger FG, a wrist, and the like) so that the electronic device HMD recognizes the motion of the hand HND by receiving sensing information from the sensor device. Accordingly, the user wearing the electronic device HMD can operate the device EXDV2 or the device EXDV3 even when the device EXDV2 or the device EXDV3 is away from the user. Specifically, as illustrated in FIG. 11B, the display image DPC in which an operation region OPA and an icon ICN in the operation region OPA are superimposed on the view of the outside world of the electronic device HMD can be displayed on the display portion DSP of the display system 200D in the electronic device HMD, for example. In that case, the device EXDV2 or the device EXDV3 can be controlled remotely by performing gesture operation of touching the icon ICN by the hand HND (the finger FG in FIG. 11B), for example.

In the case of FIG. 11A or FIG. 11B, an image displayed on the display portion DSP of the display system 200D in the electronic device HMD may be an image that is supposed to be displayed on the device EXDV2 or the device EXDV3 instead of the view of the outside world of the electronic device HMD. The image is preferably displayed with 4K2K, further preferably displayed with 8K4K, and still further preferably displayed with 16K8K.

The display system 200D and the device EXDV may be communicated with each other via a wireless repeater. Accordingly, the display system 200D can be communicated not only with an electronic device near the display system 200D but also with an electronic device away from the display system 200D. In this case, the fifth-generation (5G) communication standard is preferably used to transmit a large amount of data, to shorten the delay time, and to increase the communication speed. Note that 5G (the fifth-generation mobile communication system) uses communication frequencies of a 3.7 GHz band, a 4.5 GHz band, or a 28 GHz band, for example.

A 5G-compatible semiconductor device is fabricated using a semiconductor containing one kind of element such as silicon as its main component in many cases; thus, the high frequency circuit 41 included in the functional circuit MFNC can be formed over the semiconductor substrate (in particular, a semiconductor substrate containing silicon as a material) of the circuit portion SIC as in the display system 200D in FIG. 9A.

In the case where the device EXDV is provided not outside the housing provided for the display system 200D but in the same housing as the display system 200D, some of the circuits included in the functional circuit MFNC of the display system 200 in FIG. 1B may serve as the device EXDV, for example.

Figure 9B:
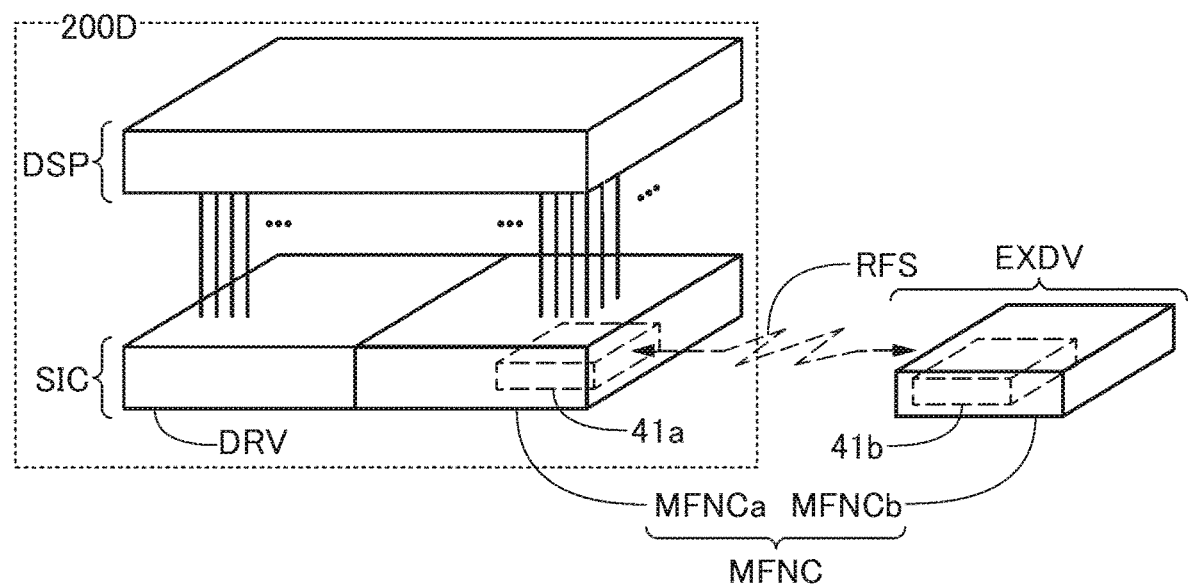

Specifically, as illustrated in FIG. 9B, some of the circuits in the functional circuit MFNC may be provided on the circuit portion SIC side as a functional circuit MFNCa, and the rest of the circuits in the functional circuit MFNC may be provided in the device EXDV as a functional circuit MFNCb. FIG. 9B illustrates an example in which a high frequency circuit 41a is provided in the functional circuit MFNCa, a high frequency circuit 41b is provided in the functional circuit MFNCb, and the high frequency circuit 41a and the high frequency circuit 41b wirelessly communicates with each other. Note that the functional circuit MFNCa and the functional circuit MFNCb are collectively illustrated as the functional circuit MFNC in FIG. 9B. That is, wireless communication is performed inside the functional circuit MFNC illustrated in FIG. 9B.

The structure of the display system 200D illustrated in FIG. 9B enables wireless communication inside the functional circuit MFNC. Accordingly, a wiring for transmitting and receiving an electrical signal does not need to be provided between the functional circuit MFNCa and the functional circuit MFNCb, leading to a reduction in the circuit area in the housing.

Figure 12:
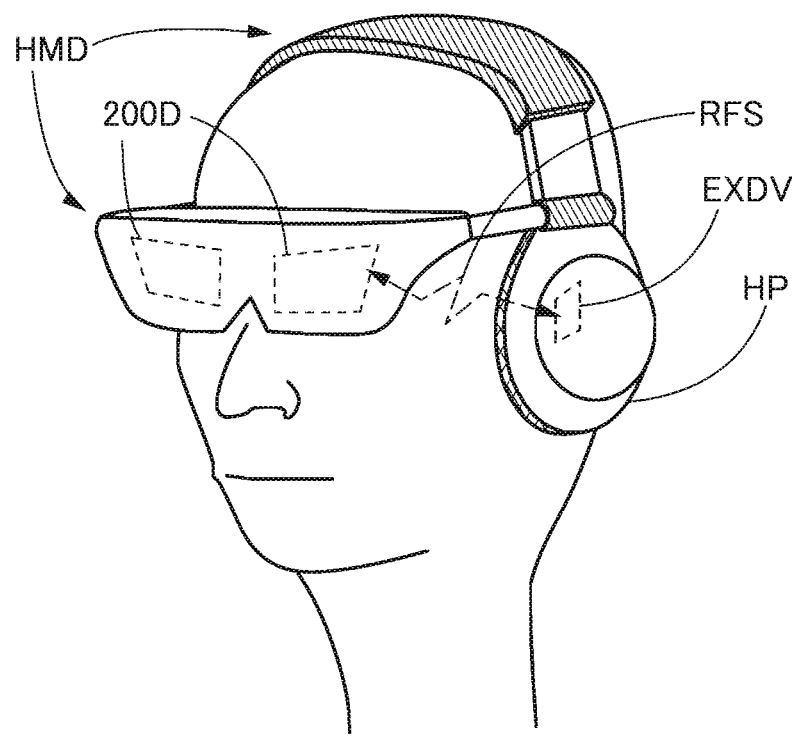
FIG. 12 is a diagram illustrating a structure example of a display system.

The structure of a head-mounted display and a headphone provided on the head-mounted display is given as an example in which the structure in FIG. 9B can be applied. Specifically, as illustrated in FIG. 12, the display system 200D is applied to a display portion of the electronic device HMD, which is a head-mounted display, and the device EXDV is applied to a headphone portion HP; when audio data is transmitted from the high frequency circuit 41a to the high frequency circuit 41b through wireless communication, the headphone including the device EXDV can reproduce the audio data along with an image displayed on the display portion.

Figure 13:
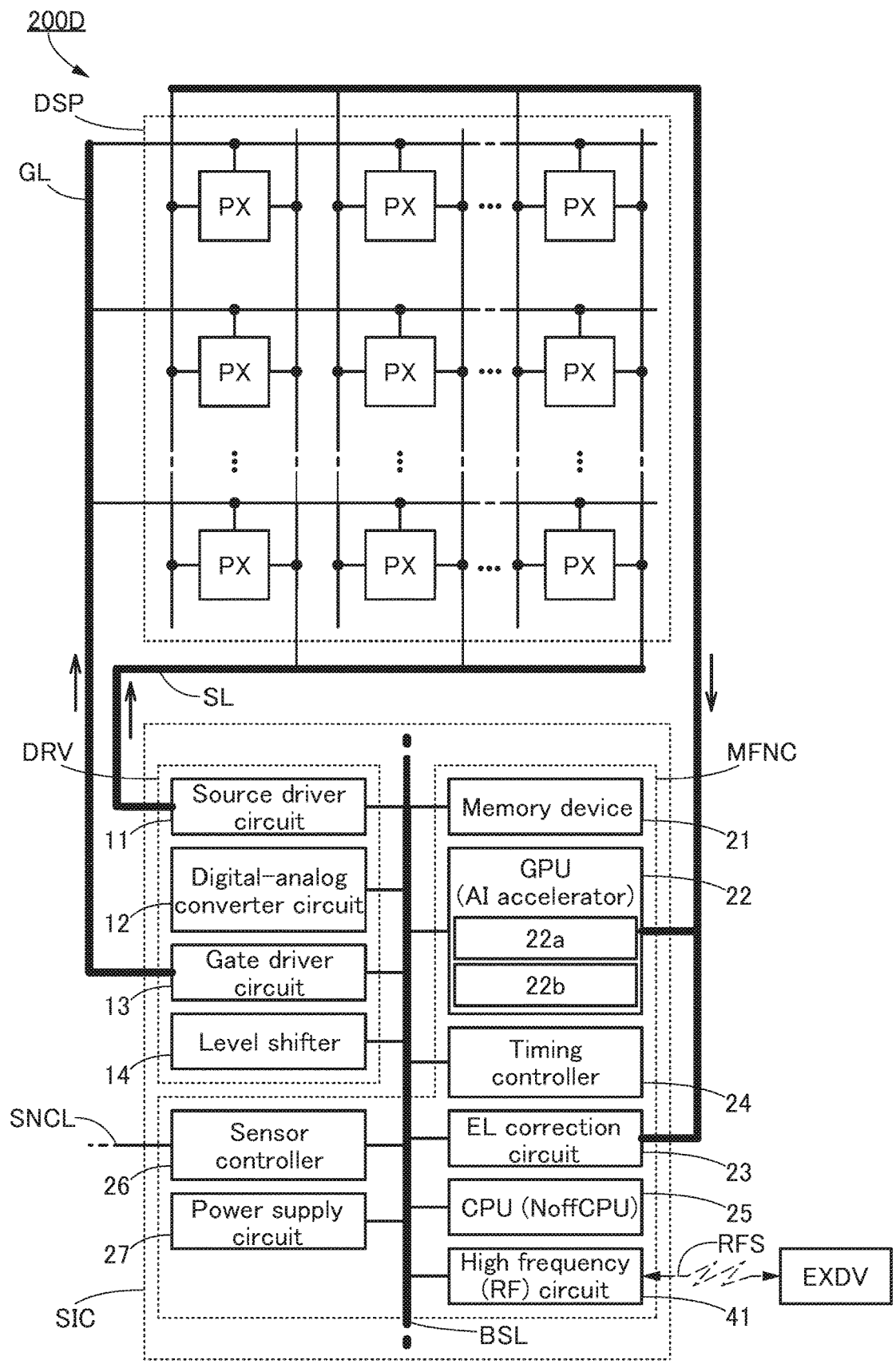
FIG. 13 is a block diagram illustrating a configuration example of a display system.

FIG. 13 illustrates a specific configuration example of the display system 200D illustrated in FIG. 9A or FIG. 9B. As illustrated in FIG. 13, the high frequency circuit 41 is electrically connected to the bus wiring BSL, in which case the high frequency circuit 41 can convert an RF signal RFS into an electrical signal and transmit the signal to a predetermined circuit such as the CPU 25, or can convert an electrical signal from predetermined circuit such as the CPU 25 into the RF signal RFS and transmit the signal to the device EXDV.

Although the structures in FIG. 9A, FIG. 9B, and FIG. 13 described in this embodiment are each described as an example in which the high frequency circuit 41 is provided in the functional circuit MFNC of the circuit portion SIC in the display system 200 in FIG. 1, one embodiment of the present invention is not limited thereto. For example, one embodiment of the present invention may have a structure in which the high frequency circuit 41 is provided in the functional circuit MFNC of the circuit portion SIC in the display system 200A in FIG. 3 (not illustrated).

Note that this embodiment can be combined with any of the other embodiments described in this specification as appropriate.

Embodiment 3

In this embodiment, a structure of the display apparatus or the display system described in the above embodiment will be described.

Figure 14A:
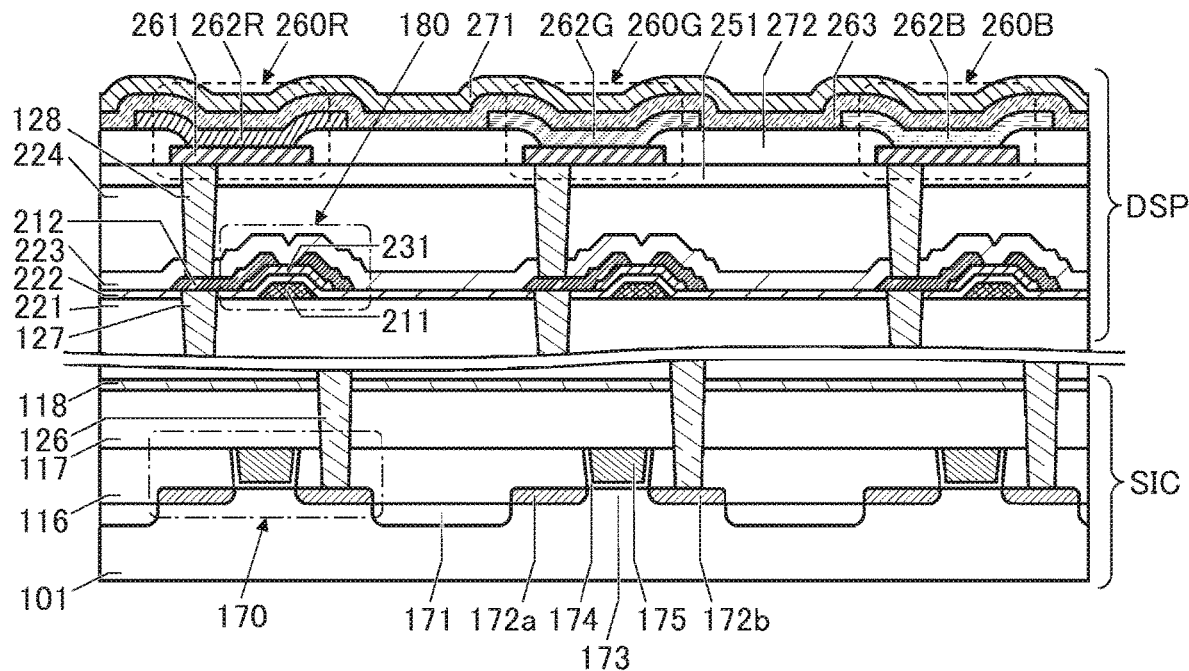
FIG. 14A and FIG. 14B are schematic cross-sectional views illustrating structure examples of display apparatuses or display systems.

FIG. 14A is a cross-sectional view illustrating a structure example of the display apparatus illustrated in FIG. 1A or the display system illustrated in FIG. 1B and FIG. 2. The display system illustrated in FIG. 14A has a structure in which a transistor 170 is included in the circuit portion SIC, and a transistor 180, a light-emitting device 260R, a light-emitting device 260G, and a light-emitting device 260B are included in the display portion DSP. In this specification, the light-emitting device 260R, the light-emitting device 260G, and the light-emitting device 260B are collectively referred to as a light-emitting device 260. FIG. 14A illustrates cross-sectional views of the transistor 170 and the transistor 180 in channel length directions.

The transistor 170 is provided on a substrate 101 and includes an element isolation layer 171, a conductor 175, an insulator 174, a semiconductor region 173 that is part of the substrate 101, and a low-resistance region 172a and a low-resistance region 172b functioning as a source region and a drain region. Note that the transistor 170 can be used in the source driver circuit 11 or the gate driver circuit 13 included in the peripheral circuit DRV described in the above embodiment, for example. The transistor 170 can be used in the memory device 21, the GPU 22, or the like included in the functional circuit MFNC, for example.

A semiconductor substrate (e.g., a single crystal substrate or a silicon substrate) is preferably used as the substrate 101.

In the transistor 170, the top surface and a side surface in the channel width direction of the semiconductor region 173 are covered with the conductor 175 with the insulator 174 therebetween, for example. Such a Fin-type transistor 170 can have an increased effective channel width, and thus the transistor 170 can have improved on-state characteristics. In addition, since contribution of an electric field of a gate electrode can be increased, the off-state characteristics of the transistor 170 can be improved.

Note that the transistor 170 may be either a p-channel transistor or an n-channel transistor.

A region of the semiconductor region 173 where a channel is formed, a region in the vicinity thereof, the low-resistance region 172a and the low-resistance region 172b functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure using silicon whose effective mass is controlled by applying stress to the crystal lattice and changing the lattice spacing may be employed. Alternatively, the transistor 170 may be an HEMT (High Electron Mobility Transistor) with GaAs and GaAlAs, or the like.

For the conductor 175 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 171 is provided to separate a plurality of transistors on the substrate 101 from each other. The element isolation layer 171 can be formed by, for example, a LOCOS (Local Oxidation of Silicon) method, an STI (Shallow Trench Isolation) method, a mesa isolation method, or the like.

Note that the transistor 170 illustrated in FIG. 14A is an example and the structure is not limited thereto; an appropriate transistor is used in accordance with a circuit structure, a driving method, or the like. For example, the transistor 170 may have a planar structure instead of a FIN-type structure.

In the transistor 170 illustrated in FIG. 14A, an insulator 116, an insulator 117, and an insulator 118 are stacked in this order.

For the insulator 116 and the insulator 117, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 117 may have a function of a planarization film for eliminating a level difference caused by the transistor 170 or the like covered with the insulator 116 and the insulator 117. For example, the top surface of the insulator 117 may be planarized by planarization treatment using a chemical mechanical polishing (CMP) method or the like to improve planarity.

As the insulator 118, it is preferable to use a film having a barrier property that prevents diffusion of hydrogen, impurities, and the like from the substrate 101, the transistor 170, or the like into a region above the insulator 118.

For the film having a barrier property against hydrogen, silicon nitride deposited by a CVD method can be used, for example. Diffusion of hydrogen into a circuit element provided above the insulator 118 degrades the characteristics of the circuit element in some cases. Thus, a film that inhibits hydrogen diffusion is preferably used between the circuit element and the transistor 170. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 118 that is converted into hydrogen atoms per area of the insulator 118 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 118 is preferably lower than that of the insulator 117. For example, the dielectric constant of the insulator 118 is preferably lower than 4, further preferably lower than 3. The dielectric constant of the insulator 118 is, for example, preferably 0.7 times or less, further preferably 0.6 times or less the dielectric constant of the insulator 117. When a material with a low permittivity is used for the interlayer film, the parasitic capacitance generated between wirings can be reduced.

In addition, a conductor 126 and the like that are connected to circuit elements (e.g., the transistor 180, the light-emitting device 260R to the light-emitting device 260B, and the like included in the display portion DSP) provided above the insulator 118 are embedded in the insulator 116, the insulator 117, and the insulator 118. Note that the conductor 126 functions as a plug or a wiring. A plurality of conductors functioning as a plug or a wiring are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material of each of plugs and wirings (e.g., the conductor 126, and a conductor 127 and a conductor 128 described later), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

Note that a wiring layer may be provided above the insulator 118 (not illustrated).

In FIG. 14A, an insulator 221 is stacked above the insulator 118. The insulator 221 functions as a base film of the transistor 180.

A conductor 211 functioning as a gate electrode or a wiring of the transistor 180 is formed over the insulator 221.

An insulator 222 functioning as a gate insulating film of the transistor 180 is formed over the insulator 221 and the conductor 211.

The conductor 127 and the like that are connected to the transistor 180, the circuit elements included in the circuit portion SIC, and the like are embedded in the insulator 221 and the insulator 222. Note that the conductor 127 functions as a plug or a wiring.

A semiconductor 231 is formed over the insulator 222. In FIG. 14A, the semiconductor 231 is formed so as to include a region overlapping with the conductor 211.

For the semiconductor 231, a metal oxide which will be described in Embodiment 4 can be used, for example. For the semiconductor 231, a semiconductor material such as Si or Ge can be used, for example. For the semiconductor 231, a compound semiconductor such as ZnSe, CdS, GaAs, InP, GaN, or SiGe can be used, for example. For the semiconductor 231, a carbon nanotube or an organic semiconductor can be used, for example.

Conductors 212 are formed over the insulator 222, the conductor 127, and the semiconductor 231. Note that the conductors 212 is formed such that the semiconductor 231 is positioned between a pair of the conductors 212. One of the pair of conductors 212 functions as one of a source and a drain of the transistor 180, and the other of the pair of conductors 212 functions as the other of the source and the drain of the transistor 180. In FIG. 14A, the one of the pair of conductors 212 is formed so as to be electrically connected to the conductor 127.

Although FIG. 14A illustrates an example in which the conductor 127 is electrically connected to the one of the source and the drain of the transistor 180, the conductor 127 may be electrically connected to the other of the source and the drain of the transistor 180 or may be electrically connected to the gate of the transistor 180.

An insulator 223 and an insulator 224 are formed in this order over the insulator 222, the conductor 212, and the semiconductor 231.

Next, the light-emitting device 260R, the light-emitting device 260G, and the light-emitting device 260B that can be provided over the insulator 224 are described. Note that the light-emitting devices preferably emit light of different colors. In this embodiment, for example, the light-emitting device 260R exhibits red, the light-emitting device 260G exhibits green, and the light-emitting device 260B exhibits blue, and light-emitting regions of the light-emitting devices are denoted by R, G, and B to easily differentiate the light-emitting devices.

An insulator 251 is formed over the insulator 224.

The conductor 128 and the like that are connected to the transistor 180, the circuit elements included in the circuit portion SIC, and the like are embedded in the insulator 224 and the insulator 251. Note that the conductor 128 functions as a plug or a wiring.

Pixel electrodes 261 of the light-emitting device 260R, the light-emitting device 260G, and the light-emitting device 260B are formed over the insulator 251 and the conductor 128.

An insulator 272 is provided to cover end portions of the pixel electrodes 261. An end portion of the insulator 272 is preferably tapered.

An EL layer 262R, an EL layer 262G, and an EL layer 262B are formed on the top surfaces of the pixel electrodes 261 and part of a surface of the insulator 272. End portions of the EL layer 262R, the EL layer 262G, and the EL layer 262B are preferably positioned over the insulator 272 at the time of forming the EL layers.

Note that in FIG. 14A, the EL layer 262R emitting red (R) light, the EL layer 262G emitting green (G) light, and the EL layer 262B emitting blue (B) light are provided independently over the plurality of pixel electrodes 261. Such a structure in which light-emitting layers of different colors are formed over the plurality of pixel electrodes 261 is referred to an SBS (Side By Side) structure in this specification and the like.

Although the display apparatus (display system) in FIG. 14A has an SBS structure, the display apparatus (the display system) may have a structure in which a light-emitting layer that emits white light is formed to be extended over the plurality of pixel electrodes 261 and red (R), green (G), and blue (B) coloring layers (e.g., color filters) are provided over the plurality of pixel electrodes 261. In particular, when the white light-emitting layer is formed to have a later-described tandem structure, a white light-emitting device with high luminance and long lifetime can be obtained.

The EL layer 262R, the EL layer 262G, and the EL layer 262B may each include one or more of an electron-injection layer, an electron-transport layer, a hole-injection layer, and a hole-transport layer in addition to a layer containing a light-emitting organic compound (light-emitting layer).

Figure 15A:
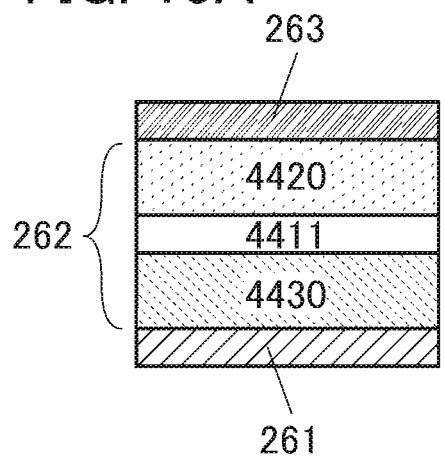
FIG. 15A to FIG. 15C are diagrams illustrating structure examples of light-emitting devices.

For example, each of the EL layer 262R, the EL layer 262G, and the EL layer 262B can be formed of a plurality of layers such as a layer 4420, a light-emitting layer 4411, and a layer 4430, as illustrated in FIG. 15A. The layer 4420 can include, for example, a layer containing a substance with a high electron-injection property (electron-injection layer) and a layer containing a substance with a high electron-transport property (electron-transport layer). The light-emitting layer 4411 contains a light-emitting compound, for example. The layer 4430 can include, for example, a layer containing a substance with a high hole-injection property (hole-injection layer) and a layer containing a substance with a high hole-transport property (hole-transport layer).

The structure including the layer 4420, the light-emitting layer 4411, and the layer 4430, which is provided between a pair of electrodes, can function as a single light-emitting unit, and the structure in FIG. 15A is referred to as a single structure in this specification and the like.

Figure 15B:
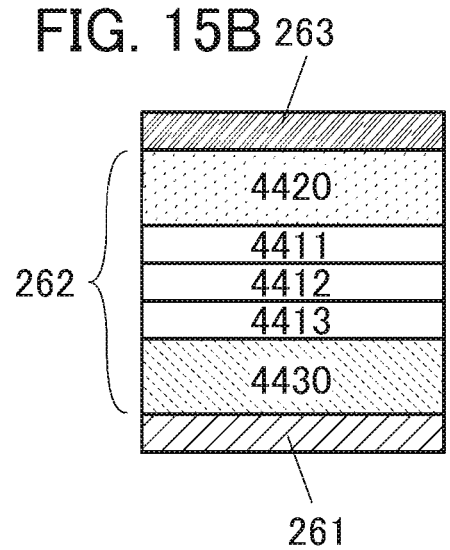

Note that the structure in which a plurality of light-emitting layers (the light-emitting layer 4411, a light-emitting layer 4412, and a light-emitting layer 4413) are provided between the layer 4420 and the layer 4430 as illustrated in FIG. 15B is a variation of the single structure.

Figure 15C:
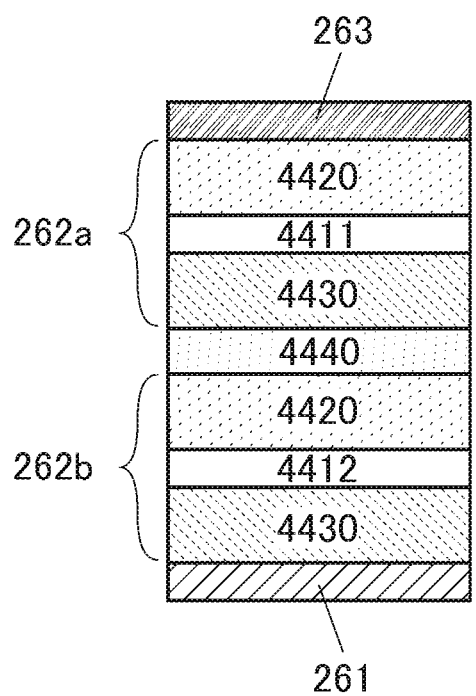

The structure in which a plurality of light-emitting units (an EL layer 262a and an EL layer 262b) are connected in series with an intermediate layer (charge-generation layer) 4440 therebetween as illustrated in FIG. 15C is referred to as a tandem structure in this specification. In this specification and the like, the structure illustrated in FIG. 15C is referred to as a tandem structure; however, without being limited to this, a tandem structure may be referred to as a stack structure, for example. The tandem structure enables a light-emitting device capable of high luminance light emission.

The emission color of the light-emitting device 260 can be red, green, blue, cyan, magenta, yellow, white, or the like depending on the material that constitutes the EL layer 262. Furthermore, the color purity can be further increased when the light-emitting device 260 has a microcavity structure.

The light-emitting device that emits white light preferably contains two or more kinds of light-emitting substances in the light-emitting layer. To obtain white light emission, two or more kinds of light-emitting substances are selected such that their emission colors are complementary.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

As illustrated in FIG. 14A, there is a gap between the EL layers of two light-emitting devices of different colors. In this manner, the EL layer 262R, the EL layer 262G, and the EL layer 262B are preferably provided so as not to be in contact with one another. This suitably prevents unintentional light emission (also referred to as crosstalk) from being caused by a current flowing through two adjacent EL layers. As a result, the contrast can be increased to achieve a display apparatus with high display quality.

The EL layer 262R, the EL layer 262G, and the EL layer 262B can be formed separately by a vacuum evaporation method or the like using a shadow mask such as a metal mask. Alternatively, these layers may be formed separately by a photolithography method. The use of the photolithography method achieves a display apparatus with high resolution, which is difficult to obtain in the case of using a metal mask.

A common electrode 263 is provided over the insulator 272, the EL layer 262R, the EL layer 262G, and the EL layer 262G. The common electrode 263 is provided as a continuous layer common to the light-emitting devices.

In this case, the light-emitting device 260R, the light-emitting device 260G, and the light-emitting device 260B have structures in which the EL layer 262R, the EL layer 262G, and the EL layer 262B are provided between the pixel electrodes 261 and the common electrode 263. The EL layer 262R contains at least a light-emitting organic compound that emits light with intensity in a red wavelength range. The EL layer 262G included in the light-emitting device 260G contains at least a light-emitting organic compound that emits light with intensity in a green wavelength range. The EL layer 262B included in the light-emitting device 260B contains at least a light-emitting organic compound that emits light with intensity in a blue wavelength range.

As illustrated in FIG. 14A, the pixel electrodes 261 are provided for their respective light-emitting devices. Conversely, when a reflective conductor material is selected for the pixel electrodes 261 and a light-transmitting conductor material is selected for the common electrode 263, for example, a top-emission display apparatus can be obtained.

A protective layer 271 is provided over the common electrode 263 so as to over the light-emitting device 260R, the light-emitting device 260G, and the light-emitting device 260B. The protective layer 271 has a function of preventing diffusion of impurities such as water into the light-emitting devices from above.

The protective layer 271 can have, for example, a single-layer structure or a stacked-layer structure at least including an inorganic insulating film. Examples of the inorganic insulating film include oxide films and nitride films such as a silicon oxide film, a silicon oxynitride film, a silicon nitride oxide film, a silicon nitride film, an aluminum oxide film, an aluminum oxynitride film, and a hafnium oxide film. A semiconductor material such as an indium gallium oxide or an indium gallium zinc oxide may be used for the protective layer 271. Note that the protective layer 271 may be formed by an ALD method, a CVD method, or a sputtering method. Although a structure in which the protective layer 271 includes an inorganic insulating film is described as an example, one embodiment of the present invention is not limited thereto. For example, the protective layer 271 may have a stacked-layer structure of an inorganic insulating film and an organic insulating film.

The light-emitting device 260R, the light-emitting device 260G, and the light-emitting device 260B described above can be arranged in a matrix, for example. Note that the arrangement method of the light-emitting devices is not limited thereto; another arrangement method such as a delta arrangement, a zigzag arrangement, or a PenTile arrangement may also be used.

As each of the light-emitting device 260R, the light-emitting device 260G, and the light-emitting device 260B, an EL element such as an OLED (Organic Light Emitting Diode) or a QLED (Quantum-dot Light Emitting Diode) is preferably used. Examples of a light-emitting substance contained in the EL element include a substance exhibiting fluorescence (a fluorescent material), a substance exhibiting phosphorescence (a phosphorescent material), an inorganic compound (such as a quantum dot material), and a substance exhibiting thermally activated delayed fluorescence (a thermally activated delayed fluorescence (TADF) material).

The structure of the display apparatus or the display system of one embodiment of the present invention is not limited to that in FIG. 14A. Although a display apparatus or a display system including light-emitting devices of three colors is described with reference to FIG. 14A, the display apparatus or the display system of one embodiment of the present invention may be a display apparatus or a display system including a white light-emitting device and coloring layers of respective colors, for example. In that case, the white light-emitting device may include the light-emitting layer with a single structure illustrated in FIG. 15A or FIG. 15B, or include the light-emitting layer with a tandem structure illustrated in FIG. 15C, for example.

Figure 14B:
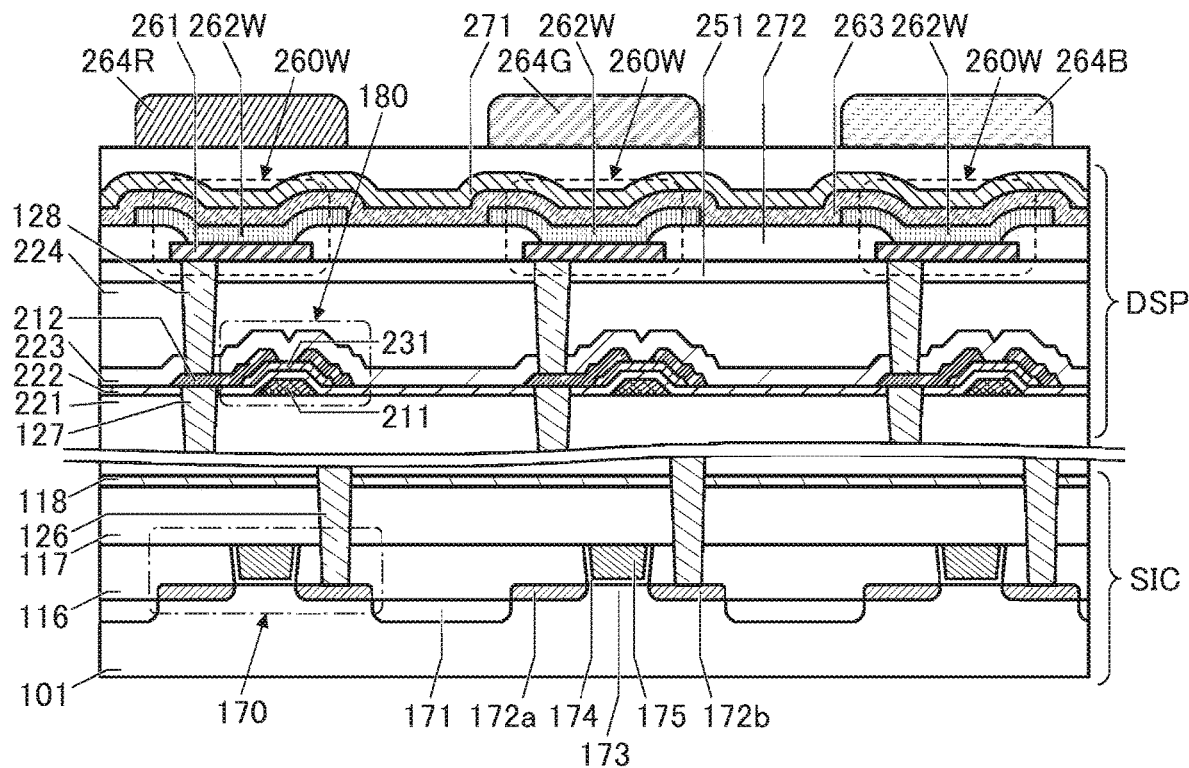

In FIG. 14B, a light-emitting device 260W that emits white light is included. The light-emitting device 260W includes an EL layer 262W emitting white light between the pixel electrode and the common electrode 263.

The EL layer 262W can have, for example, a structure in which two or more light-emitting layers that are selected so as to emit light of complementary colors are stacked. It is also possible to use a stacked EL layer in which a charge-generation layer is provided between light-emitting layers.

FIG. 14B illustrates three light-emitting devices 260W side by side. A coloring layer 264R is provided above the light-emitting device 260W on the left. The coloring layer 264R functions as a band path filter transmitting red light. Similarly, a coloring layer 264G transmitting green light is provided above the light-emitting device 260W in the middle, and a coloring layer 264B transmitting blue light is provided above the light-emitting device 260W on the right. Thus, the display apparatus can display an image with colors.

Here, the EL layer 262W and the common electrode 263 are each separated between adjacent two light-emitting devices 260W. This favorably prevents unintentional light emission from being caused by current flowing through the EL layers 262W of adjacent two light-emitting devices 260W. Particularly when the EL layer 262W is a stacked EL element in which a charge-generation layer is provided between two light-emitting layers, crosstalk is more significant as the resolution increases, i.e., as the distance between adjacent pixels decreases, leading to lower contrast. Thus, the above structure can achieve a display apparatus having both high resolution and high contrast.

The EL layer 262W and the common electrode 263 are preferably separated by a photolithography method. This can reduce the distance between light-emitting devices, achieving a display apparatus with a higher aperture ratio than that formed using a shadow mask such as a metal mask, for example.

Figure 16:
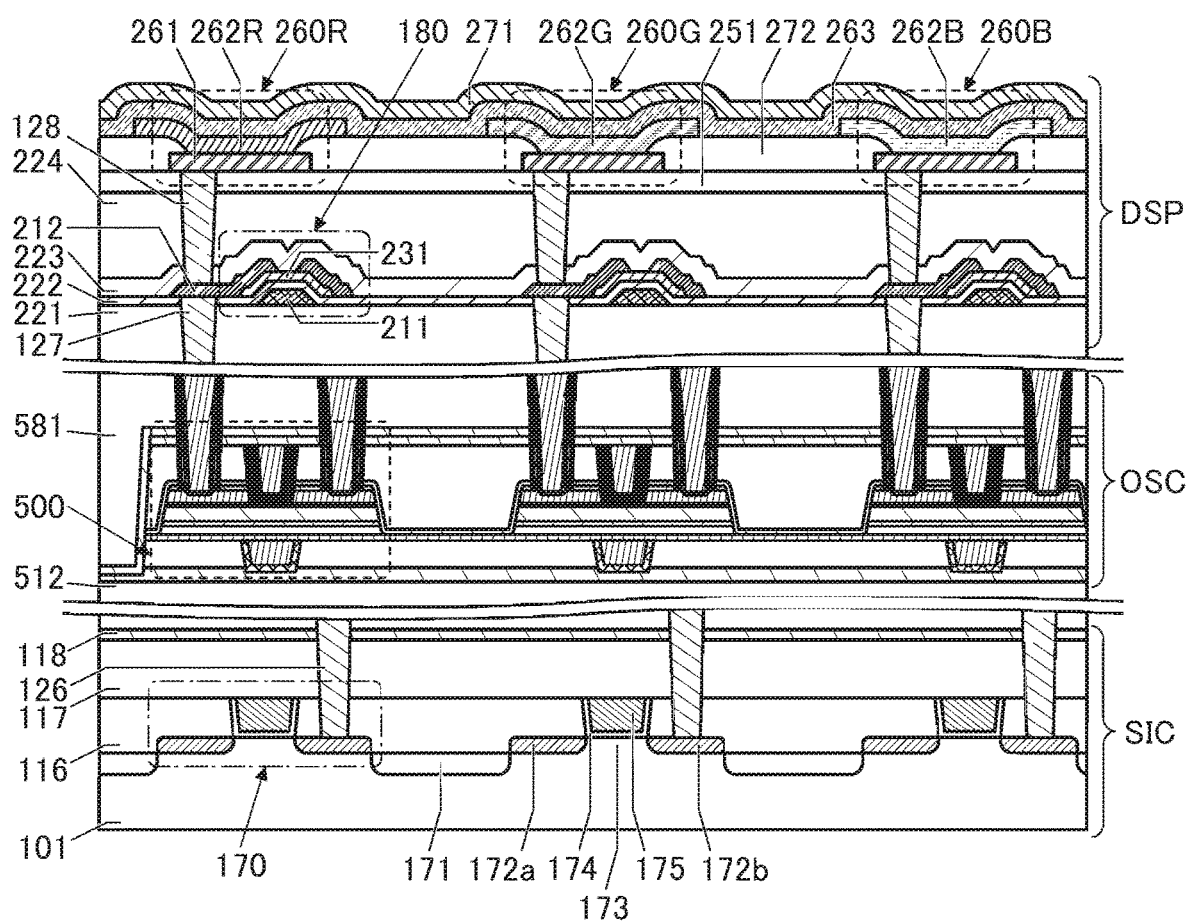
FIG. 16 is a schematic cross-sectional view illustrating a structure example of a display apparatus or a display system.

FIG. 16 is a cross-sectional view illustrating a structure example of the display apparatus illustrated in FIG. 3A or the display system illustrated in FIG. 4 and FIG. 6. The display system illustrated in FIG. 16 has a structure in which the transistor 170 is included in the circuit portion SIC, a transistor 500 is included in the layer OSC, and the transistor 180, the light-emitting device 260R, the light-emitting device 260G, and the light-emitting device 260B are included in the display portion DSP. FIG. 16 illustrates cross-sectional views of the transistor 170, the transistor 180, and the transistor 500 in channel length directions.

Since the description of FIG. 14A can be referred to for the circuit portion SIC and the display portion DSP, the transistor 500 and its peripheral components included in the layer OSC will be described below.

An insulator 512 is formed above the insulator 118 in the circuit portion SIC. A substance having a barrier property against oxygen or hydrogen is preferably used for the insulator 512.

For the insulator 512, a material similar to that for the insulator 116 can be used, for example.

Figure 17A:
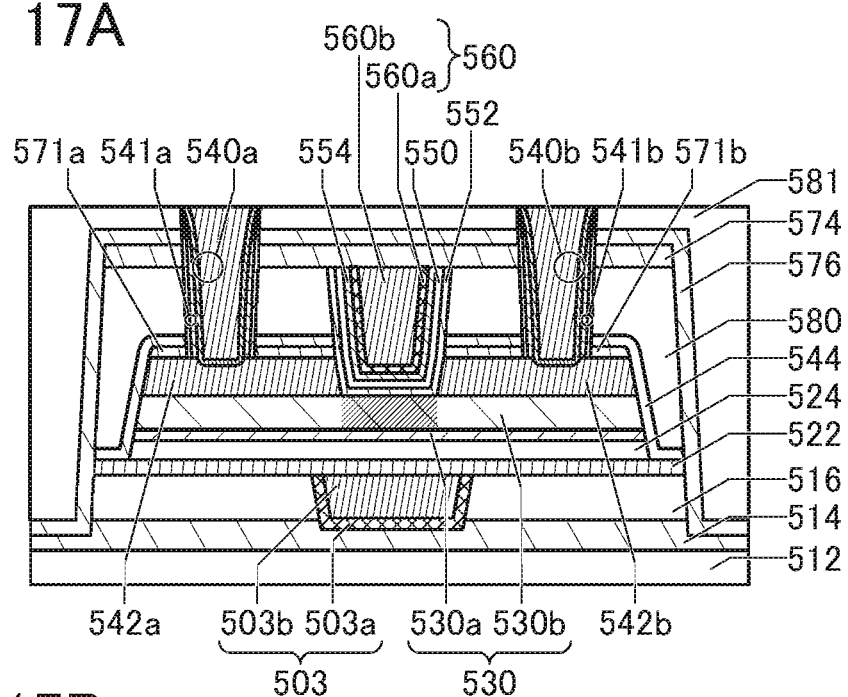
FIG. 17A and FIG. 17B are schematic cross-sectional views illustrating a structure example of a transistor.
Figure 17B:
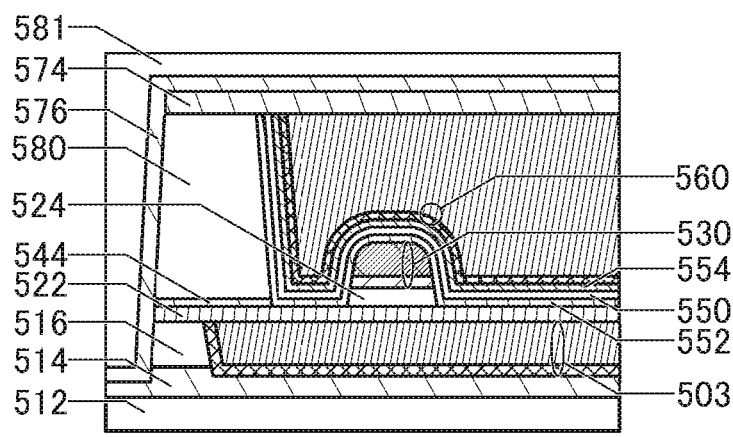

As illustrated in FIG. 17A and FIG. 17B, an insulator 514 and an insulator 516 are formed over the insulator 512.

As the insulator 514, it is preferable to use a film having a barrier property that prevents diffusion of hydrogen or impurities from the substrate 101, a region where the transistor 170 is provided, or the like into a region where the transistor 500 is provided. Thus, silicon nitride deposited by a CVD method can be used for the insulator 514, for example.

For the insulator 516, a material similar to that for the insulator 116 can be used, for example.

The transistor 500 is provided above the insulator 516.

As illustrated in FIG. 17A and FIG. 17B, the transistor 500 includes the insulator 516 over the insulator 514, the conductor 503 (a conductor 503a and a conductor 503b) provided to be embedded in the insulator 514 or the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) that is over the insulator 554 and overlaps with part of the oxide 530b, and an insulator 544 provided over the insulator 522, the insulator 524, the oxide 530a, the oxide 530b, the conductor 542 (the conductor 542a and the conductor 542b), and the insulator 571 (the insulator 571a and insulator 571b). Here, as illustrated in FIG. 17A and FIG. 17B, the insulator 552 is in contact with the top surface of the insulator 522, the side surface of the insulator 524, the side surface of the oxide 530a, the side surface and the top surface of the oxide 530b, the side surface of the conductor 542, the side surface of the insulator 571, the side surface of the insulator 544, the side surface of an insulator 580, and the bottom surface of the insulator 550. The top surface of the conductor 560 is placed to be substantially level with the upper portion of the insulator 554, the upper portion of the insulator 550, the upper portion of the insulator 552, and the top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening reaching the oxide 530b is provided in the insulator 580 and the insulator 544. The insulator 552, the insulator 550, the insulator 554, and the conductor 560 are provided in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with the side surface of the conductor 560 and a region in contact with the bottom surface of the conductor 560.

The oxide 530 preferably includes the oxide 530a provided over the insulator 524 and the oxide 530b provided over the oxide 530a. Including the oxide 530a under the oxide 530b makes it possible to inhibit diffusion of impurities into the oxide 530b from components formed below the oxide 530a.

Although a structure in which two layers, the oxide 530a and the oxide 530b, are stacked as the oxide 530 in the transistor 500 is described, the present invention is not limited thereto. For example, the transistor 500 can include a single-layer structure of the oxide 530b or a stacked-layer structure of three or more layers. Alternatively, the oxide 530a and the oxide 530b can each have a stacked-layer structure.

The conductor 560 functions as a first gate (also referred to as a top gate) electrode, and the conductor 503 functions as a second gate (also referred to as a back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542*a* functions as one of a source and a drain, and the conductor 542*b* functions as the other of the source and the drain. At least part of a region of the oxide 530 that overlaps with the conductor 560 functions as a channel formation region.

Figure 18A:
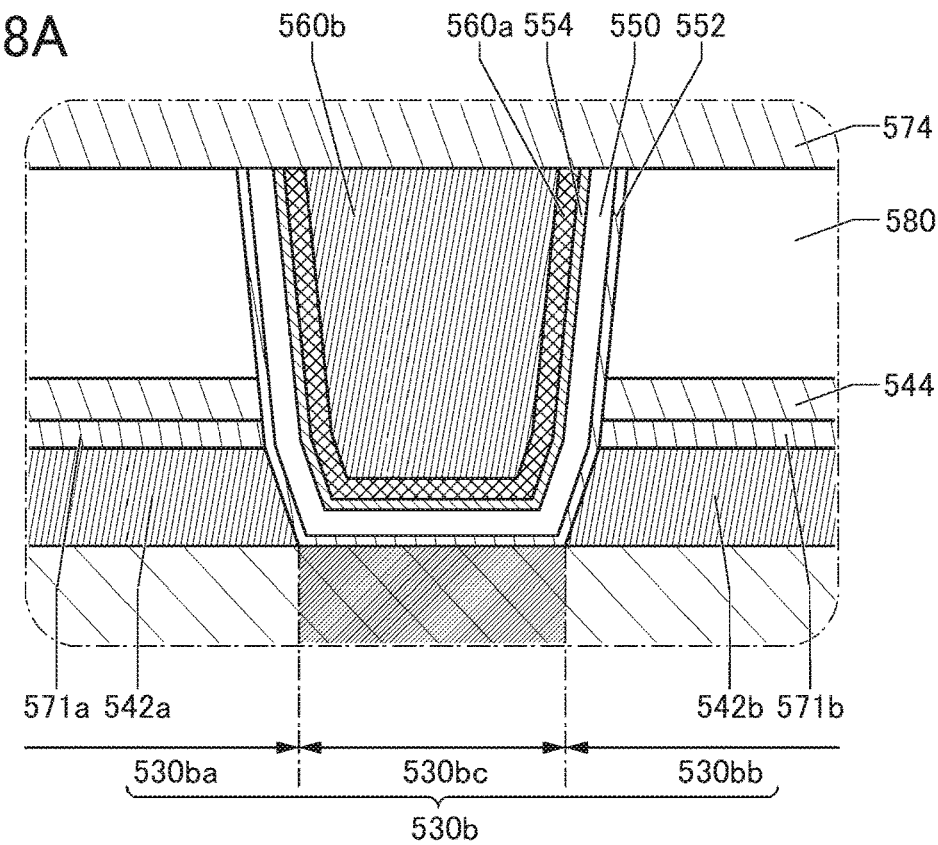
FIG. 18A and FIG. 18B are schematic cross-sectional views illustrating structure examples of transistors.

Here, FIG. 18A is an enlarged view of the vicinity of the channel formation region in FIG. 17A. Supply of oxygen to the oxide 530*b* forms the channel formation region in a region between the conductor 542*a* and the conductor 542*b*. As illustrated in FIG. 18A, the oxide 530*b* includes a region 530*bc* functioning as the channel formation region of the transistor 500 and a region 530*ba* and a region 530*bb* that are provided to sandwich the region 530*bc* and function as a source region and a drain region. At least part of the region 530*bc* overlaps with the conductor 560. In other words, the region 530*bc* is provided between the conductor 542*a* and the conductor 542*b*. The region 530*ba* is provided to overlap with the conductor 542*a*, and the region 530*bb* is provided to overlap with the conductor 542*b*.

The region 530*bc* functioning as the channel formation region has a smaller amount of oxygen vacancies (an oxygen vacancy in a metal oxide is sometimes referred to as Vo in this specification and the like) or a lower impurity concentration than the region 530*ba* and the region 530*bb* to be a high-resistance region having a low carrier concentration. Thus, the region 530*bc* can be regarded as being i-type (intrinsic) or substantially i-type.

A transistor using a metal oxide is likely to change its electrical characteristics when impurities or oxygen vacancies (Vo) exist in a region of the metal oxide where a channel is formed, which might degrade the reliability. In some cases, hydrogen in the vicinity of an oxygen vacancy (Vo) forms a defect that is an oxygen vacancy (Vo) into which hydrogen enters (hereinafter, sometimes referred to as VoH), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and VoH are preferably reduced as much as possible in the region of the oxide semiconductor where a channel is formed.

The region 530*ba* and the region 530*bb* functioning as the source region and the drain region are each a low-resistance region with an increased carrier concentration because they include a large amount of oxygen vacancies (Vo) or have a high concentration of an impurity such as hydrogen, nitrogen, or a metal element. In other words, the region 530*ba* and the region 530*bb* are each an n-type region having a higher carrier concentration and a lower resistance than the region 530*bc*.

The carrier concentration in the region 530*bc* functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 530*bc* functioning as the channel formation region is not particularly limited and can be, for example, $1 \times 10^{-9}$ cm$^{-3}$.

Between the region 530*bc* and the region 530*ba* or the region 530*bb*, a region having a carrier concentration that is lower than or substantially equal to the carrier concentrations in the region 530*ba* and the region 530*bb* and higher than or substantially equal to the carrier concentration in the region 530*bc* may be formed. That is, the region functions as a junction region between the region 530*bc* and the region 530*ba* or the region 530*bb*. The hydrogen concentration in the junction region is lower than or substantially equal to the hydrogen concentrations in the region 530*ba* and the region 530*bb* and higher than or substantially equal to the hydrogen concentration in the region 530*bc* in some cases. The amount of oxygen vacancies in the junction region is smaller than or substantially equal to the amounts of oxygen vacancies in the region 530*ba* and the region 530*bb* and larger than or substantially equal to the amount of oxygen vacancies in the region 530*bc* in some cases.

Although FIG. 18A illustrates an example in which the region 530*ba*, the region 530*bb*, and the region 530*bc* are formed in the oxide 530*b*, the present invention is not limited thereto. For example, the above regions may be formed not only in the oxide 530*b* but also in the oxide 530*a*.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530*a* and the oxide 530*b*) including the channel formation region.

The metal oxide functioning as a semiconductor preferably has a band gap of 2 eV or more, further preferably 2.5 eV or more. With the use of a metal oxide having such a wide band gap, the off-state current of the transistor can be reduced.

As the oxide 530, it is preferable to use, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

Here, the atomic ratio of In to the element M in the metal oxide used as the oxide 530*b* is preferably greater than the atomic ratio of In to the element M in the metal oxide used as the oxide 530*a*.

The oxide 530*a* is provided under the oxide 530*b* in the above manner, whereby impurities and oxygen can be inhibited from diffusing into the oxide 530*b* from components formed below the oxide 530*a*.

When the oxide 530*a* and the oxide 530*b* contain a common element (as the main component) besides oxygen, the density of defect states at an interface between the oxide 530*a* and the oxide 530*b* can be made low. Since the density of defect states at the interface between the oxide 530*a* and the oxide 530*b* can be made low, the influence of interface scattering on carrier conduction is small, and a high on-state current can be obtained.

The oxide 530*b* preferably has crystallinity. It is particularly preferable to use a CAAC-OS (c-axis aligned crystalline oxide semiconductor) as the oxide 530*b*.

The CAAC-OS is a metal oxide having a dense structure with high crystallinity and small amounts of impurities and defects (e.g., oxygen vacancies (Vo)). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter, sometimes referred to as VoH), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and VoH are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and VoH. However, supply of an excess amount of oxygen to the source region or the drain region might cause a decrease in the on-state current or field-effect mobility of the transistor 500. Furthermore, a variation of the amount of oxygen supplied to the source region or the drain region in the substrate plane leads to a variation in characteristics of the semiconductor device including the transistor.

Therefore, the region 530bc functioning as the channel formation region in the oxide semiconductor is preferably an i-type or substantially i-type region with a reduced carrier concentration, whereas the region 530ba and the region 530bb functioning as the source region and the drain region are preferably n-type regions with high carrier concentrations. That is, it is preferable that oxygen vacancies and VoH in the region 530bc of the oxide semiconductor be reduced and the region 530ba and the region 530bb not be supplied with an excess amount of oxygen.

Thus, in this embodiment, microwave treatment is performed in an oxygen-containing atmosphere in a state where the conductor 542a and the conductor 542b are provided over the oxide 530b so that oxygen vacancies and VoH in the region 530bc can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530bc can be irradiated with the high-frequency wave such as a microwave or RF. By the effect of the plasma, a microwave, or the like, VoH in the region 530bc can be cut; thus, hydrogen H can be removed from the region 530bc and oxygen can compensate for an oxygen vacancy Vo. That is, the reaction "VoH→H+Vo" occurs in the region 530bc, so that the hydrogen concentration in the region 530bc can be reduced. As a result, oxygen vacancies and VoH in the region 530bc can be reduced to lower the carrier concentration.

In the microwave treatment in an oxygen-containing atmosphere, the high-frequency wave such as the microwave or RF, the oxygen plasma, or the like is blocked by the conductor 542a and the conductor 542b and does not affect the region 530ba nor the region 530bb. In addition, the effect of the oxygen plasma can be reduced by the insulator 571 and the insulator 580 that are provided to cover the oxide 530b and the conductor 542. Hence, a reduction in VoH and supply of an excess amount of oxygen do not occur in the region 530ba and the region 530bb in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530bc. In addition, the insulator 552 is provided to be in contact with the side surface of the conductor 542 and the surface of the region 530bc, thereby preventing oxygen more than necessary from being supplied to the region 530bc and preventing the side surface of the conductor 542 from being oxidized. Furthermore, the side surface of the conductor 542 can be inhibited from being oxidized when an insulating film to be the insulator 550 is formed.

The oxygen supplied into the region 530bc has any of a variety of forms such as an oxygen atom, an oxygen molecule, and an oxygen radical (also referred to as an O radical, an atom or a molecule having an unpaired electron, or an ion). Note that the oxygen supplied into the region 530bc preferably has any one or more of the above forms, and is particularly preferably an oxygen radical. Furthermore, the film quality of the insulator 552 and the insulator 550 can be improved, leading to higher reliability of the transistor 500.

In the above manner, oxygen vacancies and VoH can be selectively removed from the region 530bc in the oxide semiconductor, whereby the region 530bc can be an i-type or substantially i-type region. Furthermore, supply of an excess amount of oxygen to the region 530ba and the region 530bb functioning as the source region and the drain region can be inhibited and the conductivity can be maintained. As a result, a change in the electrical characteristics of the transistor 500 can be inhibited, and thus a variation in the electrical characteristics of the transistors 500 in the substrate plane can be reduced.

With the above structure, a semiconductor device with a small variation in transistor characteristics can be provided. A semiconductor device with favorable reliability can also be provided. A semiconductor device having favorable electrical characteristics can be provided.

As illustrated in FIG. 17B, a curved surface may be provided between the side surface of the oxide 530b and the top surface of the oxide 530b in a cross-sectional view of the transistor 500 in the channel width direction. In other words, an end portion of the side surface and an end portion of the top surface may be curved (hereinafter, also referred to as rounded).

The radius of curvature of the curved surface is preferably greater than 0 nm and less than the thickness of the oxide 530b in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 530b with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a.

The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 530b by the source electrode or the drain electrode. This can reduce oxygen extraction from the oxide 530b even when heat treatment is performed; thus, the transistor 500 is stable with respect to high temperatures in a manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. To achieve this, the density of defect states in a mixed layer formed at the interface between the oxide 530a and the oxide 530b is preferably made low.

Specifically, when the oxide 530a and the oxide 530b contain a common element as a main component besides oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, an indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 17A or the like, the insulator 552 formed using aluminum oxide or the like is provided in contact with the top and side surfaces of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530b, can increase the field-effect mobility of the transistor 500.

When the oxide 530a and the oxide 530b have the above structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, an insulator 576, and an insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of oxygen and impurities such as water and hydrogen is preferably used as the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In this case, impurities such as water and hydrogen can be inhibited from diffusing to the transistor 500 side from the substrate side through the insulator 512 and the insulator 514. Impurities such as water and hydrogen can be inhibited from diffusing to the transistor 500 side from an interlayer insulating film and the like which are provided outside the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device, which have favorable characteristics and high reliability, can be fabricated.

Although each of the insulator 512, the insulator 514, the insulator 544, the insulator 571, the insulator 574, the insulator 576, and the insulator 581 preferably has an amorphous structure, a region having a polycrystalline structure may be partly formed. Alternatively, each of the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 can be deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting the resistivities of the insulator 512, the insulator 544, and the insulator 576 to approximately $1 \times 10^{13}$ $\Omega$cm, the insulator 512, the insulator 544, and the insulator 576 can sometimes reduce charge up of the conductor 503, the conductor 542, the conductor 560, or the like in treatment using plasma or the like in the fabrication process of a semiconductor device. The resistivities of the insulator 512, the insulator 544, and the insulator 576 are preferably higher than or equal to $1 \times 10^{10}$ $\Omega$cm and lower than or equal to $1 \times 10^{15}$ $\Omega$cm.

The insulator 516, the insulator 574, the insulator 580, and the insulator 581 each preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 is preferably an insulator functioning as an interlayer film, a planarization film, or the like, for example.

The conductor 503 is provided to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed in the conductor 503a. Here, the upper portion of the conductor 503b is substantially level with the upper portion of the conductor 503a and the upper portion of the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 503a. For example, titanium nitride is used for the conductor 503a.

Moreover, the conductor 503b is preferably formed using a conductive material containing tungsten, copper, or aluminum as its main component. For example, tungsten is used for the conductor 503b.

The conductor 503 sometimes functions as a second gate electrode. In that case, by changing a potential applied to the conductor 503 not in conjunction with but independently of a potential applied to the conductor 560, the threshold voltage (Vth) of the transistor 500 can be controlled. In particular, Vth of the transistor 500 can be higher in the case where a negative potential is applied to the conductor 503, and the off-state current can be reduced. Thus, drain current at the time when a potential applied to the conductor 560 is 0 V can be lower in the case where a negative potential is applied to the conductor 503 than in the case where the negative potential is not applied to the conductor 503.

In the case where the oxide 530 is a highly purified intrinsic oxide and as many impurities as possible are eliminated from the oxide 530, the transistor 500 can be expected to become normally-off (the threshold voltage of the transistor 500 can be expected to higher than 0 V) in some cases with no potential application to the conductor 503 and/or the conductor 560. In that case, it is suitable to connect the conductor 560 and the conductor 503 to each other such that the same potential is supplied.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

When seen from above, the conductor 503 is preferably provided to be larger than a region of the oxide 530 that does not overlap with the conductor 542a or the conductor 542b. As illustrated in FIG. 17B, it is particularly preferable that the conductor 503 extend to a region outside end portions of the oxide 530a and the oxide 530b in the channel width direction. That is, the conductor 503 and the conductor 560 preferably overlap with each other with the insulators therebetween on the outer side of the side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

When the transistor 500 becomes normally-off and has the above-described S-Channel structure, the channel formation region can be electrically surrounded. Accordingly, the transistor 500 can be regarded as having a GAA (Gate All Around) structure or an LGAA (Lateral Gate All Around) structure. When the transistor 500 has the S-Channel structure, the GAA structure, or the LGAA structure, the channel formation region that is formed at the interface between the oxide 530 and the gate insulating film or in the vicinity of the interface can be formed in the entire bulk of the oxide 530. In other words, the transistor 500 having the S-Channel structure, the GAA structure, or the LGAA structure can be what is called a Bulk-Flow type, in which a carrier path is used as the entire bulk. A transistor structure with a Bulk-Flow type can improve the density of current flowing in the transistor and thus can be expected to improve the on-state current of the transistor or increase the field-effect mobility of the transistor.

Furthermore, as illustrated in FIG. 17B, the conductor 503 is extended to function as a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Although the transistor 500 having a structure in which the conductor 503 is a stack of the conductor 503a and the conductor 503b is illustrated, the present invention is not limited thereto. For example, the conductor 503 may be provided to have a single-layer structure or a stacked-layer structure of three or more layers.

The insulator 522 and the insulator 524 function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Moreover, the conductor 503 can be inhibited from reacting with oxygen contained in the insulator 524 or the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As scaling down and high integration of transistors progress, a problem such as leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 522.

Silicon oxide or silicon oxynitride, for example, can be used as appropriate for the insulator 524 that is in contact with the oxide 530.

In a fabrication process of the transistor 500, heat treatment is preferably performed with a surface of the oxide 530 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 530 to reduce oxygen vacancies (Vo). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "Vo+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530a. In this case, the insulator 544 is in contact with the side surface of the insulator 524 and the top surface of the insulator 522.

The conductor 542a and the conductor 542b are provided in contact with the top surface of the oxide 530b. The conductor 542a and the conductor 542b function as a source electrode and a drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. For another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530b or the like diffuses into the conductor 542a or the conductor 542b in some cases. In particular, when a nitride containing tantalum is used for the conductor 542a and the conductor 542b, hydrogen contained in the oxide 530b or the like is likely to diffuse into the conductor 542a or the conductor 542b, and the diffused hydrogen is bonded to nitrogen contained in the conductor 542a or the conductor 542b in some cases. That is, hydrogen contained in the oxide 530b or the like is absorbed by the conductor 542a or the conductor 542b in some cases.

No curved surface is preferably formed between the side surface of the conductor 542 and the top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571a is provided in contact with the top surface of the conductor 542a, and the insulator 571b is provided in contact with the top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon such as silicon nitride may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or amorphous aluminum oxide for the insulator 571 because hydrogen can be captured or fixed more effectively in some cases. Accordingly, the transistor 500 and a semiconductor device, which have favorable characteristics and high reliability, can be fabricated.

The insulator 544 is provided to cover the insulator 524, the oxide 530a, the oxide 530b, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above may be used. An insulator containing an oxide of one or both of aluminum and hafnium is preferably used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 17B, the insulator 552 is provided in contact with the top surface and the side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies (Vo) in the oxide 530a and the oxide 530b. Therefore, oxygen vacancies (Vo) and VoH formed in the region 530bc can be reduced. Thus, the transistor 500 can have favorable electrical characteristics and higher reliability.

Even when an excess amount of oxygen is contained in the insulator 580, the insulator 550, and the like, oxygen can be inhibited from being excessively supplied to the oxide 530a and the oxide 530b. Thus, the region 530ba and the region 530bb are prevented from being excessively oxidized by oxygen through the region 530bc; a reduction in on-state current or field-effect mobility of the transistor 500 can be inhibited.

As illustrated in FIG. 17A, the insulator 552 is provided in contact with the side surfaces of the conductor 542, the insulator 571, the insulator 544, and the insulator 580. This can inhibit formation of an oxide film on the side surface of the conductor 542 by oxidization of the side surface. Accordingly, a reduction in on-state current or field-effect mobility of the transistor 500 can be inhibited.

Furthermore, the insulator 552 needs to be provided in an opening formed in the insulator 580 and the like, together with the insulator 554, the insulator 550, and the conductor 560. The thickness of the insulator 552 is preferably small for scaling down the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that the above-described lower limits and upper limits can be combined with each other. In that case, at least part of the insulator 552 includes a region having the above-described thickness. The thickness of the insulator 552 is preferably smaller than that of the insulator 550. In that case, at least part of the insulator 552 includes a region having a thickness smaller than that of the insulator 550.

To form the insulator 552 having a small thickness as described above, an ALD method is preferably used for deposition. As an ALD method, a thermal ALD method, in which a precursor and a reactant react with each other only by a thermal energy, a PEALD (Plasma Enhanced ALD) method, in which a reactant excited by plasma is used, and the like can be used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 and the like to have a small thickness as described above and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photoelectron spectroscopy (XPS).

The insulator 550 functions as part of the gate insulator. The insulator 550 is preferably provided in contact with the top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 550 in this case is an insulator containing at least oxygen and silicon.

As in the insulator 524, the concentration of an impurity such as water or hydrogen in the insulator 550 is preferably reduced. The lower limit of the thickness of the insulator 550 is preferably greater than or equal to 1 nm or greater than or equal to 0.5 nm, and the upper limit is preferably less than or equal to 15 nm or less than or equal to 20 nm. Note that the above-described lower limits and upper limits can be combined with each other. In that case, at least part of the insulator 550 includes a region having the above-described thickness.

Although FIG. 17A, FIG. 17B, and the like illustrate a single-layer structure of the insulator 550, the present invention is not limited to this structure, and a stacked-layer structure of two or more layers may be employed. For example, as illustrated in FIG. 18B, the insulator 550 may have a stacked-layer structure including two layers of an insulator 550a and an insulator 550b over the insulator 550a.

Figure 18B:
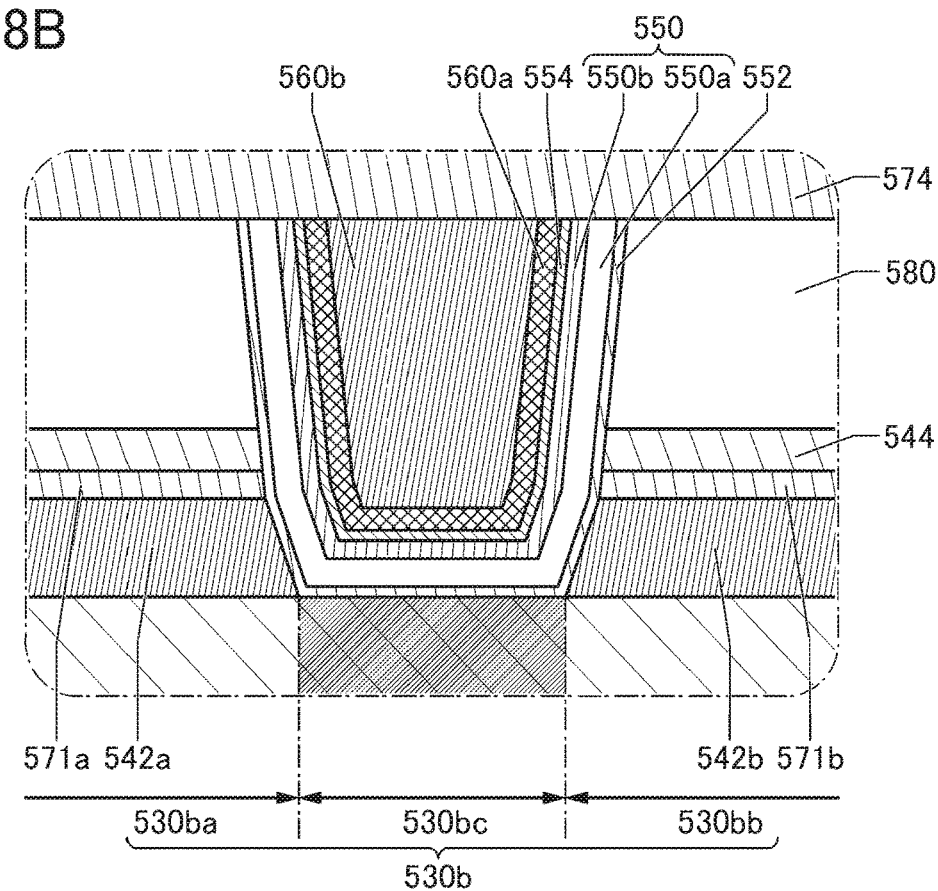

In the case where the insulator 550 has a stacked-layer structure of two layers as illustrated in FIG. 18B, it is preferable that the insulator 550a in a lower layer be formed using an insulator that is likely to transmit oxygen and the insulator 550b in an upper layer be formed using an insulator having a function of inhibiting oxygen diffusion. With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 550b. In this case, the insulator 550b is an insulator containing at least oxygen and hafnium. The lower limit of the thickness of the insulator 550b is preferably greater than or equal to 0.5 nm or greater than or equal to 1.0 nm, and the upper limit is preferably less than or equal to 3.0 nm or less than or equal to 5.0 nm. Note that the above-described lower limits and upper limits can be combined with each other. In that case, at least part of the insulator 550b includes a region having the above-described thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Thus, a gate potential that is applied during the operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530b. As the insulator 554, an insulator that can be used as the insulator 576 described above may be used. For example, silicon nitride deposited by a PEALD method may be used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

Furthermore, the insulator 554 needs to be provided in an opening formed in the insulator 580 and the like, together with the insulator 552, the insulator 550, and the conductor 560. The thickness of the insulator 554 is preferably small for scaling down the transistor 500. The lower limit of the thickness of the insulator 554 is preferably greater than or equal to 0.1 nm, greater than or equal to 0.5 nm, or greater than or equal to 1.0 nm, and the upper limit is preferably less than or equal to 3.0 nm or less than or equal to 5.0 nm. Note that the above-described lower limits and upper limits can be combined with each other. In that case, at least part of the insulator 554 includes a region having the above-described thickness. The thickness of the insulator 554 is preferably smaller than that of the insulator 550. In that case, at least part of the insulator 554 includes a region having a thickness smaller than that of the insulator 550.

The conductor 560 functions as the first gate electrode of the transistor 500. The conductor 560 preferably includes the conductor 560a and the conductor 560b provided over the conductor 560a. For example, the conductor 560a is preferably provided to cover the bottom surface and the side surface of the conductor 560b. As illustrated in FIG. 17A and FIG. 17B, the upper portion of the conductor 560 is substantially level with the upper portion of the insulator 550. Note that although the conductor 560 has a two-layer structure of the conductor 560a and the conductor 560b in FIG. 17A and FIG. 17B, the conductor 560 can have, besides the two-layer structure, a single-layer structure or a stacked-layer structure of three or more layers.

For the conductor 560a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 560a has a function of inhibiting diffusion of oxygen, the conductivity of the conductor 560b can be inhibited from being lowered because of oxidation due to oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus is preferably a conductor having high conductivity. For example, a conductive material containing tungsten, copper, or aluminum as its main component can be used for the conductor 560b. The conductor 560b can have a stacked-layer structure. Specifically, for example, the conductor 560b can have a stacked-layer structure of titanium or titanium nitride and the above conductive material.

In the transistor 500, the conductor 560 is formed in a self-aligned manner to fill the opening formed in the insulator 580 and the like. The formation of the conductor 560 in this manner allows the conductor 560 to be placed properly in a region between the conductor 542a and the conductor 542b without alignment.

As illustrated in FIG. 17B, in the channel width direction of the transistor 500, with reference to the bottom surface of the insulator 522, the level of the bottom surface of the conductor 560 in a region where the conductor 560 and the oxide 530b do not overlap with each other is preferably lower than the level of the bottom surface of the oxide 530b. When the conductor 560 functioning as the gate electrode covers the side surface and the top surface of the channel formation region of the oxide 530b with the insulator 550 and the like therebetween, the electric field of the conductor 560 can easily act on the entire channel formation region of the oxide 530b. Thus, the on-state current of the transistor 500 can be increased and the frequency characteristics can be improved. The lower limit of the difference between the level of the bottom surface of the conductor 560 in a region where the oxide 530a and the oxide 530b do not overlap with the conductor 560 and the level of the bottom surface of the oxide 530b, with reference to the bottom surface of the insulator 522, is preferably greater than or equal to 0 nm, greater than or equal to 3 nm, or greater than or equal to 5 nm, and the upper limit is preferably less than or equal to 20 nm, less than or equal to 50 nm, or less than or equal to 100 nm. Note that the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits passage of oxygen. For the insulator 574, a metal oxide having an amorphous structure, for example, an insulator such as aluminum oxide, can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device, which have favorable characteristics and high reliability, can be fabricated.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method may be used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540a functioning as a plug, and the other of the first terminal and the second terminal of the transistor 500 is electrically connected to a conductor 540b. Note that the conductor 540a, the conductor 540b, and the like may function as wirings for electrically connected to the display portion DSP provided therabove or the circuit portion SIC provided therebelow. Note that in this specification and the like, the conductor 540a and the conductor 540b are collectively referred to as the conductor 540.

The conductor 540a is provided in a region overlapping with the conductor 542a, for example. Specifically, an opening portion is formed in the insulator 571, the insulator 544, the insulator 580, the insulator 574, the insulator 576, and the insulator 581 illustrated in FIG. 17A in the region overlapping with the conductor 542a, and the conductor 540a is provided inside the opening portion. The conductor 540b is provided in a region overlapping with the conductor 542b, for example. Specifically, an opening portion is formed in the insulator 571, the insulator 544, the insulator 580, the insulator 574, the insulator 576, and the insulator 581 illustrated in FIG. 17A in the region overlapping with the conductor 542b, and the conductor 540b is provided inside the opening portion.

As illustrated in FIG. 17A, an insulator 541a as an insulator having an impurity barrier property may be provided between the conductor 540a and the side surface of the opening portion in the region overlapping with the conductor 542a. Similarly, an insulator 541b as an insulator having an impurity barrier property may be provided between the conductor 540b and the side surface of the opening portion in the region overlapping with the conductor 542b. Note that in this specification and the like, the insulator 541a and the insulator 541b are collectively referred to as an insulator 541.

For the conductor 540a and the conductor 540b, a conductive material containing tungsten, copper, or aluminum as its main component is preferably used. The conductor 540a and the conductor 540b may each have a stacked-layer structure.

In the case where the conductor 540 has a stacked-layer structure, a conductive material having a function of inhibiting passage of impurities such as water and hydrogen is preferably used for a first conductor provided in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540a and the conductor 540b.

For the insulator 541a and the insulator 541b, a barrier insulating film that can be used for the insulator 544 or the like may be used. For the insulator 541a and the insulator 541b, for example, an insulator such as silicon nitride, aluminum oxide, or silicon nitride oxide may be used. Since the insulator 541a and the insulator 541b are provided in contact with the insulator 574, the insulator 576, and the insulator 571, impurities such as water and hydrogen contained in the insulator 580 or the like can be inhibited from entering the oxide 530 through the conductor 540a and the conductor 540b. In particular, silicon nitride is suitable because of its high blocking property against hydrogen. Furthermore, oxygen contained in the insulator 580 can be prevented from being absorbed by the conductor 540a and the conductor 540b.

When the insulator 541a and the insulator 541b each have a stacked-layer structure as illustrated in FIG. 17A, a first insulator in contact with an inner wall of the opening in the insulator 580 and the like and a second insulator inside the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 540 can be inhibited, and hydrogen can be inhibited from entering the conductor 540.

Although the first insulator of the insulator 541 and the second conductor of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

The structure of the transistor included in the semiconductor device of one embodiment of the present invention is not limited to that of the transistor 500 illustrated in FIG. 16, FIG. 17A, and FIG. 17B. The structure of the transistor included in the semiconductor device of one embodiment of the present invention may be changed in accordance with circumstances.

Figure 19:
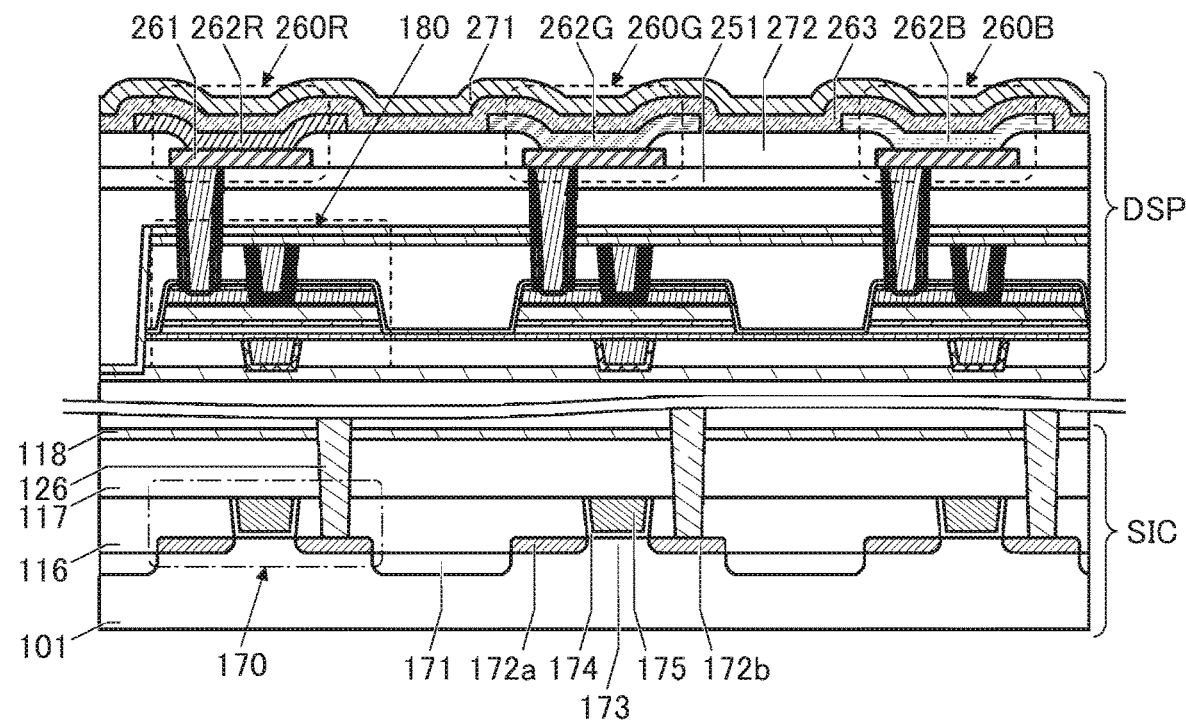
FIG. 19 is a schematic cross-sectional view illustrating a structure example of a display apparatus or a display system.
Figure 20:
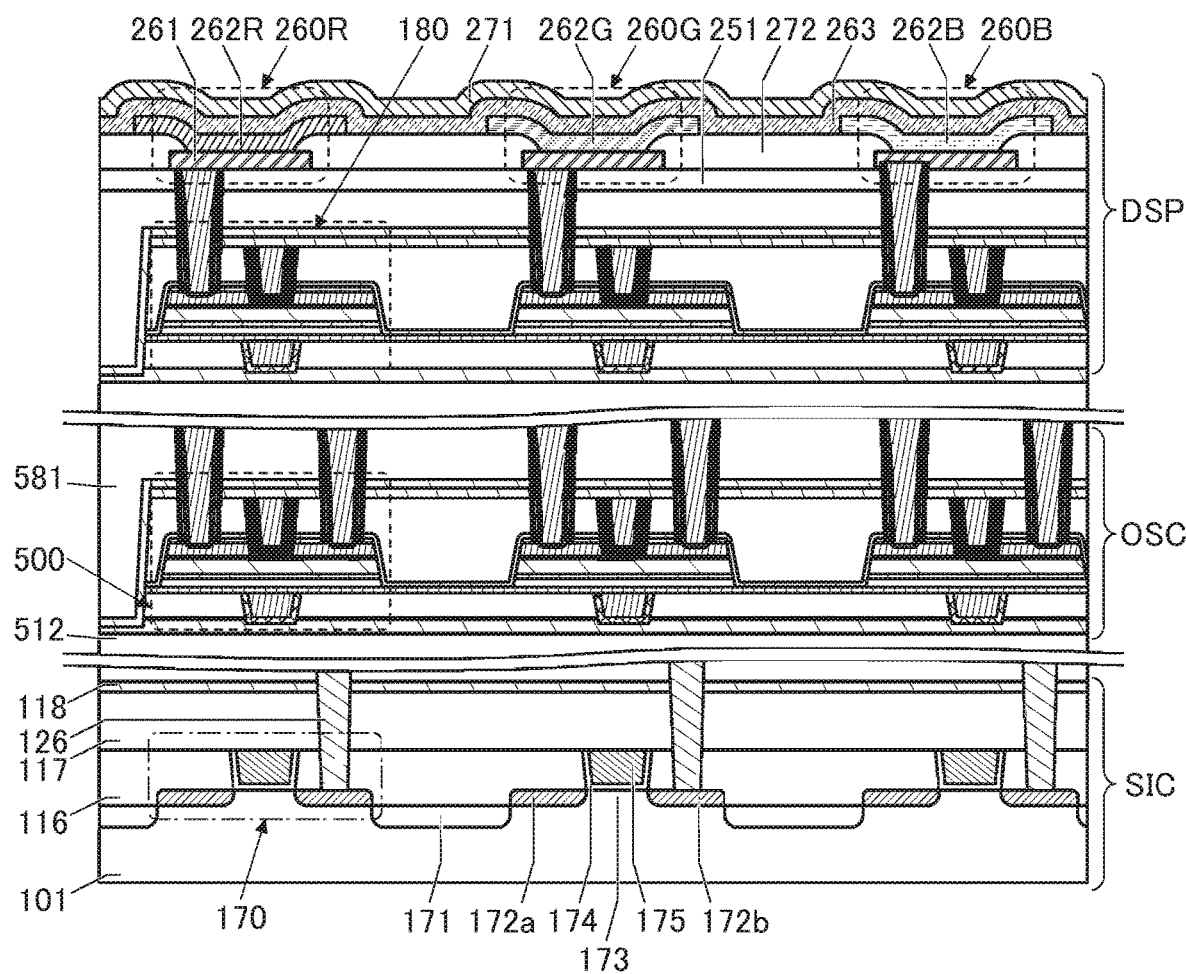
FIG. 20 is a schematic cross-sectional view illustrating a structure example of a display apparatus or a display system.

Although the transistor 180 included in the display portion DSP is a transistor having a bottom-gate structure in this embodiment, one embodiment of the present invention is not limited thereto. For example, in the display apparatus (display system) illustrated in FIG. 14A, the transistor 180 included in the display portion DSP may have a structure similar to that of an OS transistor applicable to the layer OSC, as in a display apparatus (display system) illustrated in FIG. 19. The display apparatus (display system) illustrated in FIG. 19 may include the layer OSC like the display apparatus (display system) illustrated in FIG. 16, as in a display apparatus (display system) illustrated in FIG. 20. In other words, the display system of one embodiment of the present invention can include a plurality of OS transistors that are stacked.

When the circuit portion SIC and the display portion DSP above the circuit portion SIC are provided as described above, a display apparatus or a display system having a function of processing an image, a function of correcting an image, a function of changing a frame rate, a function utilizing artificial intelligence, and the like (in this specification, such a display apparatus or display system is referred to as an ultra-high-resolution OLED system display) can be formed. Furthermore, when the layer OSC is provided between the circuit portion SIC and the circuit portion SIC, a transistor different from the transistor formed on the semiconductor substrate included in the circuit portion SIC can be provided; thus, the design margins of the peripheral circuit DRV and the functional circuit MFNC included in the circuit portion SIC can be widened. When a circuit is provided in the layer OSC, an increase in the circuit area of the ultra-high-resolution OLED system display can be prevented.

Note that this embodiment can be combined with any of the other embodiments described in this specification as appropriate.

Embodiment 4

Described in this embodiment is a metal oxide (hereinafter, also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor will be described with reference to FIG. 21A. FIG. 21A is a diagram showing the classification of crystal structures of an oxide semiconductor, typically IGZO (a metal oxide containing In, Ga, and Zn).

As shown in FIG. 21A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 21A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 21B shows an XRD spectrum, which is obtained by GIXD (Grazing-Incidence XRD) measurement, of a CAAC-IGZO film classified into "Crystalline" (the vertical axis represents intensity in arbitrary unit (a.u.)). Note that a GIXD method is also referred to as a thin film method or a Seemann-Bohlin method. The XRD spectrum that is shown in FIG. 21B and obtained by GIXD measurement may be hereinafter simply referred to as an XRD spectrum. The CAAC-IGZO film in FIG. 21B has a composition in the neighborhood of In:Ga:Zn=4:2:3 [atomic ratio]. The CAAC-IGZO film in FIG. 21B has a thickness of 500 nm.

As shown in FIG. 21B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 21B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 21C shows a diffraction pattern of the CAAC-IGZO film. FIG. 21C shows a diffraction pattern obtained by the NBED method in which an electron beam is incident in the direction parallel to the substrate. The composition of the CAAC-IGZO film in FIG. 21C is In:Ga:Zn=4:2:3 [atomic ratio] or the neighborhood thereof. In the nanobeam electron diffraction method, electron diffraction is performed with a probe diameter of 1 nm.

As shown in FIG. 21C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 21A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities, defects (e.g., oxygen vacancies), and the like. Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS and an amorphous oxide semiconductor by some analysis methods. For example, when an nc-OS film is subjected to structural analysis by out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains avoid or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments described in this specification as appropriate.

Embodiment 5

In this embodiment, an example of a head-mounted display including at least one of a display apparatus and a display system will be described as an example of an electronic device of one embodiment of the present invention.

Figure 22A:
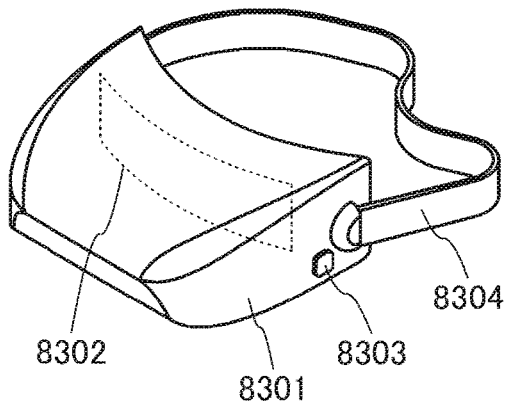
FIG. 22A to FIG. 22F are diagrams illustrating structure examples of an electronic device.
Figure 22B:
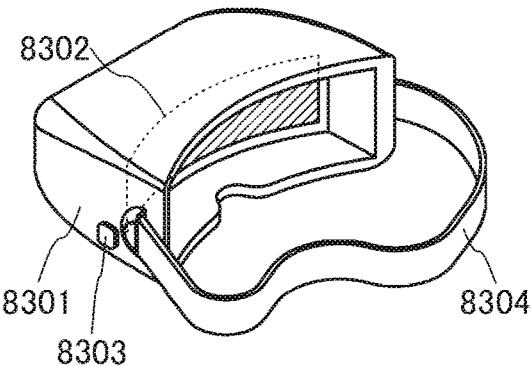

FIG. 22A and FIG. 22B illustrate external views of a head-mounted display 8300.

The head-mounted display 8300 includes a housing 8301, a display portion 8302, an operation button 8303, and a band-shaped fixing unit 8304.

The operation button 8303 has a function of a power button or the like. A button other than the operation button 8303 may be included.

Figure 22C:
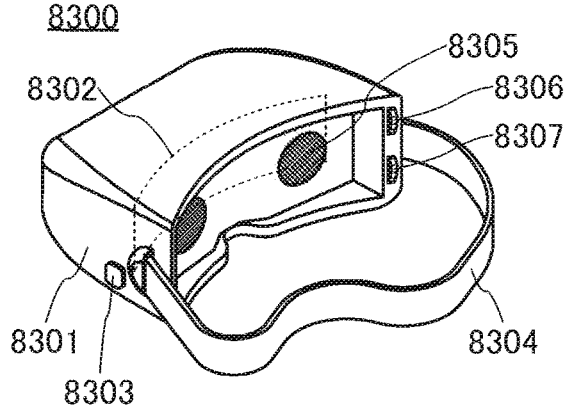

As illustrated in FIG. 22C, lenses 8305 may be provided between the display portion 8302 and the user's eyes. The user can see magnified images on the display portion 8302 through the lenses 8305, leading to a higher realistic sensation. In that case, as illustrated in FIG. 22C, a dial 8306 for changing the position of the lenses and adjusting visibility may be included.

The display portion 8302 can use at least one of the display apparatus and the display system of one embodiment of the present invention. At least one of the display apparatus and the display system of one embodiment of the present invention has an extremely high resolution; thus, even when an image is magnified using the lenses 8305 as in FIG. 22C, the user does not perceive pixels, and a more realistic image can be displayed.

FIG. 22A to FIG. 22C each illustrate an example in which one display portion 8302 is provided. This structure can reduce the number of components.

The display portion 8302 can display an image for the right eye and an image for the left eye side by side on a right region and a left region, respectively. Thus, a three-dimensional image using binocular disparity can be displayed.

One image which can be seen by both eyes may be displayed on the entire display portion 8302. A panorama image can thus be displayed from end to end of the field of view, which can provide a higher sense of reality.

Here, the head-mounted display 8300 preferably has a mechanism for changing the curvature of the display portion 8302 to an optimal value in accordance with the size of the user's head, the position of the user's eyes, or the like. For example, the user himself/herself may adjust the curvature of the display portion 8302 by operating a dial 8307 for adjusting the curvature of the display portion 8302. Alternatively, a sensor for detecting the size of the user's head, the position of the user's eyes, or the like (e.g., a camera, a contact sensor, and a noncontact sensor) may be provided on the housing 8301, and a mechanism for adjusting the curvature of the display portion 8302 on the basis of data detected by the sensor may be provided.

In the case where the lenses 8305 are used, a mechanism for adjusting the position and angle of the lenses 8305 in synchronization with the curvature of the display portion 8302 is preferably provided. Alternatively, the dial 8306 may have a function of adjusting the angle of the lenses.

Figure 22D:
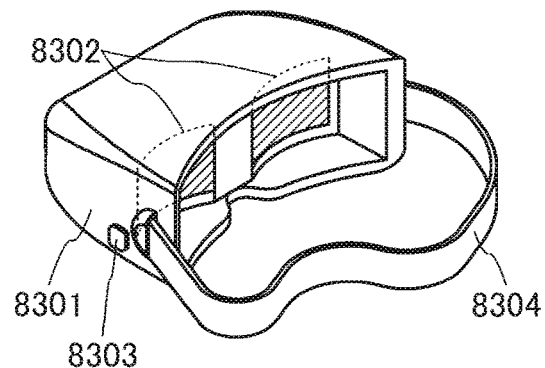
Figure 22E:
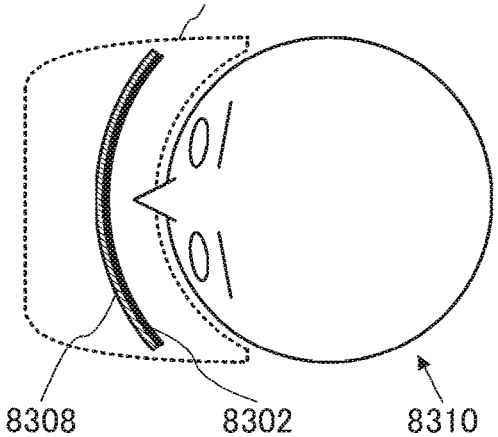
Figure 22F:
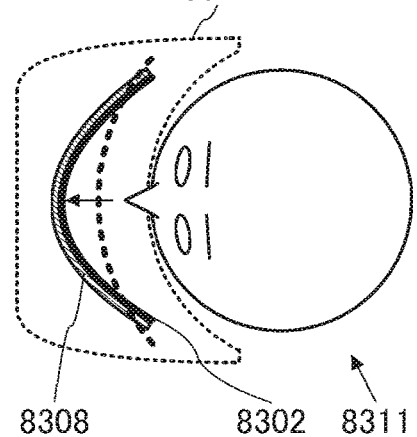

FIG. 22E and FIG. 22F illustrate an example of including a driver portion 8308 that controls the curvature of the display portion 8302. The driver portion 8308 is fixed to at least a part of the display portion 8302. The driver portion 8308 has a function of changing the shape of the display portion 8302 when the part that is fixed to the display portion 8302 changes in shape or moves.

FIG. 22E is a schematic diagram illustrating the case where a user 8310 having a relatively large head wears the housing 8301. In that case, the driver portion 8308 adjusts the shape of the display portion 8302 so that the curvature is relatively small (the radius of curvature is large).

By contrast, FIG. 22F illustrates the case where a user 8311 having a smaller head than the user 8310 wears the housing 8301. The user 8311 has a shorter distance between the eyes than the user 8310. In that case, the driver portion 8308 adjusts the shape of the display portion 8302 so that the curvature of the display portion 8302 is large (the radius of curvature is small). In FIG. 22F, the position and shape of the display portion 8302 in FIG. 22E are denoted by a dashed line.

When the head-mounted display 8300 has such a mechanism for adjusting the curvature of the display portion 8302, an optimal display can be offered to a variety of users of all ages and genders.

When the curvature of the display portion 8302 is changed in accordance with contents displayed on the display portion 8302, the user can have a more realistic sensation. For example, shaking can be expressed by vibrating the curvature of the display portion 8302. In this way, it is possible to produce various effects according to the scene in contents, and provide the user with new experiences. A further realistic display can be provided when the display portion 8302 operates in conjunction with a vibration module provided in the housing 8301.

Note that the head-mounted display 8300 may include two display portions 8302 as illustrated in FIG. 22D.

Since the two display portion 8302 are included, the user's eyes can see their respective display portions. Thus, a high-resolution image can be displayed even when a three-dimensional display using parallax or the like is performed. In addition, the display portion 8302 is curved around an arc with the user's eye as an approximate center. Thus, distances between the user's eye and display surfaces of the display portion become equal; thus, the user can see a more natural image. Even when the luminance or chromaticity of light from the display portion is changed depending on the angle at which the user see it, since the user's eye is positioned in a normal direction of the display surface of the display portion, the influence of the change can be substantially ignorable and thus a more realistic image can be displayed.

Note that this embodiment can be combined with any of the other embodiments described in this specification as appropriate.

Embodiment 6

In this embodiment, a display module that can be fabricated using at least one of the display apparatus and the display system of one embodiment of the present invention will be described.

Figure 23A:
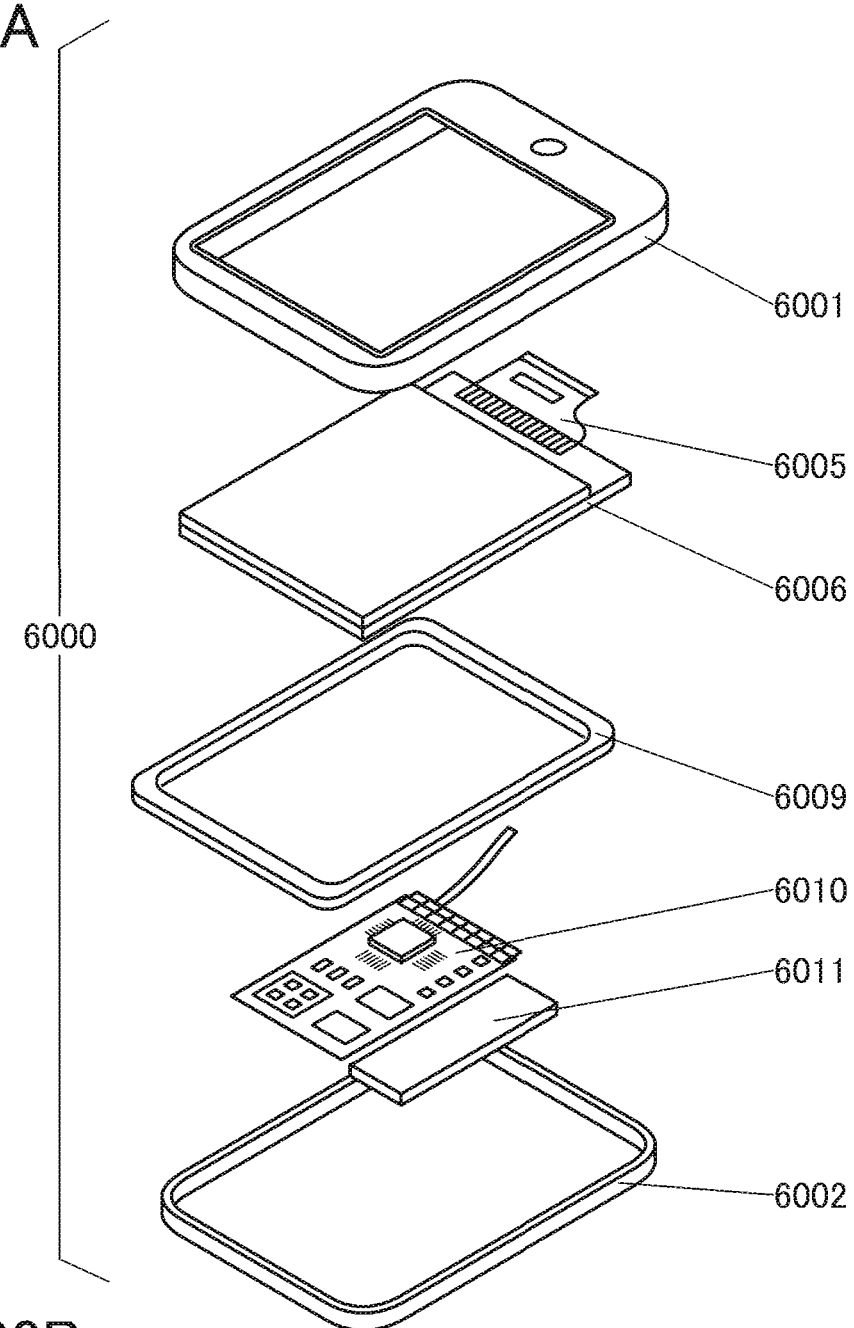
FIG. 23A and FIG. 23B are diagrams illustrating a structure example of a display module.

In a display module 6000 illustrated in FIG. 23A, a display apparatus 6006 to which an FPC 6005 is connected, a frame 6009, a printed circuit board 6010, and a battery 6011 are provided between an upper cover 6001 and a lower cover 6002.

A display apparatus fabricated using at least one of the display apparatus and the display system of one embodiment of the present invention can be used as the display apparatus 6006, for example. With the display apparatus 6006, a display module with extremely low power consumption can be achieved.

The shape and size of the upper cover 6001 and the lower cover 6002 can be changed as appropriate in accordance with the size of the display apparatus 6006.

The display apparatus 6006 may have a function of a touch panel.

The frame 6009 may have a function of protecting the display apparatus 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 23B:
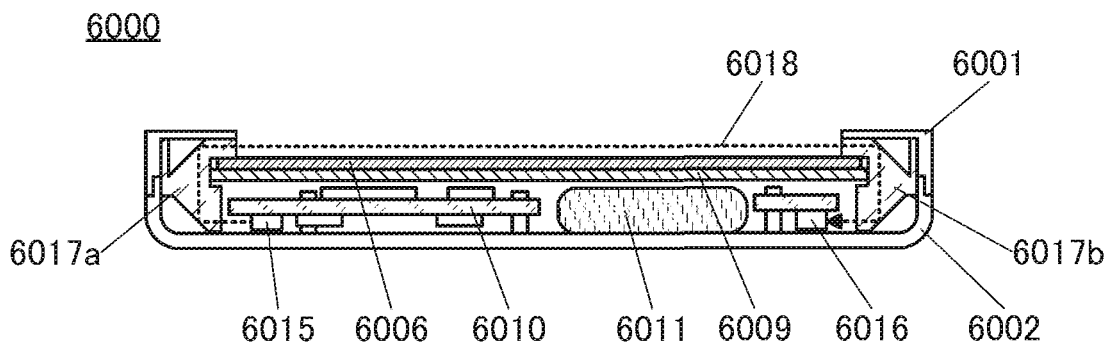

FIG. 23B is a schematic cross-sectional view of the display module 6000 including an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display apparatus 6006 overlaps with the printed circuit board 6010 and the battery 6011 with the frame 6009 therebetween. The display apparatus 6006 and the frame 6009 are fixed to the light guide portion 6017a and the light guide portion 6017b.

Light 6018 emitted from the light-emitting portion 6015 travels over the display apparatus 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display apparatus 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

The light guide portion 6017a and the light guide portion 6017b which transmit the light 6018 allow the light-emitting portion 6015 and the light-receiving portion 6016 to be placed under the display apparatus 6006, inhibiting a malfunction of the touch sensor due to external light reaching the light-receiving portion 6016. Particularly when a resin that absorbs visible light and transmits infrared rays is used, a malfunction of the touch sensor can be inhibited more effectively.

Note that this embodiment can be combined with any of the other embodiments described in this specification as appropriate.

Embodiment 7

In this embodiment, examples of an electronic device for which at least one of the display apparatus and the display system of one embodiment of the present invention can be used will be described.

Figure 24A:
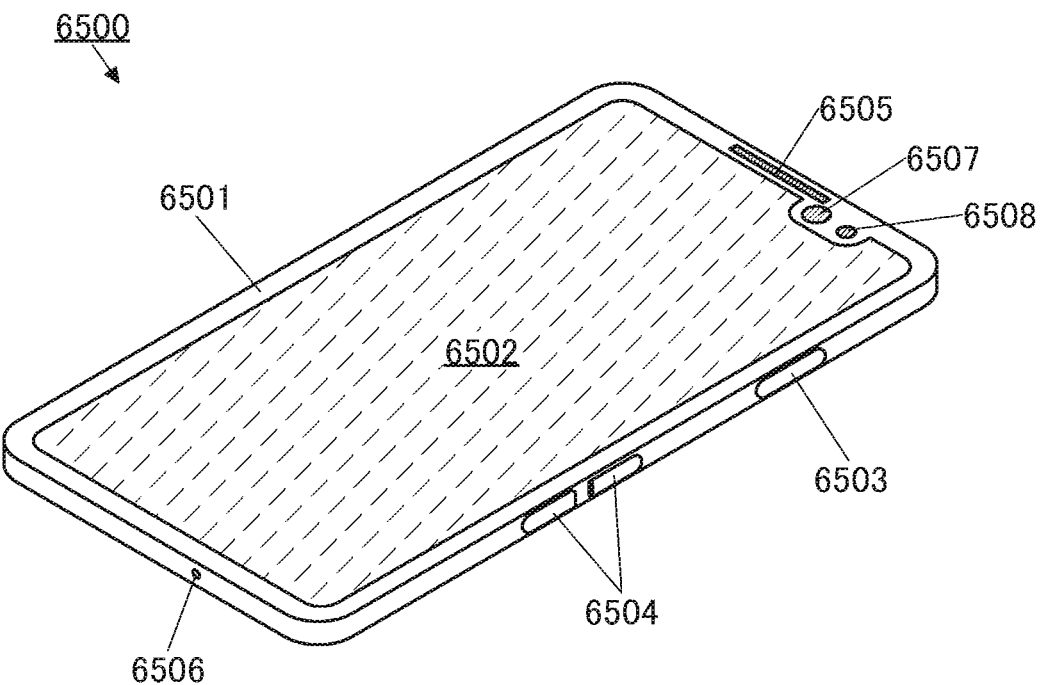
FIG. 24A and FIG. 24B are diagrams illustrating a structure example of an electronic device.

An electronic device 6500 illustrated in FIG. 24A is a portable information terminal that can be used as a smartphone.

The electronic device 6500 includes a housing 6501, a display portion 6502, a power button 6503, buttons 6504, a speaker 6505, a microphone 6506, a camera 6507, and a light source 6508. The display portion 6502 has a touch panel function.

At least one of the display apparatus and the display system of one embodiment of the present invention can be used in the display portion 6502.

Figure 24B:
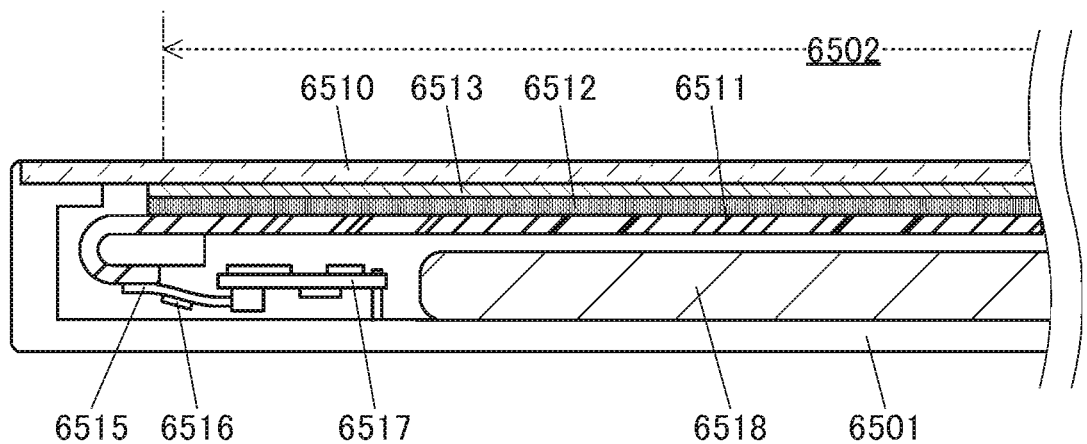

FIG. 24B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel can be used as the display panel 6511, for example. Thus, an extremely lightweight electronic device can be obtained. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

Note that this embodiment can be combined with any of the other embodiments described in this specification as appropriate.

Embodiment 8

In this embodiment, electronic devices each including at least one of a display apparatus and a display system fabricated using one embodiment of the present invention will be described.

Electronic devices described below as examples each include at least one of the display apparatus and the display system of one embodiment of the present invention in a display portion. Thus, the electronic devices achieve high resolution. In addition, the electronic devices can each achieve both high resolution and a large screen.

One embodiment of the present invention includes the display apparatus and at least one of an antenna, a battery, a housing, a camera, a speaker, a microphone, a touch sensor, and an operation button.

The electronic device of one embodiment of the present invention may include a secondary battery, and it is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

A display portion in an electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a notebook personal computer, a monitor device, digital signage, a pachinko machine, and a game machine.

An electronic device using one embodiment of the present invention can be incorporated along a flat surface or a curved surface of an inside wall or an outside wall of a building such as a house or a building, an interior or an exterior of a car, or the like.

Figure 25A:
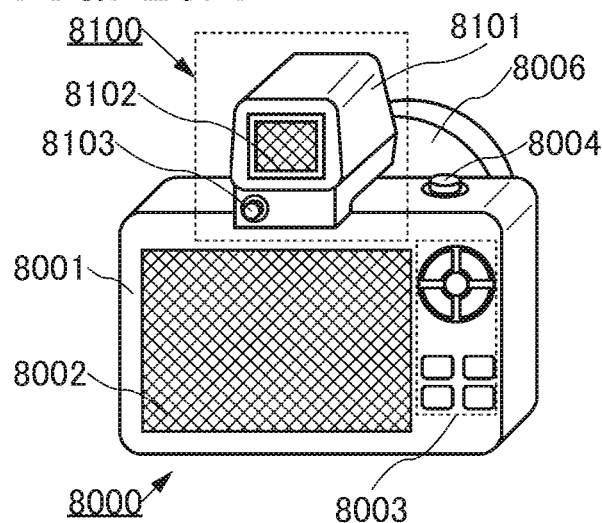
FIG. 25A to FIG. 25C are diagrams illustrating structure examples of electronic devices.

FIG. 25A is a diagram illustrating appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

At least one of the display apparatus and the display system of one embodiment of the present invention can be used for the display portion 8002 of the camera 8000 and the display portion 8102 of the finder 8100. Note that a finder may be incorporated in the camera 8000.

Figure 25B:
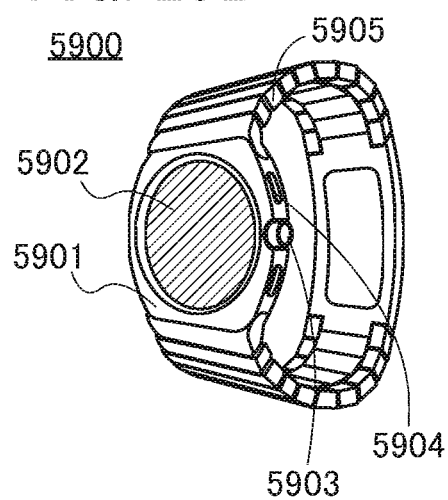

FIG. 25B is an external view of an information terminal 5900 that is an example of a wearable terminal. The information terminal 5900 includes a housing 5901, a display portion 5902, an operation button 5903, a crown 5904, a band 5905, and the like.

The wearable terminal can display an image with high display quality on the display portion 5902 by including at least one of the display apparatus and the display system described in the above embodiment.

Figure 25C:
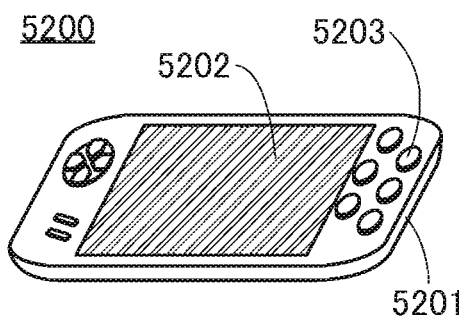

FIG. 25C is a diagram illustrating the appearance of a portable game machine 5200 which is an example of a game machine. The portable game machine 5200 includes a housing 5201, a display portion 5202, a button 5203, and the like.

Videos displayed on the portable game machine 5200 can be output with a display apparatus such as a television device, a personal computer display, a game display, and a head-mounted display.

The portable game machine 5200 can display an image with high display quality on the display portion 5202 by including at least one of the display apparatus and the display system described in the above embodiment. In addition, the portable game machine 5200 with low power consumption can be provided. Moreover, heat generation from a circuit can be reduced owing to low power consumption; thus, the influence of heat generation on the circuit itself, a peripheral circuit, and a module can be reduced.

Figure 26A:
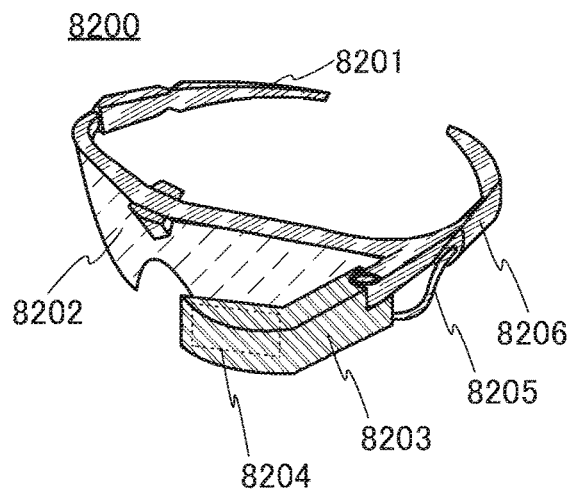
FIG. 26A to FIG. 26D are diagrams illustrating structure examples of electronic devices.

FIG. 26A is a diagram illustrating appearance of a head-mounted display 8200.

The head-mounted display 8200 includes a mounting portion 8201, a lens 8202, a main body 8203, a display portion 8204, a cable 8205, and the like. In addition, a battery 8206 is incorporated in the mounting portion 8201.

The cable 8205 supplies power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

At least one of the display apparatus and the display system of one embodiment of the present invention can be used for the display portion 8204.

Figure 26B:
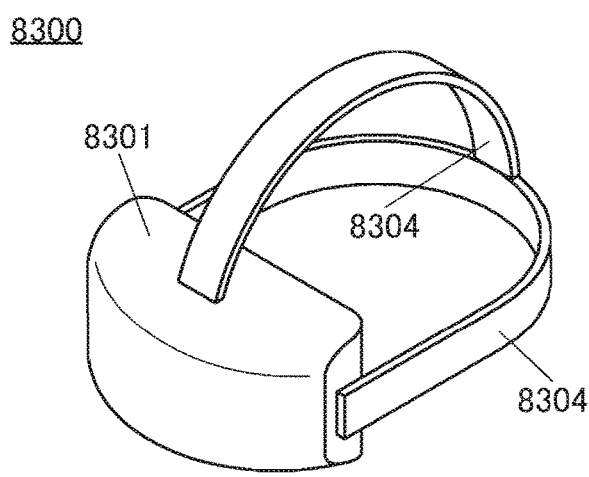
Figure 26C:
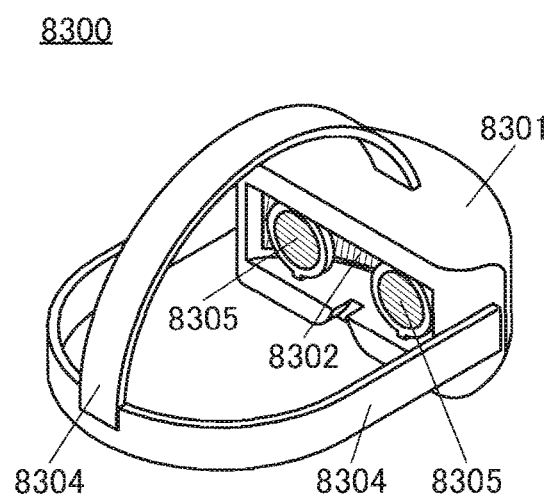
Figure 26D:
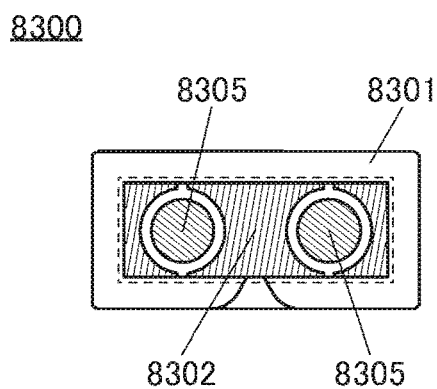

FIG. 26B, FIG. 26C, and FIG. 26D are diagrams illustrating appearance of a head-mounted display 8300. The head-mounted display 8300 includes a housing 8301, a display portion 8302, band-shaped fixing units 8304, and a pair of lenses 8305.

A user can see display on the display portion 8302 through the lenses 8305. Note that the display portion 8302 is preferably curved and placed because the user can feel a high realistic sensation. In addition, when another image displayed on a different region of the display portion 8302 is viewed through the lenses 8305, three-dimensional display using parallax or the like can also be performed. Note that the number of display portions 8302 provided is not limited to one; two display portions 8302 may be provided so that one display portion is provided for one eye of the user.

Note that at least one of the display apparatus and the display system of one embodiment of the present invention can be used in the display portion 8302. The display apparatus including the semiconductor device of one embodiment of the present invention has an extremely high resolution; thus, even when a video is magnified by the lenses 8305 as in FIG. 26D, the user does not perceive pixels, and a more realistic video can be displayed.

Note that this embodiment can be combined with any of the other embodiments described in this specification as appropriate.

REFERENCE NUMERALS

DSP: display portion, OSC: layer, SIC: circuit portion, CHP: circuit portion, DRV: peripheral circuit, MFNC: functional circuit, MFNCa: functional circuit, MFNCb: functional circuit, DRVa: circuit, DRVb: circuit, MDV: memory device, PX: pixel, MC: memory cell, GL: wiring, SL: wiring, SNCL: wiring, ML: wiring, BSL: bus wiring, MC1: memory cell, MC2: memory cell, MC2A: memory cell, MC3: memory cell, MC4: memory cell, MC5: memory cell, MC6: memory cell, M1: transistor, M2: transistor, M3: transistor, M10: transistor, M11: transistor, CA: capacitor, CB: capacitor, ME: MTJ element, FL: layer, TIS: layer, RL: layer, RM: variable resistor, PCM1: phase-change memory, TE: electrode, CHL: phase-change layer, BE: electrode, FEA: ferroelectric capacitor, WOL: wiring, BIL: wiring, CVL: wiring, BGL: wiring, CAL: wiring, RBL: wiring, WBL: wiring, SOL: wiring, WL: wiring, BL: wiring, FCA: wiring, HMD: electronic device, EXDV: device, EXDV1: device, EXDV2: device, EXDV3: device, RFS: RF signal, CLD: cloud computing, HP: headphone portion, FG: finger, HND: hand, DPC: display image, OPA: operation region, ICN: icon, 11: source driver circuit, 12: digital-analog converter circuit, 13: gate driver circuit, 14: level shifter, 21: memory device, 22: GPU, 22*a*: circuit, 22*b*: circuit, 23: EL correction circuit, 24: timing controller, 25: CPU, 26: sensor controller, 27: power supply circuit, 31: memory control circuit, 41: high frequency circuit, 41*a*: high frequency circuit, 41*b*: high frequency circuit, 100: display apparatus, 100A: display apparatus, 101: substrate, 116: insulator, 117: insulator, 118: insulator, 126: conductor, 127: conductor, 128: conductor, 170: transistor, 171: element isolation layer, 172*a*: low-resistance region, 172*b*: low-resistance region, 173: semiconductor region, 174: insulator, 175: conductor, 180: transistor, 200: display system, 200A: display system, 200B: display system, 200C: display system, 200D: display system, 211: conductor, 212: conductor, 221: insulator, 222: insulator, 223: insulator, 224: insulator, 231: semiconductor, 251: insulator, 260R: light-emitting device, 260G: light-emitting device, 260B: light-emitting device, 260W: light-emitting device, 261: pixel electrode, 262R: EL layer, 262G: EL layer, 262B: EL layer, 262W: EL layer, 262*a*: EL layer, 262*b*: EL layer, 263: common electrode, 264R: coloring layer, 264G: coloring layer, 264B: coloring layer, 271: protective layer, 272: insulator, 500: transistor, 503: conductor, 503*a*: conductor, 503*b*: conductor, 512: insulator, 514: insulator, 516: insulator, 522: insulator, 524: insulator, 530: oxide, 530*a*: oxide, 530*b*: oxide, 530*ba*: region, 530*bb*: region, 530*bc*: region, 540: conductor, 540*a*: conductor, 540*b*: conductor, 541: insulator, 541*a*: insulator, 541*b*: insulator, 542: conductor, 542*a*: conductor, 542*b*: conductor, 544: insulator, 550: insulator, 550*a*: insulator, 550*b*: insulator, 552: insulator, 554: insulator, 560: conductor, 560*a*: conductor, 560*b*: conductor, 571: insulator, 571*a*: insulator, 571*b*: insulator, 574: insulator, 576: insulator, 580: insulator, 581: insulator, 4411: light-emitting layer, 4412: light-emitting layer, 4413: light-emitting layer, 4420: layer, 4430: layer, 5200: portable game machine, 5201: housing, 5202: display portion, 5203: button, 5900: information terminal, 5901: housing, 5902: display portion, 5903: operation button, 5904: crown, 5905: band, 6000: display module, 6001: upper cover, 6002: lower cover, 6005: FPC, 6006: display apparatus, 6009: frame, 6010: printed circuit board, 6011: battery, 6015: light-emitting portion, 6017*a*: light guide portion, 6017*b*: light guide portion, 6018: light, 6500: electronic device, 6501: housing, 6502: display portion, 6503: power supply button, 6504: button, 6505: speaker, 6506: microphone, 6507: camera, 6508: light source, 6510: protective member, 6511: display panel, 6512: optical member, 6513: touch sensor panel, 6515: FPC, 6516: IC, 6517: printed circuit board, 6518: battery, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8303: operation button, 8304: fixing unit, 8305: lens, 8306: dial, 8307: dial, 8308: driver portion, 8310: user, 8311: user

The invention claimed is:

1. An electronic device comprising:
a first layer;
a second layer over the first layer; and
a display portion over the second layer,
wherein the display portion and the first layer overlap with each other,
wherein the second layer and the first layer overlap with each other,
wherein the first layer comprises a semiconductor substrate comprising silicon,
wherein the first layer comprises a plurality of first transistors and a plurality of second transistors whose channel formation regions comprise silicon in the semiconductor substrate,
wherein the second layer comprises a plurality of third transistors whose channel formation regions comprise an oxide semiconductor,
wherein the first layer comprises a first circuit and a second circuit,
wherein the first circuit comprises a source driver circuit and a gate driver circuit each comprising any of the plurality of first transistors,
wherein the second circuit comprises a memory device, a GPU, an EL correction circuit, and a timing controller each comprising any of the plurality of second transistors,
wherein the display portion comprises a pixel,
wherein the pixel comprises a light-emitting device,
wherein the pixel is electrically connected to the source driver circuit and the gate driver circuit,
wherein the memory device is configured to retain image data,
wherein the GPU is configured to decode the image data read from the memory device, wherein the source driver circuit is configured to transmit the decoded image data to the pixel, wherein the EL correction circuit is configured to correct luminance of light emitted from the light-emitting device, and wherein the timing controller is configured to increase or decrease a frame rate at which an image is displayed on the display portion.

2. The electronic device according to claim 1, wherein the plurality of third transistors are included in memory cells, respectively.

3. The display system electronic device according to claim 1, wherein the second circuit comprises a CPU comprising any of the plurality of second transistors, and wherein the CPU is configured to transmit a control signal to one or more selected from the memory device, the GPU, the EL correction circuit, and the timing controller.

4. The electronic device according to claim 3, wherein the GPU is configured to perform an arithmetic operation of an artificial neural network and correct an image displayed on the display portion on the basis of a result of the arithmetic operation.

5. The electronic device according to claim 1, wherein the electronic device is a head-mounted display.

6. The electronic device according to claim 1, wherein the display portion comprises a plurality of fourth transistors which are different from the plurality of third transistors.

7. An electronic device comprising:

a first layer;

a second layer over the first layer; and a display portion over the second layer, wherein the display portion and the first layer overlap with each other, wherein the second layer and the first layer overlap with each other, wherein the first layer comprises a semiconductor substrate comprising silicon, wherein the first layer comprises a plurality of first transistors and a plurality of second transistors whose channel formation regions comprise silicon in the semiconductor substrate, wherein the second layer comprises a plurality of third transistors whose channel formation regions comprise an oxide semiconductor, wherein a first circuit comprises a source driver circuit and a gate driver circuit, wherein the source driver circuit and the gate driver circuit each comprise any of the plurality of first transistors, wherein a second circuit comprises a memory device, a GPU, an EL correction circuit, and a timing controller, wherein the GPU, the EL correction circuit, and the timing controller each comprise any of the plurality of second transistors, wherein the memory device comprises any of the plurality of second transistors and any of the plurality of third transistors, wherein the display portion comprises a pixel, wherein the pixel comprises a light-emitting device, and wherein the pixel is electrically connected to the source driver circuit and the gate driver circuit.

8. The electronic device according to claim 7, wherein the memory device is configured to retain image data, wherein the GPU is configured to decode the image data read from the memory device, wherein the source driver circuit is configured to transmit the decoded image data to the pixel, wherein the EL correction circuit is configured to correct luminance of light emitted from the light-emitting device, and wherein the timing controller is configured to increase or decrease a frame rate at which an image is displayed on the display portion.

9. The electronic device according to claim 7, wherein the second circuit comprises a CPU comprising any of the plurality of second transistors, and wherein the CPU is configured to transmit a control signal to one or more selected from the memory device, the GPU, the EL correction circuit, and the timing controller.

10. The electronic device according to claim 7, wherein the GPU is configured to perform an arithmetic operation of an artificial neural network and correct an image displayed on the display portion on the basis of a result of the arithmetic operation.

11. The electronic device according to claim 7, wherein the electronic device is a head-mounted display.

12. The electronic device according to claim 7, wherein the display portion comprises a plurality of fourth transistors which are different from the plurality of third transistors.

* * * * *